United States Patent
Nosaka

(10) Patent No.: US 11,211,917 B2
(45) Date of Patent: Dec. 28, 2021

(54) ACOUSTIC WAVE FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 77 days.

(21) Appl. No.: 16/843,897

(22) Filed: Apr. 9, 2020

(65) Prior Publication Data
US 2020/0235720 A1      Jul. 23, 2020

Related U.S. Application Data

(63) Continuation of application No. PCT/JP2018/038319, filed on Oct. 15, 2018.

(30) Foreign Application Priority Data

Oct. 16, 2017    (JP) ............................. JP2017-200155

(51) Int. Cl.
*H03H 9/02*      (2006.01)
*H03H 9/145*      (2006.01)
(Continued)

(52) U.S. Cl.
CPC ...... *H03H 9/6406* (2013.01); *H03H 9/02228* (2013.01); *H03H 9/02275* (2013.01);
(Continued)

(58) Field of Classification Search
CPC ...... H03H 9/02; H03H 9/02275; H03H 9/145; H03H 9/91457; H03H 9/64; H03H 9/6426; H03H 9/72
See application file for complete search history.

(56) References Cited

U.S. PATENT DOCUMENTS 7,659,796 B2 *   2/2010   Funami ................... H03H 9/725
                                                                   333/133
9,461,620 B2 *  10/2016   Fujita .................... H03H 9/6489
(Continued)

FOREIGN PATENT DOCUMENTS

JP           01-079732 A      3/1989
JP            1-79732 U      5/1989
(Continued)

OTHER PUBLICATIONS

English Translation of the Written Opinion of the International Search Authority dated Jan. 8, 2019 for PCT/JP2018/038319 10 pages.
(Continued)

*Primary Examiner* — Dean O Takaoka
(74) *Attorney, Agent, or Firm* — Xsensus LLP

(57) ABSTRACT

An acoustic wave filter includes: a series-arm resonator disposed on a path that connects input/output terminals; and a parallel-arm circuit connected to a node on the path and a ground. The parallel-arm circuit includes a parallel-arm resonator and a capacitor connected in parallel to each other. The capacitor includes a comb-shaped electrode that includes electrode fingers. A frequency at which impedance of the capacitor has a local maximum value is located outside a passband of the acoustic wave filter. The comb-shaped electrode has at least two different electrode finger pitches or at least two different electrode finger duty ratios.

20 Claims, 45 Drawing Sheets

(51) Int. Cl.
*H03H 9/64* (2006.01)
*H03H 9/72* (2006.01)
*H03H 9/25* (2006.01)
*H03H 9/54* (2006.01)
*H04B 1/04* (2006.01)

(52) U.S. Cl.
CPC ...... *H03H 9/1455* (2013.01); *H03H 9/14541* (2013.01); *H03H 9/25* (2013.01); *H03H 9/542* (2013.01); *H03H 9/725* (2013.01); *H04B 1/0458* (2013.01)

(56) References Cited

U.S. PATENT DOCUMENTS

2009/0251235 A1 10/2009 Belot et al.
2011/0299432 A1 12/2011 Caron et al.

FOREIGN PATENT DOCUMENTS

| JP | 2001-069031 A | 3/2001 |
|---|---|---|
| JP | 2005-260833 A | 9/2005 |
| JP | 2008-271511 A | 11/2008 |
| JP | 2010-062816 A | 3/2010 |
| JP | 2017-135568 A | 8/2017 |
| WO | 2016/104598 A1 | 6/2016 |
| WO | 2017/138540 A1 | 8/2017 |
| WO | 2018/051846 A1 | 3/2018 |

OTHER PUBLICATIONS

International Search Report and Written Opinion dated Jan. 8, 2019 for PCT/JP2018/038319 filed on Oct. 15, 2018, 11 pages including English Translation of the International Search Report.

* cited by examiner (a)

(b)

(a)

IDT electrode    Comb-shaped capacitor electrode (b)

IDT electrode    Comb-shaped capacitor electrode

ACOUSTIC WAVE FILTER, MULTIPLEXER, RADIO FREQUENCY FRONT-END CIRCUIT, AND COMMUNICATION DEVICE

CROSS REFERENCE TO RELATED APPLICATIONS

This application is a continuation application of PCT International Application No. PCT/JP2018/038319 filed on Oct. 15, 2018, designating the United States of America, which is based on and claims priority of Japanese Patent Application No. 2017-200155 filed on Oct. 16, 2017. The entire disclosures of the above-identified applications, including the specifications, drawings and claims are incorporated herein by reference in their entirety.

FIELD

The present disclosure relates to an acoustic wave filter, a multiplexer, a radio frequency front-end circuit, and a communication device.

BACKGROUND

It has been known that an acoustic wave filter that includes a ladder circuit provided with a series-arm resonator including an 2S acoustic wave resonator and a parallel-arm resonator including an acoustic wave resonator has a configuration in which at least one series-arm resonator and a capacitor (comb-shaped capacitor) that includes a comb-shaped electrode are connected in parallel to each other. Japanese Unexamined Patent Application Publication No. 2005-260833 is an example directed to such technology.

SUMMARY

Technical Problems

However, according to such a conventional configuration, if electrode fingers of the comb-shaped electrode included in the comb-shaped capacitor all have the same pitch, this results in a decrease in the attenuation of an acoustic wave filter such as a surface acoustic wave filter. Furthermore, generally, the attenuation and insertion loss in a passband of an acoustic wave filter are in a trade-off relationship since improving one of them will lead to deterioration of the other.

Thus, if electrode fingers of the comb-shaped electrode included in the comb-shaped capacitor all have the same pitch, this leads to a problem that the attenuation cannot be increased without increasing insertion loss in the passband of the acoustic wave filter.

In view of this, the present disclosure provides an acoustic wave filter the attenuation of which is increased without increasing insertion loss in the passband, a multiplexer, a radio frequency front-end circuit, and a communication device.

Solutions

In order to provide such an acoustic wave filter, an acoustic wave filter according to an aspect of the present disclosure is an acoustic wave filter that includes a first input/output terminal and a second input/output terminal, the acoustic wave filter including: at least one series-arm circuit disposed on a path that connects the first input/output terminal and the second input/output terminal; and at least one parallel-arm circuit connected to a node on the path and a ground. At least one circuit out of the at least one parallel-arm circuit and the at least one series-arm circuit includes: a first acoustic wave resonator; and a first comb-shaped capacitor connected in parallel or series to the first acoustic wave resonator. The first comb-shaped capacitor includes a comb-shaped electrode that includes electrode fingers. A frequency at which impedance of the first comb-shaped capacitor has a local maximum value is located outside a passband of the acoustic wave filter. Under a condition that a repeating pitch of electrode fingers is defined as an electrode finger pitch, and a proportion of a width of each of the electrode fingers to a value is defined as an electrode finger duty ratio, the value being obtained by adding the width and a space between adjacent electrode fingers out of the electrode fingers, the comb-shaped electrode has (i) at least two different electrode finger pitches, (ii) at least two different electrode finger duty ratios, or (iii) at least two different electrode finger pitches and at least two different electrode finger duty ratios.

Since the comb-shaped electrode of the first comb-shaped capacitor included in a parallel-arm circuit has at least two different electrode finger pitches and/or at least two different electrode finger duty ratios, the impedance value (local maximum value of impedance) at a frequency at which impedance of the first comb-shaped capacitor has a local maximum value can be decreased (frequencies at each of which impedance has a local maximum value are distributed). Further, the frequency at which impedance of the first comb-shaped capacitor has a local maximum value is located outside the passband of the acoustic wave filter. Alternatively, since the comb-shaped electrode of the comb-shaped capacitor included in the series-arm circuit has at least two different electrode finger pitches and/or at least two different electrode finger duty ratios, the impedance value (local minimum value of impedance) at a frequency at which impedance of the comb-shaped capacitor has a local minimum value can be increased (frequencies at each of which impedance has a local minimum value are distributed). Further, the frequency at which impedance of the comb-shaped capacitor has a local minimum value is located outside the passband of the acoustic wave filter.

Accordingly, an acoustic wave filter that has an attenuation increased without increasing insertion loss in the passband can be achieved.

The at least one parallel-arm circuit may further include a first switch connected in parallel to the first comb-shaped capacitor, and a first switch circuit in which the first comb-shaped capacitor and the first switch are connected in parallel to each other may be connected in series to the first acoustic wave resonator.

Accordingly, a resonant frequency of the parallel-arm circuit can be switched to another frequency by switching between the conducting and non-conducting states of the first switch, and thus a frequency-tunable acoustic wave filter that can switch (change) the frequency of an attenuation pole on the passband low-frequency side to another frequency can be provided. Furthermore, the attenuation can be increased without increasing insertion loss in the passband when the first switch is non-conducting.

The at least one parallel-arm circuit may further include a second acoustic wave resonator, the second acoustic wave resonator may be connected in parallel to a circuit in which the first acoustic wave resonator and the first switch circuit are connected in series to each other, the second acoustic wave resonator may have a resonant frequency different from a resonant frequency of the first acoustic wave resonator, and the second acoustic wave resonator may have an antiresonant frequency different from an antiresonant frequency of the first acoustic wave resonator.

Accordingly, when the resonant frequency of the second acoustic wave resonator is higher than the resonant frequency of the first acoustic wave resonator, and the antiresonant frequency of the second acoustic wave resonator is higher than the antiresonant frequency of the first acoustic wave resonator, a lower one of the two resonant frequencies of the parallel-arm circuit and a lower one of the two antiresonant frequencies of the parallel-arm circuit can be both switched to other frequencies by switching between the conducting and non-conducting states of the first switch. Consequently, a frequency-tunable acoustic wave filter that can switch (change) both the frequency at the passband low-frequency edge and the frequency of the attenuation pole on the passband low-frequency side to other frequencies, and has low insertion loss can be provided. Furthermore, the attenuation can be increased when the first switch is non-conducting.

Further, when the resonant frequency of the second acoustic wave resonator is lower than the resonant frequency of the first acoustic wave resonator, and the antiresonant frequency of the second acoustic wave resonator is lower than the antiresonant frequency of the first acoustic wave resonator, a higher one of the two resonant frequencies of the parallel-arm circuit and a lower one of the two antiresonant frequencies of the parallel-arm circuit can be both switched to other frequencies by switching between the conducting and non-conducting states of the first switch. Consequently, a frequency-tunable acoustic wave filter that can switch (change) both the frequency at the passband high-frequency edge and the frequency of the attenuation pole on the passband high-frequency side to other frequencies, and has low insertion loss can be provided. Furthermore, the attenuation can be increased when the first switch is non-conducting.

The at least one parallel-arm circuit may further include a second switch circuit connected in series to the second acoustic wave resonator. A circuit in which the second acoustic wave resonator and the second switch circuit are connected in series to each other may be connected in parallel to a circuit in which the first acoustic wave resonator and the first switch circuit are connected in series to each other. The second switch circuit may include: a second comb-shaped capacitor; and a second switch connected in parallel to the second comb-shaped capacitor. A frequency at which impedance of the second comb-shaped capacitor has a local maximum value may be located outside the passband of the acoustic wave filter. The second comb-shaped capacitor may include a comb-shaped electrode that includes electrode fingers. The comb-shaped electrode included in the second comb-shaped capacitor may have (i) at least two different electrode finger pitches, (ii) at least two different electrode finger duty ratios, or (iii) at least two different electrode finger pitches and at least two different electrode finger duty ratios.

Accordingly, a lower one of the two resonant frequencies of the parallel-arm circuit and a lower one of the two antiresonant frequencies of the parallel-arm circuit can be both switched to other frequencies by switching between the conducting and non-conducting states of the first switch. Further, a higher one of the two resonant frequencies of the parallel-arm circuit and a lower one of the two antiresonant frequencies of the parallel-arm circuit can be both switched to other frequencies by switching between the conducting and non-conducting states of the second switch. Accordingly, a frequency-tunable acoustic wave filter having a passband width and an attenuation band width that can be changed by independently controlling switching between the conducting and non-conducting states of the first switch and switching between the conducting and non-conducting states of the second switch can be provided. Furthermore, the attenuation can be increased when at least one of the first switch or the second switch is non-conducting.

The at least one series-arm circuit may further include a first switch connected in series to the first comb-shaped capacitor, and a circuit in which the first comb-shaped capacitor and the first switch are connected in series to each other may be connected in parallel to the first acoustic wave resonator.

The antiresonant frequency of the series-arm circuit can be switched to another frequency by switching between the conducting and non-conducting states of the switch. The resonant frequency of the series-arm circuit forms a passband of the acoustic wave filter, and the antiresonant frequency of the series-arm circuit forms an attenuation pole on the passband high-frequency side of the acoustic wave filter. Accordingly, a frequency-tunable acoustic wave filter that can switch (change) the frequency of an attenuation pole on the passband high-frequency side to another frequency by switching between the conducting and non-conducting states of the switch can be achieved.

The at least one parallel-arm circuit may further include a second switch connected in parallel to the first comb-shaped capacitor, a circuit in which the first comb-shaped capacitor and the second switch are connected in parallel to each other may be included in a first switch circuit, and the first switch circuit may be connected in series to the first acoustic wave resonator.

Accordingly, the resonant frequency of the series-arm circuit can be switched by switching between the conducting and non-conducting states of the second switch, and thus a frequency-tunable acoustic wave filter that can switch (change) the frequency at the passband high-frequency edge to another frequency can be provided. Furthermore, the attenuation can be increased without increasing insertion loss in the passband when the second switch is non-conducting.

The first acoustic wave resonator and the first comb-shaped capacitor may be connected in parallel to each other, the comb-shaped electrode may have a first electrode finger pitch, and a second electrode finger pitch greater than the first electrode finger pitch, and a pitch difference may be at least 0.2%, the pitch difference being obtained by dividing a difference between the first electrode finger pitch and the second electrode finger pitch by the first electrode finger pitch.

Accordingly, this yields greater advantageous effect of increasing the attenuation.

Out of the electrode fingers included in the comb-shaped electrode, a total number of electrode fingers disposed at the first electrode finger pitch may be in a range from 10% to 80% of a total number of the electrode fingers included in the comb-shaped electrode.

Accordingly, this yields greater advantageous effect of increasing the attenuation.

Out of the electrode fingers included in the comb-shaped electrode, a total number of electrode fingers disposed at the first electrode finger pitch may be in a range from 20% to 50% of a total number of the electrode fingers included in the comb-shaped electrode.

Accordingly, the attenuation can be optimized.

The first acoustic wave resonator and the first comb-shaped capacitor may be connected in series to each other, the comb-shaped electrode may have a first electrode finger pitch, and a second electrode finger pitch greater than the first electrode finger pitch, and a pitch difference may be in a range from 0.2% to 6.3%, the pitch difference being obtained by dividing a difference between the first electrode finger pitch and the second electrode finger pitch by the second electrode finger pitch.

Accordingly, this yields greater advantageous effect of increasing the attenuation.

The first acoustic wave resonator and the first comb-shaped capacitor may be connected in series to each other, the comb-shaped electrode may have a first electrode finger pitch, and a second electrode finger pitch greater than the first electrode finger pitch, and out of the electrode fingers included in the comb-shaped electrode, a total number of electrode fingers disposed at the first electrode finger pitch may be in a range from 10% to 65% of a total number of the electrode fingers included in the comb-shaped electrode.

Accordingly, this yields greater advantageous effect of increasing the attenuation.

The first acoustic wave resonator and the first comb-shaped capacitor may be connected in series to each other, the comb-shaped electrode may have a first electrode finger pitch, and a second electrode finger pitch greater than the first electrode finger pitch, and a pitch difference may be at least 0.2%, the pitch difference being obtained by dividing a difference between the first electrode finger pitch and the second electrode finger pitch by the first electrode finger pitch.

Accordingly, this yields greater advantageous effect of increasing the attenuation.

The first acoustic wave resonator and the first comb-shaped capacitor may be connected in series to each other, the comb-shaped electrode may have a first electrode finger pitch, and a second electrode finger pitch greater than the first electrode finger pitch, and out of the electrode fingers included in the comb-shaped electrode, a total number of electrode fingers disposed at the first electrode finger pitch may be in a range from 10% to 90% of a total number of the electrode fingers included in the comb-shaped electrode.

Accordingly, this yields greater advantageous effect of increasing the attenuation.

The comb-shaped electrode may have a first electrode finger pitch, and a second electrode finger pitch greater than the first electrode finger pitch, and out of the electrode fingers, electrode fingers disposed at the first electrode finger pitch may be thinner than electrode fingers disposed at the second electrode finger pitch.

Accordingly, the electrode fingers having a shorter pitch are thinner, and thus variation of electrode finger pitches caused in the manufacture can be reduced.

The first acoustic wave resonator may include an interdigital transducer (IDT) electrode that is formed on a piezoelectric substrate and includes electrode fingers, the comb-shaped electrode may be formed on the piezoelectric substrate, and the comb-shaped electrode may have electrode finger pitches each shorter than an electrode finger pitch of the IDT electrode.

Accordingly, the capacitor Q factor of the first comb-shaped capacitor can be increased. The capacitance per unit area is increased, and thus the first comb-shaped capacitor can be miniaturized. Accordingly, insertion loss in the passband of the acoustic wave filter is decreased, and at the same time, the acoustic wave filter can be miniaturized.

The electrode fingers included in the comb-shaped electrode may be thinner than electrode fingers included in the first acoustic wave resonator.

Accordingly, the electrode finger pitch can be decreased, and thus the capacitor Q factor of the first comb-shaped capacitor can be increased. Thus, insertion loss in the passband of the acoustic wave filter is decreased, and at the same time, the acoustic wave filter can be miniaturized.

The electrode fingers included in the comb-shaped electrode may have a duty ratio higher than a duty ratio of the electrode fingers included in the IDT electrode.

Accordingly, the capacitance per unit area increases, and thus the comb-shaped capacitor can be miniaturized, and the acoustic wave filter can be miniaturized.

A multiplexer according to an aspect of the present disclosure includes: a plurality of filters at least one of which has a structure same as a structure of the acoustic wave filter as stated above. One of two input/output terminals that each of the plurality of filters includes is directly or indirectly connected to a common terminal.

Accordingly, this provides a multiplexer having an attenuation that is increased without increasing insertion loss in the passband.

A radio frequency front-end circuit according to an aspect of the present disclosure includes: the acoustic wave filter as stated above or the multiplexer as stated above; and an amplifier circuit directly or indirectly connected to the acoustic wave filter or the multiplexer.

Accordingly, the attenuation can be increased in the acoustic wave filter or the multiplexer without increasing insertion loss in the passband. Thus, the communication quality against interfering waves can be improved, while maintaining the gain in a radio frequency front-end circuit.

A communication device according to an aspect of the present disclosure includes: a radio frequency (RF) signal processing circuit that processes a radio frequency signal to be transmitted by an antenna and a radio frequency signal received by the antenna; and the above-stated radio frequency front-end circuit that conveys the radio frequency signals between the antenna and the RF signal processing circuit.

Accordingly, the attenuation can be increased in the acoustic wave filter or the multiplexer without increasing insertion loss in the passband. Thus, a communication device having improved communication quality against interfering waves while maintaining the gain in the radio frequency front-end circuit.

Advantageous Effects

According to the present disclosure, an acoustic wave filter having an attenuation that is increased without increasing insertion loss in the passband, a multiplexer, a radio frequency front-end circuit, and a communication device can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
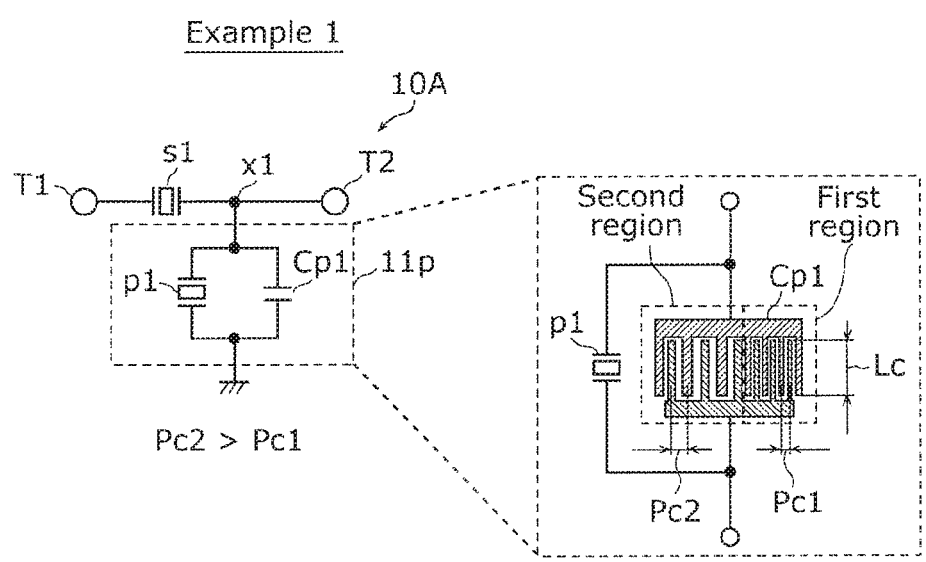
FIG. 1A illustrates a circuit configuration of an acoustic wave filter according to Example 1, and schematically illustrates a comb-shaped capacitor in a parallel-arm circuit.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description is omitted or simplified.

In the following, a "passband low-frequency edge" means "the lowest frequency in a passband". A "passband high-frequency edge" means "the highest frequency in a passband". In the following, a "passband low-frequency side" means "a lower-frequency side relative to a passband, which is outside the passband". A "passband high-frequency side" means "a higher-frequency side relative to a passband, which is outside the passband". In the following, if a passband is not-specifically defined in terms of passband low-frequency edge to passband high-frequency edge, generally it may be presumed that a passband with symmetrical edges (e.g., a passband defined by its 3 dB points) is described.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm circuit and a parallel-arm circuit in the following embodiments are defined as follows.

A parallel-arm circuit is disposed between the ground and a node on a path that connects a first input/output terminal and a second input/output terminal.

A series-arm circuit is disposed between the node on the path connected with the parallel-arm circuit and the first input/output terminal or the second input/output terminal, or is disposed between a node on the path connected with a parallel-arm circuit and another node on the path connected with another parallel-arm circuit.

Embodiment 1

1.1 Acoustic Wave Filter According to Embodiment 1

FIG. 1A illustrates a circuit configuration of acoustic wave filter 10A according to Example 1, and schematically illustrates capacitor Cp1 in parallel-arm circuit 11p. Acoustic wave filter 10A illustrated in FIG. 1A includes series-arm resonator S1, parallel-arm circuit 11p, and input/output terminals T1 and T2.

In this example, series-arm resonator S1 is connected to a path that connects input/output terminals T1 and T2, and is included in a series-arm circuit.

Parallel-arm circuit 11p is connected to node x1 on the path and the ground, and includes parallel-arm resonator p1 and capacitor Cp1. Parallel-arm circuit 11p is a resonance circuit that includes parallel-arm resonator p1 and capacitor Cp1. Parallel-arm resonator p1 is a first acoustic wave resonator connected in parallel to capacitor Cp1. Capacitor Cp1 is a first comb-shaped capacitor connected in parallel to parallel-arm resonator p1, and is included in an impedance circuit.

Capacitor Cp1 includes a comb-shaped electrode that includes a plurality of electrode fingers, as illustrated in the right drawing of FIG. 1A.

Here, when a repeating pitch of the electrode fingers included in capacitor Cp1 is defined as an electrode finger pitch, the comb-shaped electrode of capacitor Cp1 has two different electrode finger pitches, namely electrode finger pitch Pc1 (first electrode finger pitch) and electrode finger pitch Pc2 (second electrode finger pitch). In this example, the relation Pc2>Pc1 is satisfied.

Further, a frequency at which impedance of capacitor Cp1 has a local maximum value is located outside the passband of acoustic wave filter 10A.

Table 1 shows circuit parameters and filter characteristics of acoustic wave filter 10A according to Example 1 and an acoustic wave filter according to Comparative Example 1.

TABLE 1

| | Acoustic wave filter | | Reso. freq. fr (MHz) | A-reso. freq. fa (MHz) | Fract. BW BWR (%) | ES cap. (pF) |
|---|---|---|---|---|---|---|
| Comp. Ex. 1 | S-arm ckt | s1 | 835 | 875 | 4.79 | 3.00 |
| | P-arm ckt | p1 | 800 | 836 | 4.50 | 6.00 |
| | | Cp1 | | | | 1.47 |
| | | | 800 | 829 | 3.63 | 7.47 |
| Ex. 1 | S-arm ckt | s1 | 835 | 875 | 4.79 | 3.00 |
| | P-arm ckt | p1 | 800 | 836 | 4.50 | 6.00 |
| | 11p | Cp1 | | | | 1.49 |
| | | | 800 | 829 | 3.63 | 7.49 |

| Comb-shaped cap. | EF pitch Pc (μm) | EF duty ratio | Num of EFs | EF THK Tc (nm) | EF THK Tc/Pc | Crossing width Lc (μm) | Size (μm²) | ES cap. @835 MHz (pF) | ES cap. dens. (fF/μm²) | \|Z\| max (dB) | f\|Z\| max (MHz) |
|---|---|---|---|---|---|---|---|---|---|---|---|
| Comp. Ex. 1 | 3.00 | 0.60 | 121 | 350.0 | 0.117 | 20.00 | 7236 | 1.47 | 0.20 | 56.94 | 720 |
| Ex. 1 | 3.00 | 0.60 | 40 | 350.0 | 0.117 | 20.00 | 7293 | 1.49 | 0.20 | 56.06 | 710 |
| | 3.05 | 0.60 | 81 | 350.0 | 0.115 | 20.00 | | | | | |

| Filter charcs. | IL @824-849 MHz (dB) | Att @DC-800 MHz (dB) |
|---|---|---|
| Comp. Ex. 1 | 0.92 | 2.16 |
| Ex. 1 | 0.92 | 3.24 |

Note that Table 1 shows that |Z|max denotes a local maximum value of impedance of the comb-shaped capacitor, and f|Z|max denotes a frequency at which impedance of the comb-shaped capacitor has a local maximum value.

The acoustic wave filter according to Comparative Example 1 is different from acoustic wave filter 10A according to Example 1 only in the configuration of the capacitor in the parallel-arm circuit.

As shown in Table 1, in acoustic wave filter 10A according to Example 1, electrode finger pitch Pc1 of capacitor Cp1 is 3.00 μm, and electrode finger pitch Pc2 is 3.05 μm. The number of electrode fingers disposed at electrode finger pitch Pc1 is 40, and the number of electrode fingers disposed at electrode finger pitch Pc2 is 81. In contrast, in an acoustic wave filter according to Comparative Example 1, the electrode fingers of the capacitor all have an electrode finger pitch of 3.00 μm, and the number of electrode fingers disposed at that electrode finger pitch is 121.

Further, an electrode finger duty ratio of the capacitor is 0.6, the thickness of the comb-shaped electrode is 350 nm, and crossing width Lc is 20 μm, which are common to both Example 1 and Comparative Example 1.

In Example 1 and Comparative Example 1, electrode finger pitch Pr of an interdigital transducer (IDT) electrode included in parallel-arm resonator p1 is 2.1 μm, an electrode finger duty ratio of the IDT electrode is 0.5, and the thickness of the IDT electrode is 350 nm.

Note that electrode parameters of an acoustic wave filter will be described in detail with reference to FIGS. 5A and 5B, yet here, the electrode parameters shown in Table 1 are to be described briefly. The electrode finger pitch of the comb-shaped capacitor is a repeating pitch of the electrode fingers included in the comb-shaped electrode (the distance between the centers of adjacent electrode fingers). The "electrode finger duty ratio" of the comb-shaped capacitor indicates a percentage made up by the line width of each of the electrode fingers, and is defined by a proportion of a line width of each of the electrode fingers to a value obtained by adding the line width to a space width between adjacent electrode fingers. When a plurality of electrode fingers connected to one bus bar electrode are defined as a pectinate electrode, and the comb-shaped electrode includes a pair of pectinate electrodes each including electrode fingers disposed between electrode fingers of the other pectinate electrode, the crossing width is the length of overlapping electrode fingers when electrode fingers in one of the pectinate electrodes and electrode fingers in the other of the pectinate electrodes are viewed in a direction orthogonal to the electrode fingers.

In this example, the comb-shaped electrode is divided into two regions, namely, a first region in which the electrode fingers are formed at electrode finger pitch Pc1 (the right area of the comb-shaped electrode in FIG. 1A), and a second region in which electrode fingers are formed at electrode finger pitch Pc2 (the left area of the comb-shaped electrode in FIG. 1A) as illustrated in FIG. 1A.

Note that the number of regions into which the comb-shaped electrode is divided is not limited to two, and the comb-shaped electrode may be more finely divided into three or more regions. For example, the first and second regions may be alternately disposed.

In the above example, the comb-shaped electrode included in capacitor Cp1 has two different electrode finger pitches, but may have three or more different electrode finger pitches.

Note that as shown in Table 1, the electrostatic capacitance of parallel-arm circuit 11p of acoustic wave filter 10A according to Example 1 is 7.49 pF, whereas the electrostatic capacitance of the parallel-arm circuit of the acoustic wave filter according to Comparative Example 1 is 7.47 pF, and thus both have substantially the same value.

Figure 1B:
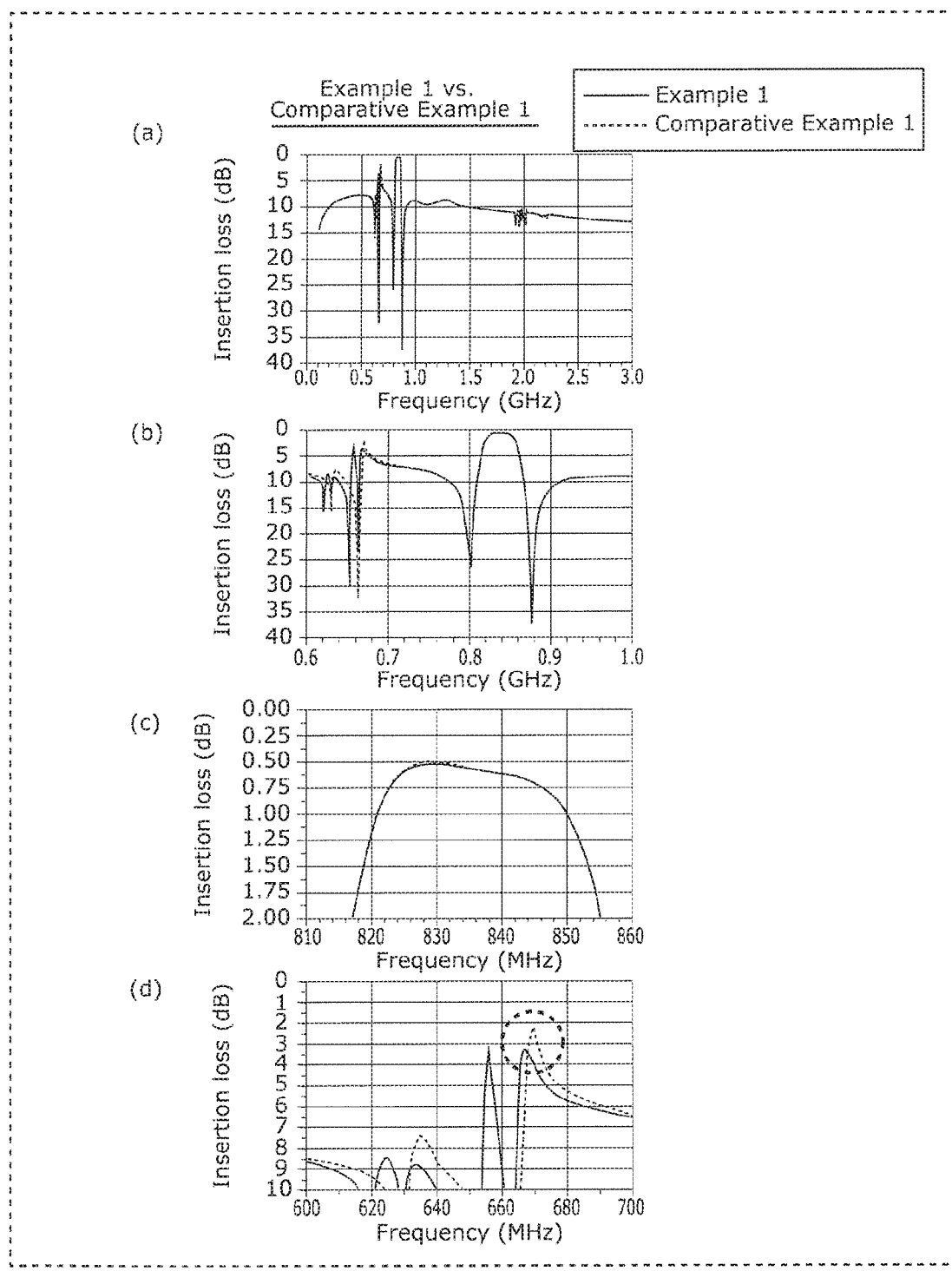
FIG. 1B illustrates graphs showing comparisons of passing characteristics of the acoustic wave filter according to Example 1 and an acoustic wave filter according to Comparative Example 1.

FIG. 1B illustrates graphs showing comparisons of passing characteristics of the acoustic wave filters according to Example 1 and Comparative Example 1. Part (a) of FIG. 1B illustrates a comparison of passing characteristics of the acoustic wave filters according to Example 1 and Comparative Example 1 in a wide range. Part (b) of FIG. 1B illustrates a comparison of passing characteristics of the acoustic wave filters according to Example 1 and Comparative Example 1 in a narrow range (in and near the passbands). Part (c) of FIG. 1B illustrates a comparison of passing characteristics of the acoustic wave filters according to Example 1 and Comparative Example 1 in the passbands. Part (d) of FIG. 1B illustrates a comparison of passing characteristics (attenuation characteristics) of the acoustic wave filters according to Example 1 and Comparative Example 1 in lower-frequency attenuation bands.

As illustrated in (a), (b), and (c) of FIG. 1B, insertion loss in the passband in Example 1 has no great difference from that in Comparative Example 1 (insertion loss in both the examples is 0.92 dB from Table 1). In contrast, as illustrated in (b) and (d) of FIG. 1B, in the attenuation band on the passband low-frequency side (a frequency band of at most 0.7 GHz), acoustic wave filter 10A according to Example 1 has a greater attenuation than that of the acoustic wave filter according to Comparative Example 1 (the smallest value of insertion loss is greater in Example 1 than that in Comparative Example 1 in the frequency band of at most 0.7 GHz) (Table 1 shows 3.24 dB in Example 1 and 2.16 dB in Comparative Example 1). Thus, acoustic wave filter 10A according to Example 1 has an attenuation that is increased without increasing insertion loss in the passband.

Figure 1C:
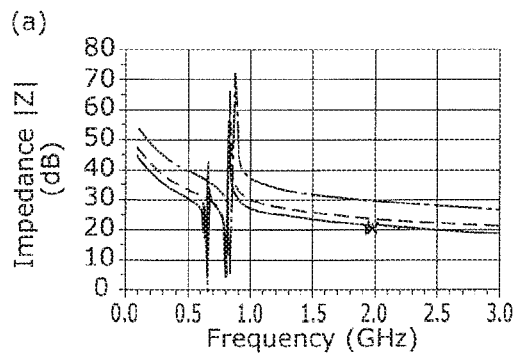
FIG. 1C illustrates graphs showing comparisons of impedance characteristics and comb-shaped capacitor characteristics of the acoustic wave filters according to Example 1 and Comparative Example 1.
Figure 1C:
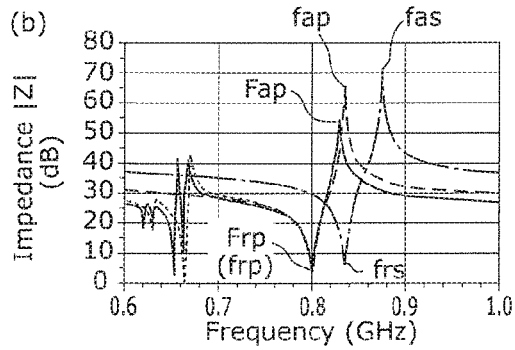
Figure 1C:
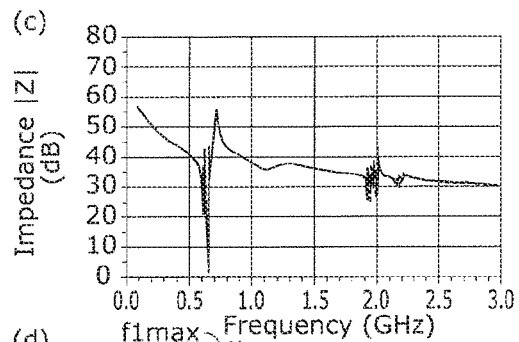
Figure 1C:
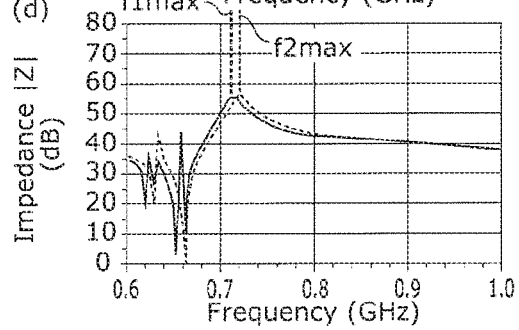
Figure 1C:
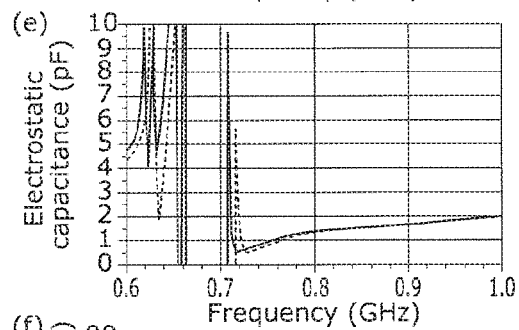
Figure 1C:
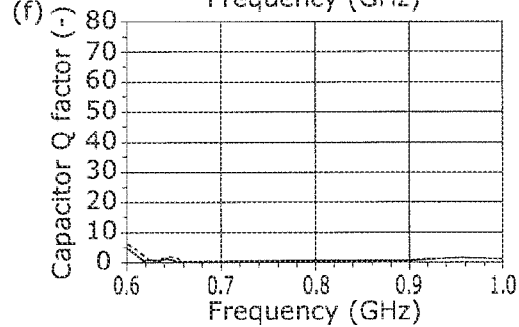

The following describes a factor that contributes to an increase in the attenuation in the attenuation band on the passband low-frequency side in acoustic wave filter 10A according to Example 1, with reference to FIG. 1C.

FIG. 1C illustrates graphs showing comparisons of impedance characteristics and comb-shaped capacitor characteristics of the acoustic wave filters according to Example 1 and Comparative Example 1. Part (a) of FIG. 1C illustrates comparisons of impedance characteristics of the circuits and the resonators according to Example 1 and Comparative Example 1 in a wide range. Part (b) of FIG. 1C illustrates comparisons of impedance characteristics of the circuits and the resonators according to Example 1 and Comparative Example 1 in a narrow range (in and near the passbands). Part (c) of FIG. 1C illustrates a comparison of impedance characteristics of capacitors according to Example 1 and Comparative Example 1 in a wide range. Part (d) of FIG. 1C illustrates a comparison of impedance characteristics of the capacitors according to Example 1 and Comparative Example 1 in a narrow range (in and near the passbands). Part (e) of FIG. 1C illustrates a comparison of electrostatic capacitance characteristics of the capacitors according to Example 1 and Comparative Example 1 in a narrow range (in and near the passbands). Part (f) of FIG. 1C illustrates a comparison of capacitor Q factors of the capacitors according to Example 1 and Comparative Example 1 in a narrow range (in and near the passbands).

First, as illustrated in (a) and (b) of FIG. 1C, when a capacitor is connected in parallel to parallel-arm resonator p1, antiresonant frequency Fap of the parallel-arm circuit shifts to a lower frequency than antiresonant frequency fap of parallel-arm resonator p1. In the acoustic wave filters according to Example 1 and Comparative Example 1, when a parallel-arm circuit and series-arm resonator s1 are to form a bandpass filter, antiresonant frequency Fap of the parallel-arm circuit and resonant frequency frs of series-arm resonator s1 are set to values close to each other. Frequencies at and near resonant frequency Frp at which impedance of the parallel-arm circuit is substantially 0 form a lower-frequency stopband. In a frequency range higher than resonant frequency Frp, impedance of the parallel-arm circuit is high at antiresonant frequency Fap, and impedance of series-arm resonator s1 is substantially 0 at and near resonant frequency frs. Accordingly, a signal pass band on a (series-arm) signal path from input/output terminal T1 to input/output terminal T2 is formed at and near antiresonant frequency Fap and resonant frequency frs. Furthermore, if a frequency is increased, and approaches and reaches antiresonant frequency fas of series-arm resonator s1, impedance of series-arm resonator S1 increases, and a high-frequency stopband is formed. Specifically, the acoustic wave filters according to Example 1 and Comparative Example 1 are bandpass filters in each of which a passband is determined by antiresonant frequency Fap and resonant frequency frs, a pole (attenuation pole) on the passband low-frequency side is determined by resonant frequency Frp, and a pole (attenuation pole) on the passband high-frequency side is determined by resonant frequency fas.

Next, as illustrated in (c) and (d) of FIG. 1C, frequency f1max (710 MHz) at which impedance of capacitor Cp1 according to Example 1 has a local maximum value is located in the attenuation band on the passband low-frequency side of acoustic wave filter 10A according to Example 1. Similarly, frequency f2max (720 MHz) at which impedance of the capacitor according to Comparative Example 1 has a local maximum value is located in the attenuation band on the passband low-frequency side of the acoustic wave filter according to Comparative Example 1.

Note that electrostatic capacitance and a capacitor Q factor of the capacitor in the passband in Example 1 have no great difference from those in Comparative Example 1 as illustrated in (e) and (f) of FIG. 1C.

Here, as illustrated in (d) of FIG. 1C, a local maximum value of impedance of capacitor Cp1 according to Example 1 at frequency f1max (56.06 dB from Table 1) is smaller than a local maximum value of impedance of the capacitor according to Comparative Example 1 at frequency f2max (56.94 dB from Table 1). This factor is owing to, for example, capacitor Cp1 in acoustic wave filter 10A according to Example 1 having different electrode finger pitches. Accordingly, a local maximum value of impedance of parallel-arm circuit 11p decreases (frequencies at each of which impedance has a local maximum value are distributed) in the attenuation band on the passband low-frequency side, and thus the amount of a radio frequency signal passing through to parallel-arm circuit 11p at frequency f1max can be increased. Thus, a problem that the attenuation of acoustic wave filter 10A decreases in an attenuation band that is a frequency region in which an impedance peak (a local maximum point of impedance) is located can be solved. As described above, acoustic wave filter 10A can be achieved in which the attenuation in the attenuation band on the passband low-frequency side is increased without increasing insertion loss in the passband.

Note that this example describes a ladder circuit in which one series-arm circuit and one parallel-arm circuit are disposed, yet it is sufficient if at least one series-arm circuit and at least one parallel-arm circuit are disposed. When a plurality of parallel-arm circuits are disposed, at least one parallel-arm circuit out of the parallel-arm circuits may have the configuration of parallel-arm circuit 11p according to Example 1. Specifically, it is sufficient if the at least one parallel-arm circuit includes a parallel-arm resonator and a comb-shaped capacitor connected in parallel to each other, a comb-shaped electrode of the comb-shaped capacitor has different electrode finger pitches, and a frequency at which impedance of the comb-shaped capacitor has a local maximum value is dispose outside the passband of the acoustic wave filter.

1.2 Difference Between Pitches and Proportion in Number of Electrode Fingers of Comb-Shaped Capacity Electrode A noticeable difference between electrode finger pitches Pc1 and Pc2 of capacitor Cp1 that is a comb-shaped capacitor is to be described.

Figure 1D:
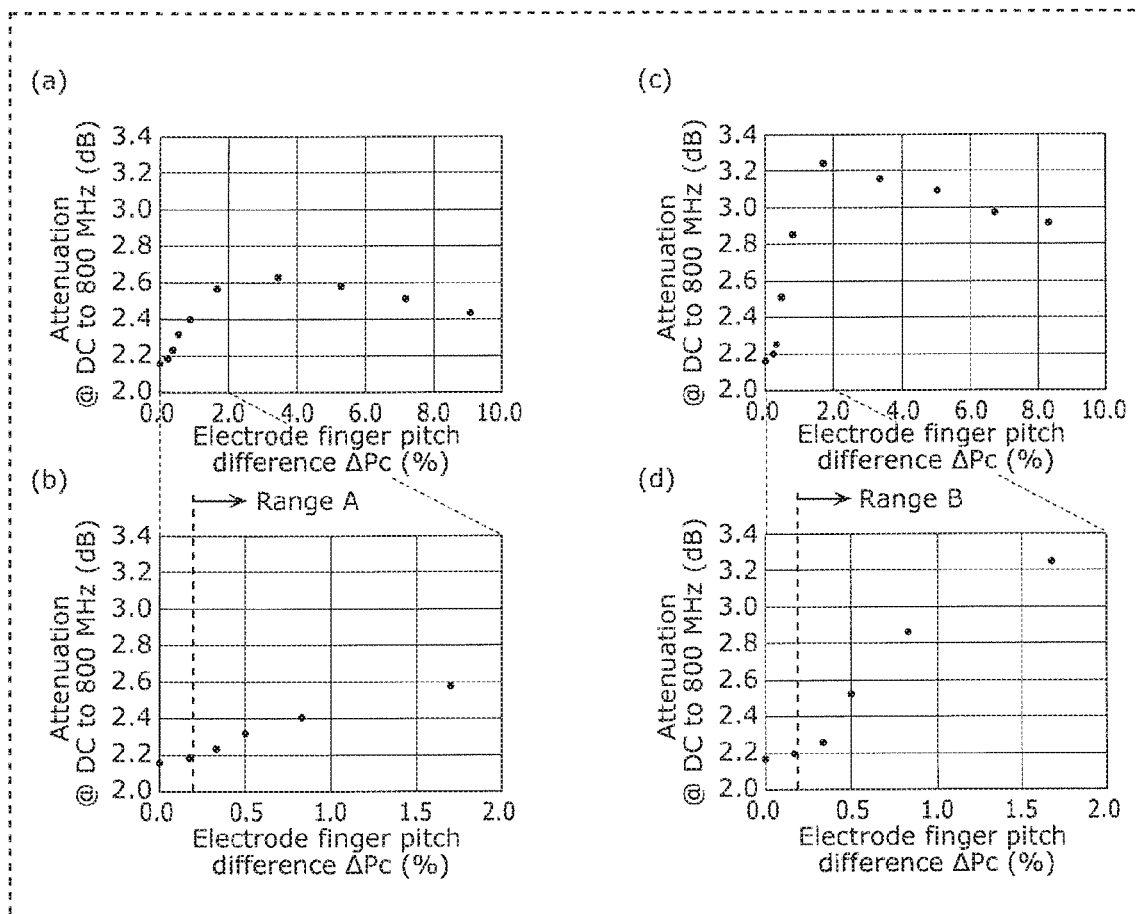
FIG. 1D illustrates graphs showing relations between (i) a difference between electrode finger pitches and (ii) the attenuation on the passband low-frequency side in the acoustic wave filter according to Example 1, when electrode finger pitches of the 35 capacitor are changed.

FIG. 1D illustrates graphs showing relations between (i) a difference between electrode finger pitches and (ii) the attenuation on the passband low-frequency side in acoustic wave filter 10A according to Example 1, when electrode finger pitches Pc1 and Pc2 of capacitor Cp1 are changed. More specifically, the vertical axes of (a) and (b) of FIG. 1D indicate the attenuation in the attenuation band on the passband low-frequency side (DC to 800 MHz), when acoustic wave filter 10A according to Example 1 has electrode finger pitch Pc1 that is fixed at 3.000 μm, and electrode finger pitch Pc2 that is gradually changed in a range from 2.750 to 3.000 μm. The vertical axes of (c) and (d) of FIG. 1D indicate the attenuation in the attenuation band on the passband low-frequency side (DC to 800 MHz) when acoustic wave filter 10A according to Example 1 has electrode finger pitch Pc1 that is fixed at 3.000 μm, and electrode finger pitch Pc2 that is gradually changed in a range from 3.000 to 3.250 μm. The horizontal axes of (a) to (d) of FIG. 1D indicate electrode finger pitch difference ΔPc (%) that is a value obtained by dividing a difference between electrode finger pitches Pc1 and Pc2 by the smaller one of electrode finger pitches Pc1 and Pc2.

Note that the electrode finger duty ratio (0.60), the number of electrode fingers (electrode finger pitch Pc1: 40, electrode finger pitch Pc2: 81), the electrode finger thickness (350 nm), and the crossing width (20 μm) are as shown in Table 1.

Parts (b) and (d) of FIG. 1D illustrate that the attenuation has a noticeable difference from that in Comparative Example 1, in the attenuation band (DC to 800 MHz) when electrode finger pitch difference ΔPc is 0.2% or more. This shows that electrode finger pitch difference ΔPc is desirably 0.2% or more (range A in (b) of FIG. 1D and range B in (d) of FIG. 1D). Accordingly, greater advantageous effect of increasing the attenuation is achieved.

Next, a noticeable proportion in number of electrode fingers having electrode finger pitch Pc1 and electrode fingers having electrode finger pitch Pc2 of capacitor Cp1 that is a comb-shaped capacitor is to be described.

Figure 1E:
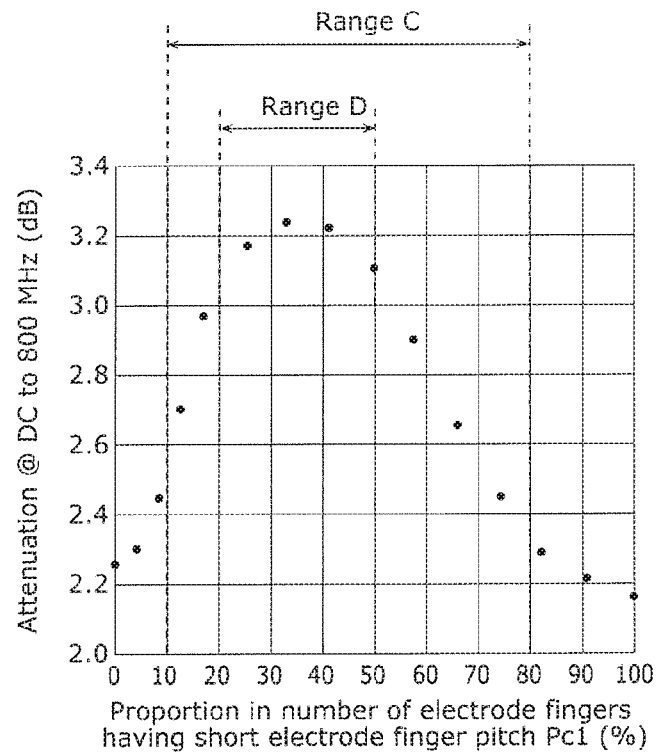
FIG. 1E illustrates a graph showing a relation between a proportion in number of electrode fingers and the attenuation on the passband low-frequency side of the acoustic wave filter according to Example 1, when the proportion in number of electrode fingers having different electrode finger pitches of the capacitor is changed.

FIG. 1E illustrates a graph showing a relation between a proportion in number of electrode fingers and the attenuation on the passband low-frequency side of acoustic wave filter 10A according to Example 1, when the proportion in number of electrode fingers having different electrode finger pitches of capacitor Cp1 is changed. More specifically, the vertical axis in FIG. 1E indicates the attenuation in the attenuation band on the passband low-frequency side (DC to 800 MHz), when the number of electrode fingers having electrode finger pitch Pc1 is gradually changed in a range from 0 to 121 in acoustic wave filter 10A according to Example 1. The horizontal axis in FIG. 1E indicates a proportion (%) in number of electrode fingers having electrode finger pitch Pc1 to electrode fingers in total. Note that in FIG. 1E, an acoustic wave filter having the proportion in number of 0% or 100% is not included in acoustic wave filter 10A according to Example 1.

Note that electrode finger pitches Pc1 (3.000 μm) and Pc2 (3.050 μm), the electrode finger duty ratio (0.60), a total number of electrode fingers (121), the electrode finger thickness (350 nm), and the crossing width (20 μm) are the same as those shown in Table 1.

FIG. 1E illustrates that when a proportion in number of electrode fingers having electrode finger pitch Pc1 is in a range from 10% to 80% (range C in FIG. 1E), the attenuation in the attenuation band (DC to 800 MHz) has a noticeable difference from that in Comparative Example 1. Accordingly, the proportion in number of electrode fingers having electrode finger pitch Pc1 is desirably in a range from 10% to 80%. Accordingly, this yields greater advantageous effect of increasing an attenuation. Furthermore, when the proportion in number of electrode fingers having electrode finger pitch Pc1 is in a range from 20% to 50% (range D in FIG. 1E), the attenuation in the attenuation band (DC to 800 MHz) can be optimized (maximized).

1.3 Acoustic Wave Filter According to Example 2

Figure 2A:
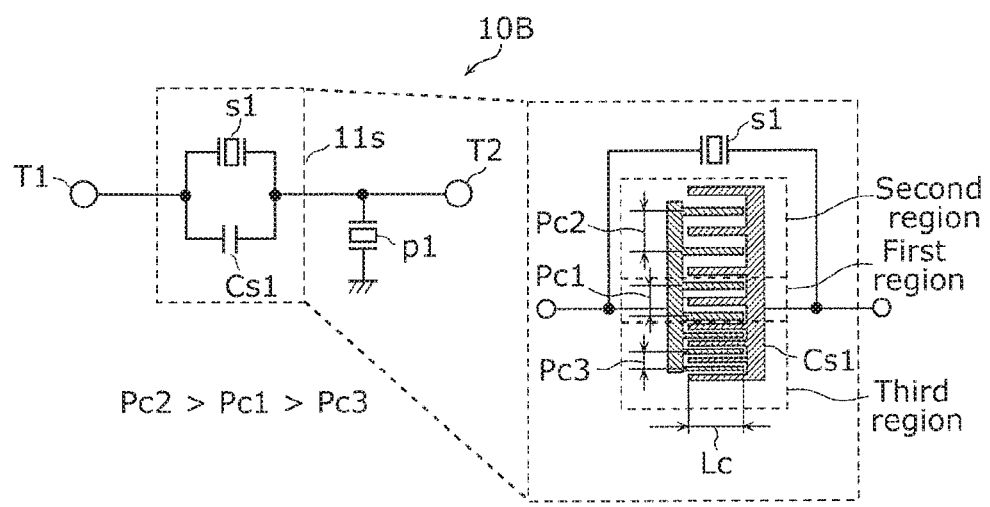
FIG. 2A illustrates a circuit configuration of an acoustic wave filter according to Example 2, and schematically illustrates a comb-shaped capacitor in a series-arm circuit.

FIG. 2A illustrates a circuit configuration of acoustic wave filter 10B according to Example 2, and schematically illustrates capacitor Cs1 in series-arm circuit 11s. Acoustic wave filter 10B illustrated in FIG. 2A includes series-arm circuit 11s, parallel-arm resonator p1, and input/output terminals T1 and T2.

In this example, series-arm circuit 11s is connected to a path that connects input/output terminals T1 and T2, and includes series-arm resonator s1 and capacitor Cs1. Series-arm circuit 11s is a resonance circuit that includes series-arm resonator s1 and capacitor Cs1. Series-arm resonator s1 is a first acoustic wave resonator connected in parallel to capacitor Cs1. Capacitor Cs1 is a first comb-shaped capacitor connected in parallel to series-arm resonator s1, and is included in an impedance circuit.

Capacitor Cs1 includes a comb-shaped electrode that includes a plurality of electrode fingers, as illustrated in the right drawing in FIG. 2A.

Here, when a repeating pitch of the electrode fingers included in capacitor Cs1 is defined as an electrode finger pitch, the comb-shaped electrode of capacitor Cs1 has three different electrode finger pitches, namely electrode finger pitch Pc1 (first electrode finger pitch), electrode finger pitch Pc2 (second electrode finger pitch), and electrode finger pitch Pc3. In this example, the relation Pc2>Pc1>Pc3 is satisfied.

Furthermore, a frequency at which impedance of capacitor Cs1 has a local minimum value (a frequency at which conductance is at its peak) is located outside the passband of acoustic wave filter 10B.

Table 2 shows circuit parameters and filter characteristics of acoustic wave filter 10B according to Example 2 and an acoustic wave filter according to Comparative Example 2.

TABLE 2

| Acoustic wave filter | | | Reso. freq. fr (MHz) | A-reso. freq. fa (MHz) | Fract. BWR (%) | ES cap. (pF) |
|---|---|---|---|---|---|---|
| Comp. Ex. 2 | P-arm ckt | p1 | 800 | 836 | 4.50 | 3.00 |
| | S-arm ckt | s1 | 835 | 875 | 4.79 | 6.00 |
| | | Cs1 | | | | 1.47 |
| | | | 835 | 862 | 3.23 | 7.47 |
| Ex. 2 | P-arm ckt | p1 | 800 | 836 | 4.50 | 3.00 |
| | S-arm ckt | s1 | 835 | 875 | 4.79 | 6.00 |
| | 11s | Cs1 | | | | 1.47 |
| | | | 835 | 862 | 3.23 | 7.49 |

| Comb-shaped cap. | EF pitch Pc (μm) | EF duty ratio | Num of EFs | EF THK Tc (nm) | EF THK Tc/Pc | Crossing width Lc (μm) | Size (μm$^2$) | ES cap. @835 MHz (pF) | ES cap. dens. (fF/μm$^2$) | $|Z|$ min (dB) | f$|Z|$ min (MHz) |
|---|---|---|---|---|---|---|---|---|---|---|---|
| Comp. Ex. 2 | 3.00 | 0.60 | 121 | 350.0 | 0.117 | 20.00 | 7236 | 1.47 | 0.20 | 0.09 | 663 |
| Ex. 2 | 2.95 | 0.60 | 40 | 350.0 | 0.119 | 20.00 | 7188 | 1.47 | 0.20 | 7.80 | 674 |
| | 3.00 | 0.60 | 41 | 350.0 | 0.117 | 20.00 | | | | | |
| | 3.05 | 0.60 | 40 | 350.0 | 0.115 | 20.00 | | | | | |

| Filter charcs. | IL @824-849 MHz (dB) | Att @DC-800 MHz (dB) |
|---|---|---|
| Comp. Ex. 2 | 1.01 | 2.22 |
| Ex. 2 | 1.01 | 2.56 |

Note that in Table 2, $|Z|$min denotes a local minimum value of impedance of the comb-shaped capacitor, and f$|Z|$min denotes a frequency at which impedance of the comb-shaped capacitor has a local minimum value.

The acoustic wave filter according to Comparative Example 2 is different from acoustic wave filter 10B according to Example 2 in only the configuration of the capacitor in the series-arm circuit.

As shown in Table 2, electrode finger pitch Pc3 of capacitor Cs1 is 2.95 μm, electrode finger pitch Pc1 is 3.00 μm, and electrode finger pitch Pc2 is 3.05 μm in acoustic wave filter 10B according to Example 2. The number of electrode fingers disposed at electrode finger pitch Pc3 is 40, the number of electrode fingers disposed at electrode finger pitch Pc1 is 41, and the number of electrode fingers disposed at electrode finger pitch Pc2 is 40. In contrast, in the acoustic wave filter according to Comparative Example 2, all the electrode fingers of the capacitor have an electrode finger pitch of 3.00 μm, and the number of electrode fingers disposed at that electrode finger pitch is 121.

The electrode finger duty ratio of the capacitor is 0.6, the thickness of the comb-shaped electrode is 350 nm, and crossing width Lc is 20 μm, which are common to both Example 2 and Comparative Example 2.

In Example 2 and Comparative Example 2, electrode finger pitch Pr of the IDT electrode included in series-arm resonator s1 is 2.1 μm, the electrode finger duty ratio of the IDT electrode is 0.5, and the thickness of the IDT electrode is 350 nm.

In this example, as illustrated in FIG. 2A, the comb-shaped electrode is divided into three regions, namely a third region in which electrode fingers are formed at electrode finger pitch Pc3 (the lower region in the comb-shaped electrode in FIG. 2A), a first region in which electrode fingers are formed at electrode finger pitch Pc1 (the center region in the comb-shaped electrode in FIG. 2A), and a second region in which electrode fingers are formed at electrode finger pitch Pc2 (the upper region in the comb-shaped electrode in FIG. 2A).

Note that the number of regions into which the comb-shaped electrode is divided is not limited to three, and the comb-shaped electrode may be divided into two regions according to electrode finger pitches Pc1 and Pc2 or may be more finely divided into four or more regions according to four or more different electrode finger pitches. For example, the first, second, and third regions may be alternately disposed.

Note that as shown in Table 2, electrostatic capacitance of capacitor Cs1 of acoustic wave filter 10B according to Example 2 is 1.47 pF, and electrostatic capacitance of the capacitor of the acoustic wave filter according to Comparative Example 2 is also 1.47 pF.

Figure 2B:
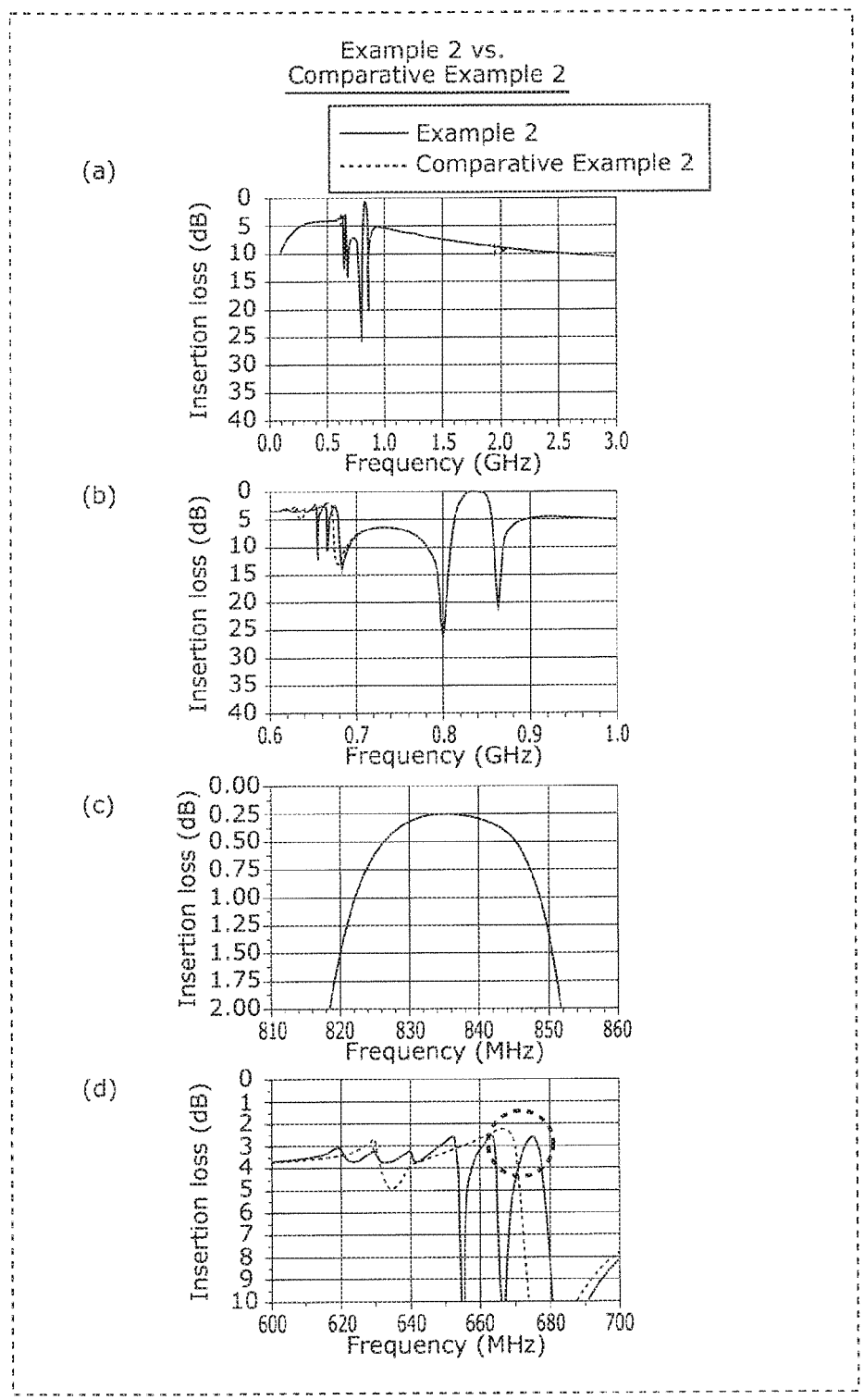
FIG. 2B illustrates graphs showing comparisons of passing characteristics of the acoustic wave filter according to Example 2 and an acoustic wave filter according to Comparative Example 2.

FIG. 2B illustrates graphs showing comparisons of passing characteristics of the acoustic wave filters according to Example 2 and Comparative Example 2. Part (a) of FIG. 2B illustrates a comparison of passing characteristics of the acoustic wave filters according to Example 2 and Comparative Example 2 in a wide range. Part (b) of FIG. 2B illustrates a comparison of passing characteristics in a narrow range (in and near the passbands) of the acoustic wave filters according to Example 2 and Comparative Example 2. Part (c) of FIG. 2B illustrates a comparison of passing characteristics of the acoustic wave filters according to Example 2 and Comparative Example 2 in the passbands. Part (d) of FIG. 2B illustrates a comparison of passing characteristics (attenuation characteristics) of the acoustic wave filters according to Example 2 and Comparative Example 2 in lower-frequency attenuation bands.

As illustrated in (a), (b), and (c) of FIG. 2B, insertion loss in the passband in Example 2 has no great difference from that in Comparative Example 2 (insertion loss in both the examples is 1.01 dB from Table 2). In contrast, as illustrated in (b) and (d) of FIG. 2B, in the attenuation band on the passband low-frequency side (a frequency band of at most 0.7 GHz), acoustic wave filter 10B according to Example 2 has a greater attenuation than that of the acoustic wave filter according to Comparative Example 2 (the smallest value of insertion loss is greater in Example 2 than that in Comparative Example 2 in the frequency band of at most 0.7 GHz) (Table 2 shows 2.56 dB in Example 2, and 2.22 dB in Comparative Example 2). Specifically, acoustic wave filter 10B according to Example 2 has an attenuation that is increased without increasing insertion loss in the passband.

Figure 2C:
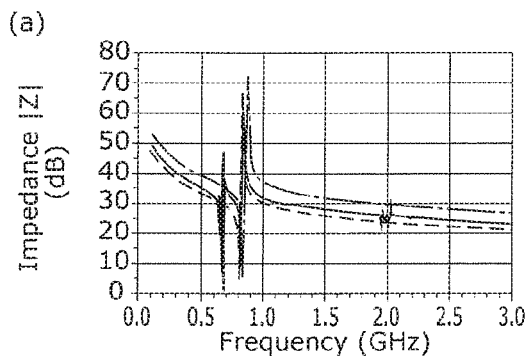
FIG. 2C illustrates graphs showing comparisons of impedance characteristics and comb-shaped capacitor characteristics of the acoustic wave filters according to Example 2 and Comparative Example 2.
Figure 2C:
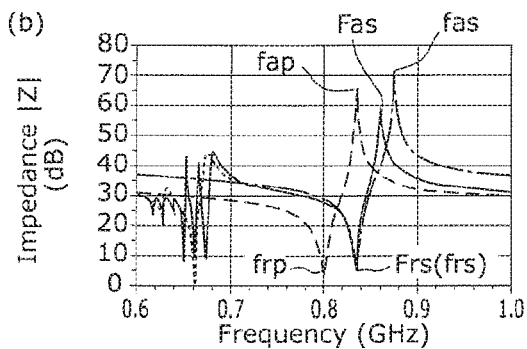
Figure 2C:
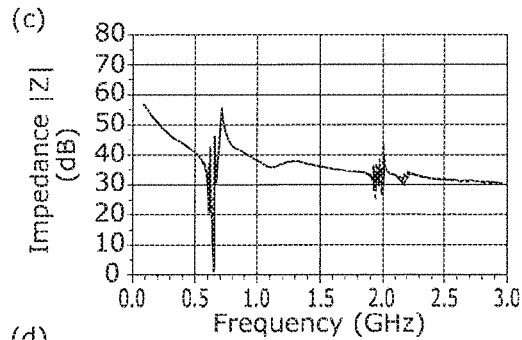
Figure 2C:
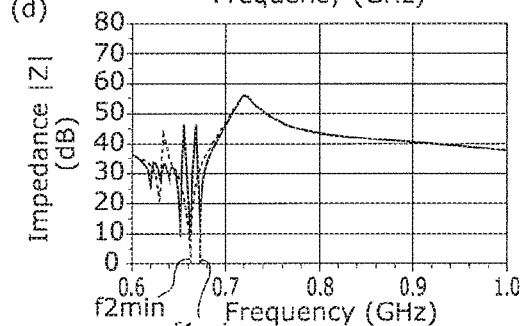
Figure 2C:
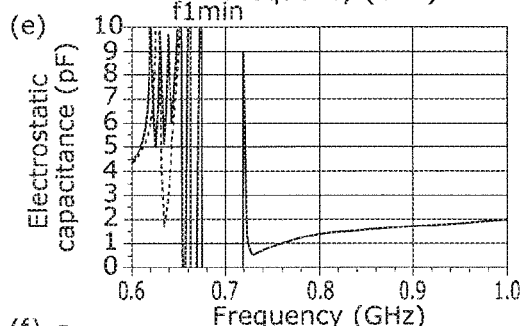
Figure 2C:
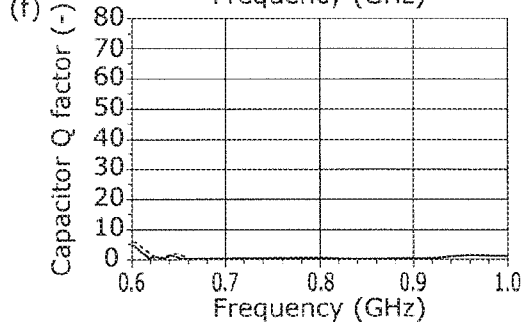

The following describes a factor that contributes to an increase in the attenuation in the attenuation band on the passband low-frequency side in acoustic wave filter 10B according to Example 2, with reference to FIG. 2C.

FIG. 2C illustrates graphs showing comparisons of impedance characteristics and comb-shaped capacitor characteristics of the acoustic wave filters according to Example 2 and Comparative Example 2. Part (a) of FIG. 2C illustrates comparisons of impedance characteristics of the circuits and the resonators according to Example 2 and Comparative Example 2 in a wide range. Part (b) of FIG. 2C illustrates comparisons of impedance characteristics of the circuits and the resonators according to Example 2 and Comparative Example 2 in a narrow range (in and near the passbands). Part (c) of FIG. 2C illustrates a comparison of impedance characteristics of capacitors according to Example 2 and Comparative Example 2 in a wide range. Part (d) of FIG. 2C illustrates a comparison of impedance characteristics of the capacitors according to Example 2 and Comparative Example 2 in a narrow range (in and near the passbands). Part (e) of FIG. 2C illustrates a comparison of electrostatic capacitance characteristics of the capacitors according to Example 2 and Comparative Example 2 in a narrow range (in and near the passbands). Part (f) of FIG. 2C illustrates a comparison of capacitor Q factors of the capacitors according to Example 2 and Comparative Example 2 in a narrow range (in and near the passbands).

First, as illustrated in (a) and (b) of FIG. 2C, when a capacitor is connected in parallel to series-arm resonator s1, antiresonant frequency Fas of the series-arm circuit shifts to a lower frequency than antiresonant frequency fas of series-arm resonator s1. In the acoustic wave filters according to Example 2 and Comparative Example 2, when a series-arm circuit and parallel-arm resonator p1 form a bandpass filter, antiresonant frequency fap of parallel-arm resonator p1 and resonant frequency Frs of the series-arm circuit are set to values close to each other. Frequencies at and near resonant frequency frp at which impedance of parallel-arm resonator p1 is substantially 0 form a lower-frequency stopband. In a frequency range higher than resonant frequency frp, impedance of parallel-arm resonator p1 is high at antiresonant frequency fap, and impedance of the series-arm circuit is substantially 0 at and near resonant frequency Frs. Accordingly, a signal pass band on a (series-arm) signal path from input/output terminal T1 to input/output terminal T2 is formed at and near antiresonant frequency fap and resonant frequency Frs. Furthermore, if a frequency is increased, and approaches and reaches antiresonant frequency Fas of the series-arm circuit, impedance of the series-arm circuit increases, and a high-frequency stopband is formed. Specifically, the acoustic wave filters according to Example 2 and Comparative Example 2 are bandpass filters in each of which a passband is determined by antiresonant frequency fap and resonant frequency Frs, a pole (attenuation pole) on the passband low-frequency side is determined by resonant frequency frp, and a pole (attenuation pole) on the passband high-frequency side is determined by antiresonant frequency Fas.

Next, as illustrated in (c) and (d) of FIG. 2C, frequency f1min (674 MHz) at which impedance of capacitor Cs1 according to Example 2 has a local minimum value is located in the attenuation band on the passband low-frequency side of acoustic wave filter 10B according to Example 2. Similarly, frequency f2min (663 MHz) at which impedance of the capacitor according to Comparative Example 2 has a local minimum value is located in the attenuation band on the passband low-frequency side of the acoustic wave filter according to Comparative Example 2.

Note that as illustrated in (e) and (f) of FIG. 2C, electrostatic capacitance and a capacitor Q factor of the capacitor in the passband in Example 2 have no great difference from those in Comparative Example 2.

Here, as illustrated in (d) of FIG. 2C, a local minimum value of impedance at frequency f1min of capacitor Cs1 according to Example 2 (7.80 dB from Table 2) is greater than a local minimum value of impedance at frequency f2min of the capacitor according to Comparative Example 2 (0.09 dB from Table 2). This factor is owing to, for example, capacitor Cs1 in acoustic wave filter 10B according to Example 2 having different electrode finger pitches. Accordingly, a local minimum value of impedance of series-arm circuit 11s increases (frequencies at each of which impedance has a local minimum value are distributed) in the attenuation band on the passband low-frequency side, and thus the amount of a radio frequency signal passing through to series-arm circuit 11s at frequency f1min can be decreased. Thus, a problem that the attenuation of acoustic wave filter 10B decreases in an attenuation band that is a frequency region in which conductance is at its peak (a local minimum point of impedance) is located can be solved.

As described above, acoustic wave filter 10B can be achieved in which the attenuation in the attenuation band on the passband low-frequency side is increased without increasing insertion loss in the passband.

1.4 Acoustic Wave Filter According to Example 3

Figure 3A:
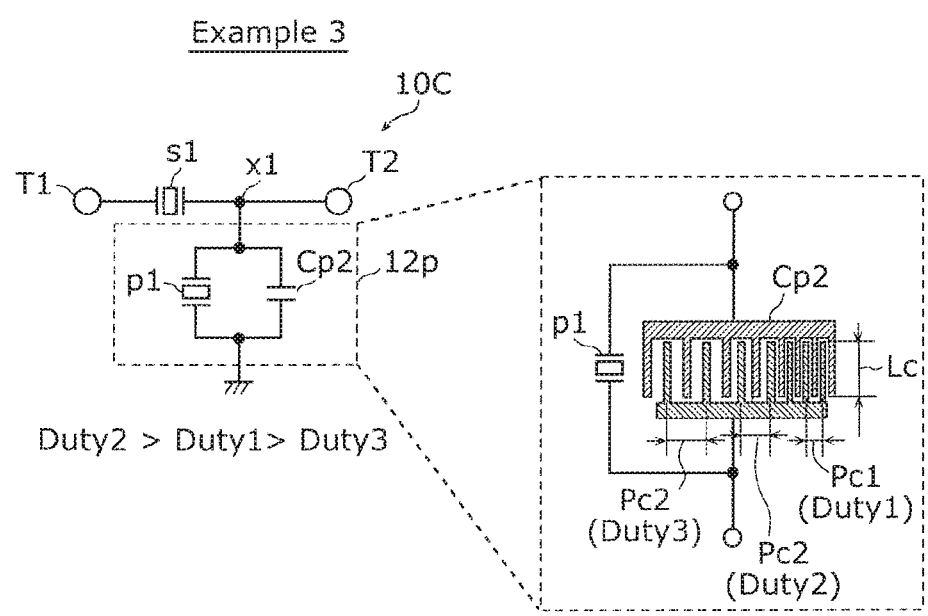
FIG. 3A illustrates a circuit configuration of an acoustic wave filter according to Example 3, and schematically illustrates a comb-shaped capacitor in a parallel-arm circuit.

FIG. 3A illustrates a circuit configuration of acoustic wave filter 10C according to Example 3, and schematically illustrates capacitor Cp2 in parallel-arm circuit 12p. Acoustic wave filter 10C illustrated in FIG. 3A includes series-arm circuit s1, parallel-arm circuits 12p, and input/output terminals T1 and T2.

In this example, series-arm resonator s1 is connected to a path that connects input/output terminals T1 and T2, and is included in a series-arm circuit.

Parallel-arm circuit 12p is connected to node x1 on the path and the ground, and includes parallel-arm resonator p1 and capacitor Cp2. Parallel-arm circuit 12p is a resonance circuit that includes parallel-arm resonator p1 and capacitor Cp2. Parallel-arm resonator p1 is a first acoustic wave resonator connected in parallel to capacitor Cp2. Capacitor Cp2 is a first comb-shaped capacitor connected in parallel to parallel-arm resonator p1, and is included in an impedance circuit.

Capacitor Cp2 includes a comb-shaped electrode that includes a plurality of electrode fingers, as illustrated in the right drawing in FIG. 3A.

Here, when a repeating pitch of the electrode fingers included in capacitor Cp2 is defined as an electrode finger pitch, the comb-shaped electrode of capacitor Cp2 has two different electrode finger pitches, namely electrode finger pitch Pc1 (first electrode finger pitch) and electrode finger pitch Pc2 (second electrode finger pitch). In this example, the relation Pc2>Pc1 is satisfied. The comb-shaped electrode of capacitor Cp2 has three different electrode finger duty ratios Duty1, Duty2, and Duty3. In this example, the electrode fingers disposed at electrode finger pitch Pc2 have two different electrode finger duty ratios Duty2 and Duty3, the electrode fingers disposed at electrode finger pitch Pc1 have one electrode finger duty ratio Duty1, and the relation Duty2>Duty1>Duty3 is satisfied.

Furthermore, the frequency at which impedance of capacitor Cp2 has a local maximum value is disposed outside the passband of acoustic wave filter 10C.

Table 3 shows circuit parameters and filter characteristics of acoustic wave filter 10C according to Example 3, and acoustic wave filter 10A according to Example 1.

The thickness of the comb-shaped electrode is 350 nm, and crossing width Lc is 20 μm, which are common to both of Examples 3 and 1.

In Examples 3 and 1, electrode finger pitch Pr of the IDT electrode included in parallel-arm resonator p1 is 2.1 μm, the electrode finger duty ratio of the IDT electrode is 0.5, and the thickness of the IDT electrode is 350 nm.

In this example, as illustrated in FIG. 3A, the IDT electrode is divided into three regions, namely a first region in which electrode fingers are formed at electrode finger duty ratio Duty1, a second region in which electrode fingers

TABLE 3

| Acoustic wave filter | | | Reso. freq. fr (MHz) | A-reso. freq. fa (MHz) | Fract. BW BWR (%) | ES cap. (pF) |
|---|---|---|---|---|---|---|
| Ex. 1 | S-arm ckt | s1 | 835 | 875 | 4.79 | 3.00 |
| | P-arm ckt | p1 | 800 | 836 | 4.50 | 6.00 |
| | 11p | Cp1 | | | | 1.49 |
| | | | 800 | 829 | 3.63 | 7.49 |
| Ex. 3 | S-arm ckt | s1 | 835 | 875 | 4.79 | 3.00 |
| | P-arm ckt | p1 | 800 | 836 | 4.50 | 6.00 |
| | 12p | Cp1 | | | | 1.49 |
| | | | 800 | 829 | 3.63 | 7.49 |

| Comb-shaped cap. | EF pitch Pc (μm) | EF duty ratio | Num of EFs | EF THK Tc (nm) | EF THK Tc/Pc | Crossing width Lc (μm) | Size (μm²) | ES cap. @835 MHz (pF) | ES cap. dens. (fF/μm²) | \|Z\| max (dB) | f\|Z\| max (MHz) |
|---|---|---|---|---|---|---|---|---|---|---|---|
| Ex. 1 | 3.00 | 0.60 | 40 | 350.0 | 0.117 | 20.00 | 7293 | 1.49 | 0.20 | 56.06 | 710 |
| | 3.05 | 0.60 | 81 | 350.0 | 0.115 | 20.00 | | | | | |
| Ex. 3 | 3.00 | 0.45 | 40 | 350.0 | 0.117 | 20.00 | 7253 | 1.47 | 0.20 | 56.88 | 710 |
| | 3.05 | 0.70 | 41 | 350.0 | 0.115 | 20.00 | | | | | |
| | 3.05 | 0.40 | 40 | 350.0 | 0.115 | 20.00 | | | | | |

| Filter charcs. | IL @824-849 MHz (dB) | Att @DC-800 MHz (dB) |
|---|---|---|
| Ex. 1 | 0.92 | 3.24 |
| Ex. 3 | 0.91 | 3.52 |

Note that in Table 3, |Z|max denotes a local maximum value of impedance of the comb-shaped capacitor, and f|Z|max denotes a frequency at which impedance of the comb-shaped capacitor has a local maximum value.

Acoustic wave filter 10C according to Example 3 is different from acoustic wave filter 10A according to Example 1 in that in the configuration of capacitor Cp2 of the parallel-arm circuit, the comb-shaped electrode not only has two different electrode finger pitches, but also has three different electrode finger duty ratios.

In acoustic wave filter 10A according to Example 1, capacitor Cp1 has electrode finger pitch Pc1 of 3.00 μm, and an electrode finger duty ratio of 0.6, as shown in Table 3.

In contrast, in acoustic wave filter 10C according to Example 3, capacitor Cp2 has electrode finger pitch Pc1 of 3.00 μm, electrode finger pitch Pc2 of 3.05 μm, electrode finger duty ratio Duty1 of 0.45, electrode finger duty ratio Duty2 of 0.70, and electrode finger duty ratio Duty3 of 0.40. The number of electrode fingers disposed at electrode finger pitch Pc1 is 40, and the number of electrode fingers disposed at electrode finger pitch Pc2 is 81. The number of electrode fingers disposed at electrode finger duty ratio Duty1 is 40, the number of electrode fingers disposed at electrode finger duty ratio Duty2 is 41, and the number of electrode fingers disposed at electrode finger duty ratio Duty3 is 40.

are formed at electrode finger duty ratio Duty2, and a third region in which electrode fingers are formed at electrode finger duty ratio Duty3.

Note that the number of regions into which the IDT electrode is divided is not limited to three, and the IDT electrode may be divided into two regions according to electrode finger duty ratios Duty1 and Duty2, or may be more finely divided into four or more regions according to four or more different electrode finger duty ratios. For example, the first, second, and third regions may be alternately disposed.

Figure 3B:
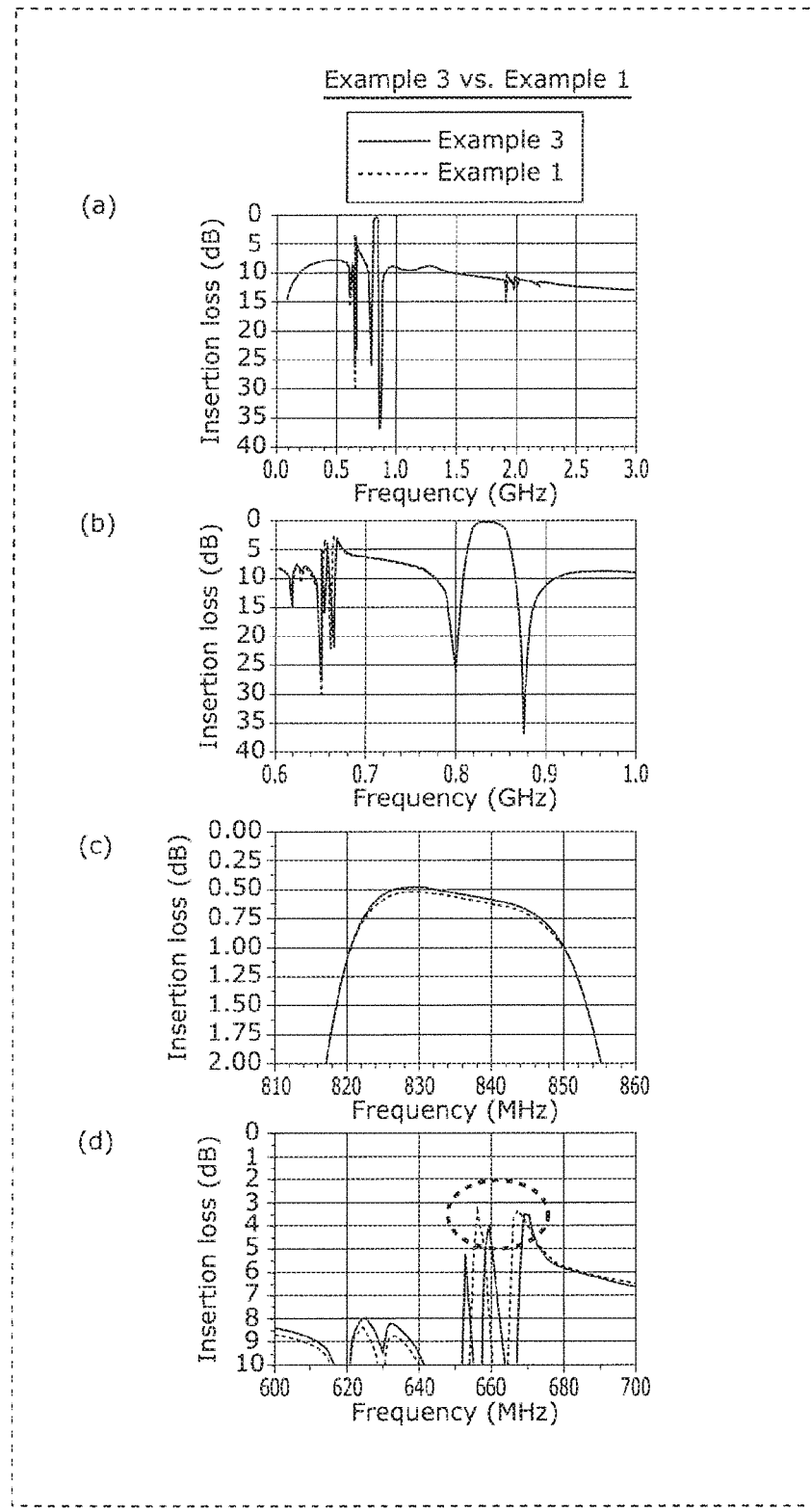
FIG. 3B illustrates graphs showing comparisons of passing characteristics of the acoustic wave filters according to Examples 3 and 1.

FIG. 3B illustrates graphs showing comparisons of passing characteristics of the acoustic wave filters according to Examples 3 and 1. Part (a) of FIG. 3B illustrates a comparison of passing characteristics of the acoustic wave filters according to Examples 3 and 1 in a wide range. Part (b) of FIG. 3B illustrates a comparison of passing characteristics of the acoustic wave filters according to Examples 3 and 1 in a narrow range (in and near the passbands). Part (c) of FIG. 3B illustrates a comparison of passing characteristics of the acoustic wave filters according to Examples 3 and 1 in the passbands. Part (d) of FIG. 3B illustrates a comparison of passing characteristics (attenuation characteristics) of the acoustic wave filters according to Examples 3 and 1 in lower-frequency attenuation bands.

As illustrated in (a), (b), and (c) of FIG. 3B, Example 3 has slightly less insertion loss in a passband than that of Example 1 (Table 3 shows 0.91 dB in Example 3, and 0.92 dB in Example 1). In contrast, as illustrated in (b) and (d) of FIG. 3B, in the attenuation band on the passband low-frequency side (a frequency band of at most 0.7 GHz), acoustic wave filter 10C according to Example 3 has a greater attenuation than that of the acoustic wave filter according to Example 1 (the smallest value of insertion loss is greater in Example 3 than that in Example 1 in the frequency band of at most 0.7 GHz) (Table 3 shows 3.52 dB in Example 3, and 3.24 dB in Example 1). Specifically, acoustic wave filter 10C according to Example 3 has an attenuation that is increased without increasing insertion loss in the passband.

Figure 3C:
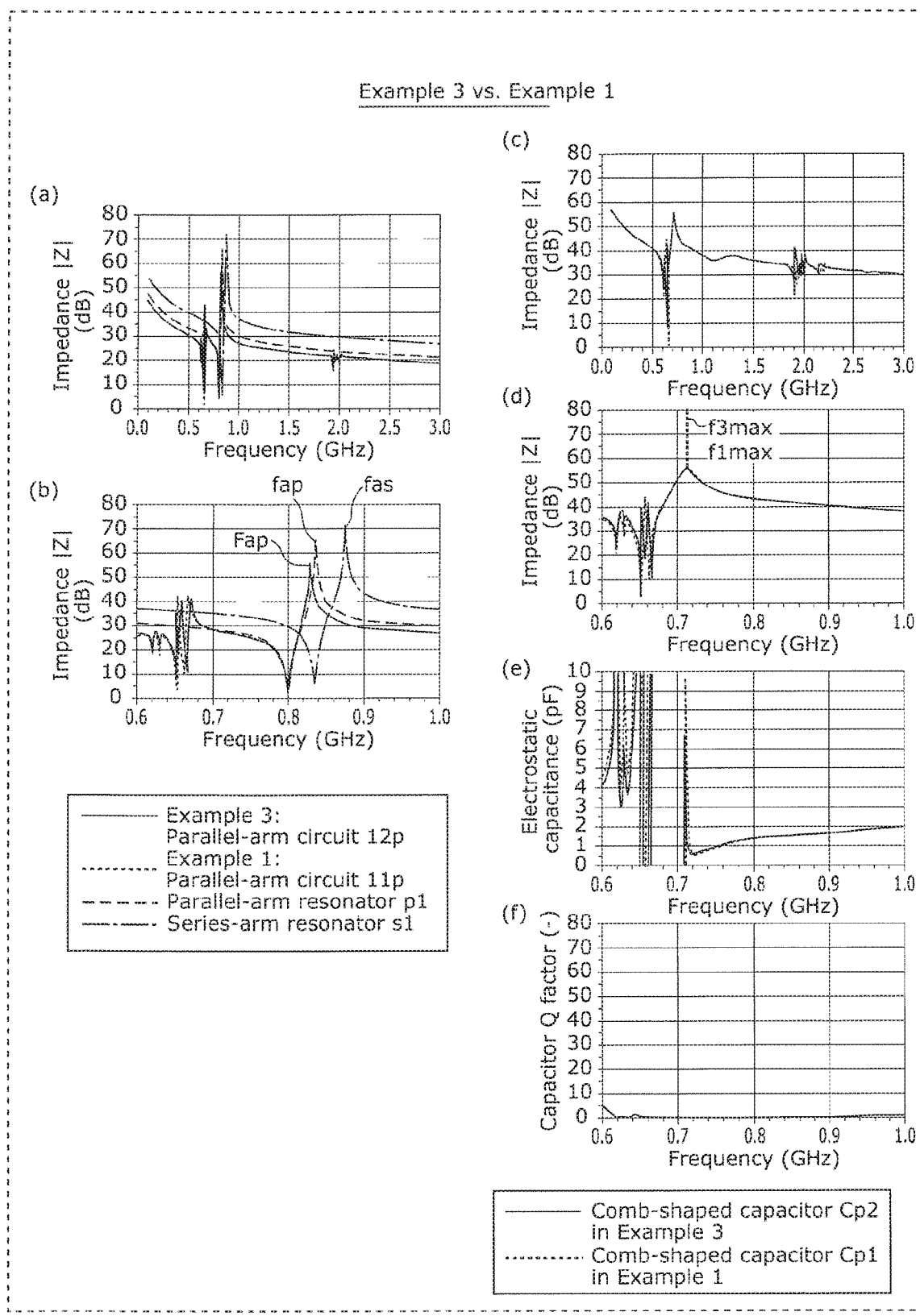
FIG. 3C illustrates graphs showing comparisons of impedance characteristics and comb-shaped capacitor characteristics of the acoustic wave filters according to Examples 3 and 1.

The following describes a factor that contributes to an increase in the attenuation in the attenuation band on the passband low-frequency side in acoustic wave filter 10C according to Example 3, with reference to FIG. 3C.

FIG. 3C illustrates graphs showing comparisons of impedance characteristics and comb-shaped capacitor characteristics of the acoustic wave filters according to Examples 3 and 1. Part (a) of FIG. 3C illustrates comparisons of impedance characteristics of the circuits and the resonators according to Examples 3 and 1 in a wide range. Part (b) of FIG. 3C illustrates comparisons of impedance characteristics of the circuits and the resonators according to Examples 3 and 1 in a narrow range (in and near the passbands). Part (c) of FIG. 3C illustrates a comparison of impedance characteristics of capacitors according to Examples 3 and 1 in a wide range. Part (d) of FIG. 3C illustrates a comparison of impedance characteristics of the capacitors according to Examples 3 and 1 in a narrow range (in and near the passbands). Part (e) of FIG. 3C illustrates a comparison of electrostatic capacitance characteristics of the capacitors according to Examples 3 and 1 in a narrow range (in and near the passbands). Part (f) of FIG. 3C illustrates a comparison of capacitor Q factors of the capacitors according to Examples 3 and 1 in a narrow range (in and near the passbands).

First, as illustrated in (a) and (b) of FIG. 3C, the acoustic wave filters according to Examples 3 and 1 are bandpass filters in each of which a passband is determined by antiresonant frequency Fap of the parallel-arm circuit and resonant frequency frs of the series-arm resonator, a pole (attenuation pole) on the passband low-frequency side is determined by resonant frequency Frp of the parallel-arm circuit, and a pole (attenuation pole) on the passband high-frequency side is determined by antiresonant frequency fas of the series-arm resonator.

Next, as illustrated in (c) and (d) of FIG. 3C, frequency f3max (710 MHz) at which impedance of capacitor Cp2 according to Example 3 has a local maximum value is located in the attenuation band on the passband low-frequency side of acoustic wave filter 10C according to Example 3. Similarly, frequency f1max (710 MHz) at which impedance of the capacitor according to Example 1 has a local maximum value is located in the attenuation band on the passband low-frequency side of acoustic wave filter 10A according to Example 1.

Note that as illustrated in (e) and (f) of FIG. 3C, electrostatic capacitance and a capacitor Q factor of the capacitor in the passband in Example 3 have no great difference from those in Example 1.

Here, as illustrated in (d) of FIG. 3C, a local maximum value of impedance at frequency f3max of capacitor Cp2 according to Example 3 (55.88 dB from Table 3) is smaller than a local maximum value of impedance at frequency f1max of the capacitor according to Example 1 (56.06 dB from Table 3). This factor is owing to, for example, capacitor Cp2 in acoustic wave filter 10C according to Example 3 having different electrode finger duty ratios, in addition to different electrode finger pitches. Accordingly, a local maximum value of impedance of parallel-arm circuit 12p decreases (frequencies at each of which impedance has a local maximum value are distributed) in the attenuation band on the passband low-frequency side, and thus the amount of a radio frequency signal passing through to parallel-arm circuit 12p at frequency f3max can be made greater than the amount of a radio frequency signal passing through to parallel-arm circuit 11p at frequency f1max according to Example 1. In short, capacitor Cp2 of parallel-arm circuit 12p included in acoustic wave filter 10C have different duty ratios of electrode fingers, and thus the attenuation in the attenuation band on the passband low-frequency side is increased without increasing insertion loss in the passband.

1.5 Acoustic Wave Filter According to Example 4

Figure 4A:
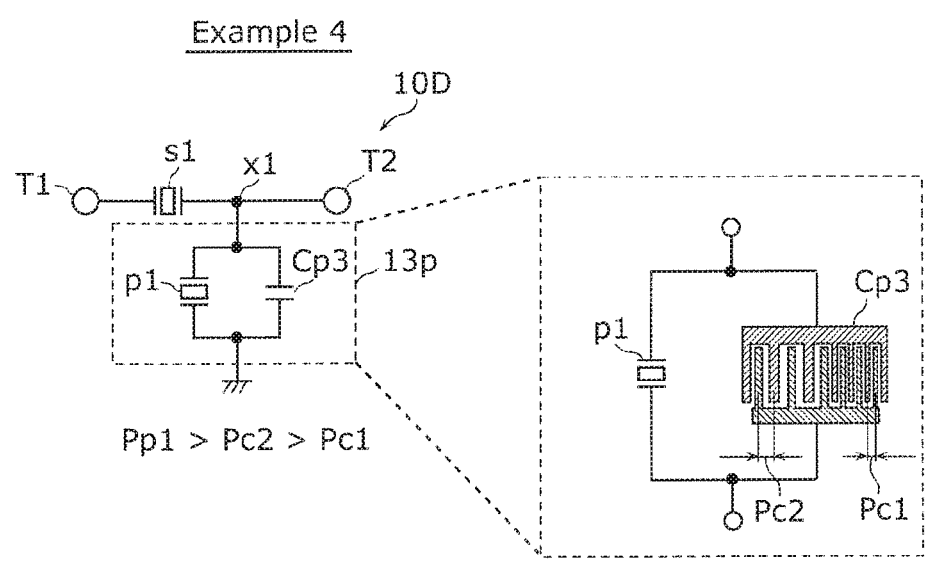
FIG. 4A illustrates a circuit configuration of an acoustic wave filter according to Example 4, and schematically illustrates a comb-shaped capacitor in a parallel-arm circuit.

FIG. 4A illustrates a circuit configuration of acoustic wave filter 10D according to Example 4, and schematically illustrates capacitor Cp3 in parallel-arm circuit 13p. Acoustic wave filter 10D illustrated in FIG. 4A includes series-arm circuit s1, parallel-arm circuit 13p, and input/output terminals T1 and T2.

In this example, series-arm resonator s1 is connected to a path that connects input/output terminals T1 and T2, and is included in a series-arm circuit.

Parallel-arm circuit 13p is connected to node x1 on the path and the ground, and includes parallel-arm resonator p1 and capacitor Cp3. Parallel-arm circuit 13p is a resonance circuit that includes parallel-arm resonator p1 and capacitor Cp3. Parallel-arm resonator p1 is a first acoustic wave resonator connected in parallel to capacitor Cp3. Capacitor Cp3 is a first comb-shaped capacitor connected in parallel to parallel-arm resonator p1, and is included in an impedance circuit.

Capacitor Cp3 includes a comb-shaped electrode that includes a plurality of electrode fingers, as illustrated in the right drawing of FIG. 4A.

Here, when a repeating pitch of the electrode fingers included in capacitor Cp3 is defined as an electrode finger pitch, the comb-shaped electrode of capacitor Cp3 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cp3 has a local maximum value is located outside the passband of acoustic wave filter 10D.

Parallel-arm resonator p1 includes an IDT electrode that is formed on a piezoelectric substrate and includes a plurality of electrode fingers. Capacitor Cp3 is formed on the substrate.

Here, electrode finger pitches Pc1 and Pc2 of capacitor Cp3 are both shorter than electrode finger pitch Pp1 of the IDT electrode of parallel-arm resonator p1.

Table 4 shows circuit parameters and filter characteristics of acoustic wave filter 10D according to Example 4 and an acoustic wave filter according to Comparative Example 4.

TABLE 4

| Acoustic wave filter | | | Reso. freq. fr (MHz) | A-reso. freq. fa (MHz) | Fract. BW BWR (%) | ES cap. (pF) |
|---|---|---|---|---|---|---|
| Comp. Ex. 4 | S-arm ckt | s1 | 835 | 875 | 4.79 | 3.00 |
| | P-arm ckt | p1 | 800 | 836 | 4.50 | 6.00 |
| | | Cp1 | | | | 1.66 |
| | | | 800 | 829 | 3.63 | 7.66 |
| Ex. 4 | S-arm ckt | s1 | 835 | 875 | 4.79 | 3.00 |
| | P-arm ckt | p1 | 800 | 836 | 4.50 | 6.00 |
| | 13p | Cp1 | | | | 1.66 |
| | | | 800 | 829 | 3.63 | 7.66 |

| Comb-shaped cap. | EF pitch Pc (μm) | EF duty ratio | Num of EFs | EF THK Tc (nm) | EF THK Tc/Pc | Crossing width Lc (μm) | Size (μm²) | ES cap. @835 MHz (pF) | ES cap. dens. (fF/μm²) | $|Z|$ max (dB) | $f|Z|$ max (MHz) |
|---|---|---|---|---|---|---|---|---|---|---|---|
| Comp. Ex. 4 | 2.00 | 0.60 | 61 | 350.0 | 0.175 | 20.00 | 2424 | 1.66 | 0.68 | 57.48 | 1070 |
| Ex. 4 | 2.00 | 0.60 | 21 | 350.0 | 0.175 | 20.00 | 2368 | 1.66 | 0.70 | 57.15 | 1085 |
| | 1.95 | 0.60 | 40 | 350.0 | 0.179 | 20.00 | | | | | |

| Filter charcs. | IL @824-849 MHz (dB) | Att @DC-800 MHz (dB) | Att @900-1200 MHz (dB) |
|---|---|---|---|
| Comp. Ex. 4 | 0.80 | 6.93 | 4.43 |
| Ex. 4 | 0.79 | 6.93 | 4.90 |

Note that in Table 4, $|Z|$max denotes a local maximum value of impedance of the comb-shaped capacitor, and $f|Z|$max denotes a frequency at which impedance of the comb-shaped capacitor has a local maximum value.

The acoustic wave filter according to Comparative Example 4 is different from acoustic wave filter 10D according to Example 4 only in the configuration of the capacitor of the parallel-arm circuit.

As shown in Table 4, in acoustic wave filter 10D according to Example 4, electrode finger pitch Pc1 of capacitor Cp3 is 1.95 μm, and electrode finger pitch Pc2 of capacitor Cp3 is 2.00 μm. The number of electrode fingers disposed at electrode finger pitch Pc1 is 40, and the number of electrode fingers disposed at electrode finger pitch Pc2 is 21. On the other hand, in the acoustic wave filter according to Comparative Example 4, all the electrode fingers of the capacitor have an electrode finger pitch of 2.00 μm, and the number of electrode fingers disposed at the electrode finger pitch is 61. The electrode finger duty ratio of the capacitor is 0.6, the thickness of the comb-shaped electrode is 350 nm, and crossing width Lc is 20 μm, which are common to both Example 4 and Comparative Example 4.

In Example 4 and Comparative Example 4, the electrode finger pitch of the IDT electrode included in parallel-arm resonator p1 is 2.1 μm, the electrode finger duty ratio of the IDT electrode is 0.5, and the thickness of the IDT electrode is 350 nm.

In Example 1, the frequency at which impedance of the comb-shaped capacitor (capacitor Cp1) has a local maximum value is located on the passband low-frequency side, whereas in Example 4, the frequency at which impedance of the comb-shaped capacitor (capacitor Cp3) has a local minimum value is located on the passband high-frequency side, which differs from Example 1. In the following, description of the common points of acoustic wave filter 10D according to this example to those of acoustic wave filter 10A according to Example 1 is omitted, and different points are mainly described.

Figure 4B:
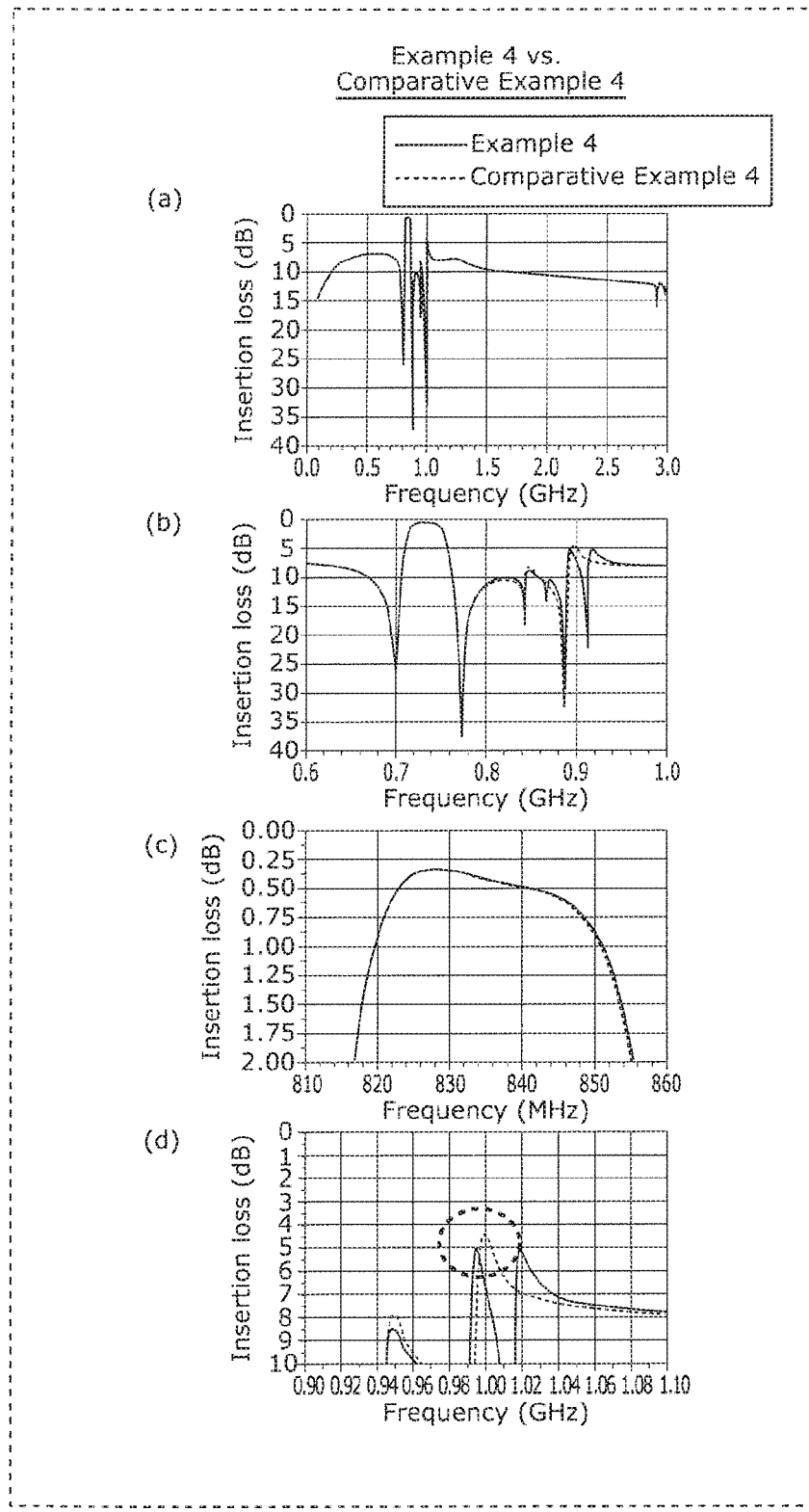
FIG. 4B illustrates graphs showing comparisons of passing characteristics of the acoustic wave filter according to Example 4 and an acoustic wave filter according to Comparative Example 4.

FIG. 4B illustrates graphs showing comparisons of passing characteristics of the acoustic wave filters according to Example 4 and Comparative Example 4. Part (a) of FIG. 4B illustrates a comparison of passing characteristics of the acoustic wave filters according to Example 4 and Comparative Example 4 in a wide range. Part (b) of FIG. 4B illustrates a comparison of passing characteristics of the acoustic wave filters according to Example 4 and Comparative Example 4 in a narrow range (in and near the passbands). Part (c) of FIG. 4B illustrates a comparison of passing characteristics of the acoustic wave filters according to Example 4 and Comparative Example 4 in the passbands. Part (d) of FIG. 4B illustrates a comparison of passing characteristics (attenuation characteristics) of the acoustic wave filters according to Example 4 and Comparative Example 4 in lower-frequency attenuation bands.

As illustrated in (a), (b), and (c) of FIG. 4B, insertion loss in the passband in Example 4 has no great difference from that in Comparative Example 4 (Table 4 shows 0.79 dB in Example 4 and 0.80 dB in Comparative Example 4). In contrast, as illustrated in (b) and (d) of FIG. 4B, in the attenuation band on the passband high-frequency side (a frequency band of at least 0.8 GHz), acoustic wave filter 10D according to Example 4 has a greater attenuation than that of the acoustic wave filter according to Comparative Example 4 (the smallest value of insertion loss is greater in Example 4 than that in Comparative Example 4 in the frequency band of at least 0.8 GHz) (Table 4 shows 4.90 dB in Example 4, and 4.43 dB in Comparative Example 4). Specifically, acoustic wave filter 10D according to Example 4 has an attenuation that is increased without increasing insertion loss in the passband.

Figure 4C:
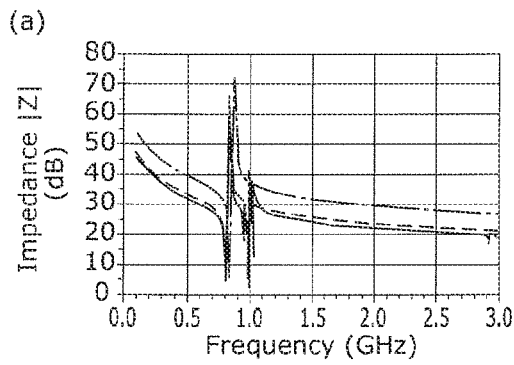
FIG. 4C illustrates graphs showing comparisons of impedance characteristics and comb-shaped capacitor characteristics of the acoustic wave filters according to Example 4 and Comparative Example 4.
Figure 4C:
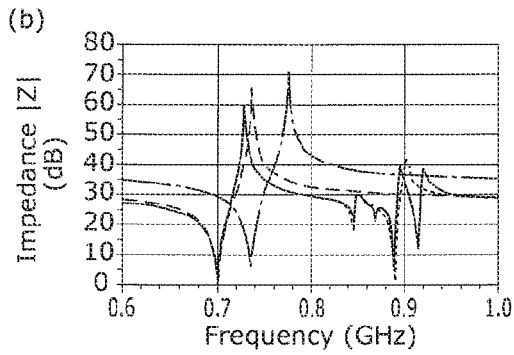
Figure 4C:
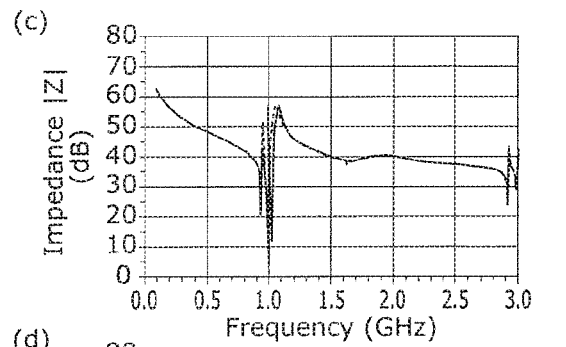
Figure 4C:
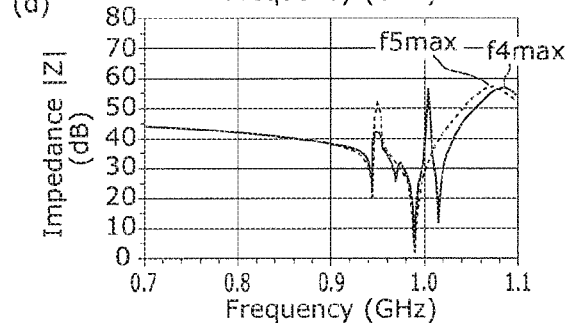
Figure 4C:
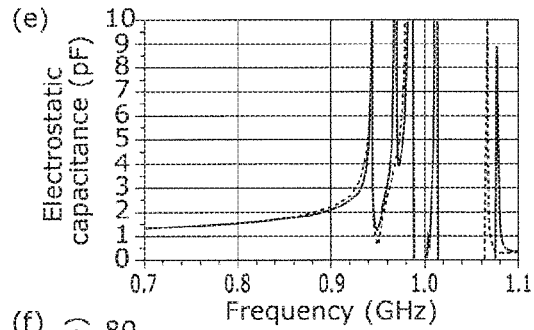
Figure 4C:
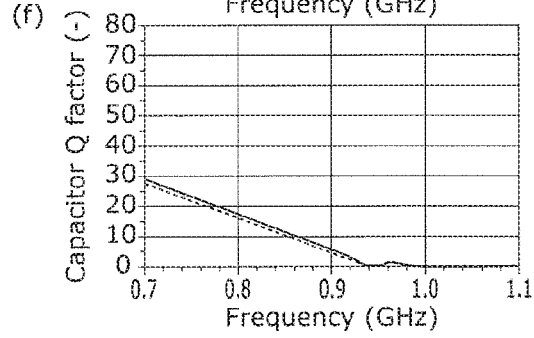

The following describes a factor that contributes to an increase in the attenuation in the attenuation band on the passband high-frequency side in acoustic wave filter 10D according to Example 4, with reference to FIG. 4C.

FIG. 4C illustrates graphs showing comparisons of impedance characteristics and comb-shaped capacitor characteristics of the acoustic wave filters according to Example 4 and Comparative Example 4. Part (a) of FIG. 4C illustrates comparisons of impedance characteristics of the circuits and the resonators according to Example 4 and Comparative Example 4 in a wide range. Part (b) of FIG. 4C illustrates comparisons of impedance characteristics of the circuits and the resonators according to Example 4 and Comparative Example 4 in a narrow range (in and near the passbands). Part (c) of FIG. 4C illustrates a comparison of impedance characteristics of capacitors according to Example 4 and Comparative Example 4 in a wide range. Part (d) of FIG. 4C illustrates a comparison of impedance characteristics of the capacitors according to Example 4 and Comparative Example 4 in a narrow range (in and near the passbands). Part (e) of FIG. 4C illustrates a comparison of electrostatic capacitance characteristics of the capacitors according to Example 4 and Comparative Example 4 in a narrow range (in and near the passbands). Part (f) of FIG. 4C illustrates a comparison of capacitor Q factors of the capacitors according to Example 4 and Comparative Example 4 in a narrow range (in and near the passbands).

Parallel-arm circuit 13p and series-arm resonator s1 that form the passband of acoustic wave filter 10D have resonance characteristics the same as the resonance characteristics of acoustic wave filter 10A according to Example 1, and thus description of the resonance characteristics is omitted.

Next, as illustrated in (c) and (d) of FIG. 4C, frequency f4max (1085 MHz) at which impedance of capacitor Cp3 according to Example 4 has a local maximum value is located in the attenuation band on the passband high-frequency side of acoustic wave filter 10D according to Example 4. Similarly, frequency f5max (1070 MHz) at which impedance of the capacitor according to Comparative Example 4 has a local maximum value is located in the attenuation band on the passband high-frequency side of the acoustic wave filter according to Comparative Example 4.

Note that as illustrated in (e) and (f) of FIG. 4C, electrostatic capacitance and a capacitor Q factor of the capacitor in the passband in Example 4 have no great difference from those in Comparative Example 4.

Here, as illustrated in (d) of FIG. 4C, a local maximum value of impedance at frequency f4max of capacitor Cp3 according to Example 4 (57.15 dB from Table 4) is smaller than a local maximum value of impedance at frequency f5max of the capacitor according to Comparative Example 4 (57.48 dB from Table 4). This factor is owing to, for example, capacitor Cp3 in acoustic wave filter 10D according to Example 4 having different electrode finger pitches. Accordingly, a local maximum value of impedance of parallel-arm circuit 13p decreases (frequencies at each of which impedance has a local maximum value are distributed) in the attenuation band on the passband high-frequency side, and thus the amount of a radio frequency signal passing through to parallel-arm circuit 13p at frequency f4max can be increased. As described above, acoustic wave filter 10D can be achieved in which the attenuation in the attenuation band on the passband high-frequency side is increased without increasing insertion loss in the passband.

Figure 4D:
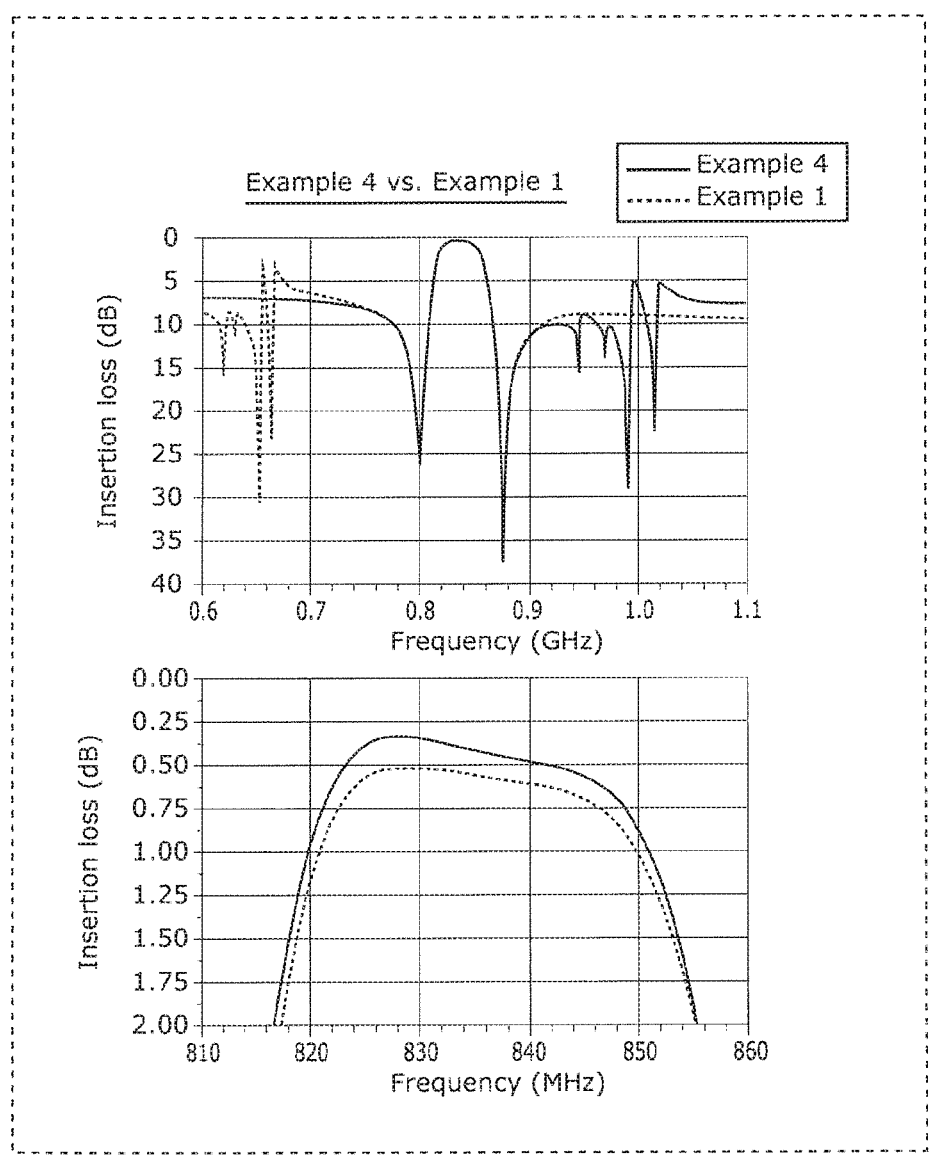
FIG. 4D illustrates graphs showing comparisons of passing characteristics of the acoustic wave filters according to Examples 4 and 1.

FIG. 4D illustrates graphs showing comparisons of passing characteristics of the acoustic wave filters according to Examples 4 and 1. The upper graph in FIG. 4D shows a comparison of passing characteristics of acoustic wave filter 10D according to Example 4 and acoustic wave filter 10A according to Example 1 in and near the passbands. The lower graph in FIG. 4D shows a comparison of passing characteristics of acoustic wave filter 10D according to Example 4 and acoustic wave filter 10A according to Example 1 in the passbands. As shown in the lower graph in FIG. 4D, insertion loss in the passband of acoustic wave filter 10D according to Example 4 is made lower than that of acoustic wave filter 10A according to Example 1 (Table 4 shows that insertion loss in the passband is 0.79 dB in Example 4, and Table 1 shows that insertion loss in the passband is 0.92 dB in Example 1).

The following describes insertion loss in the passband of acoustic wave filter 10D according to Example 4.

Figure 5A:
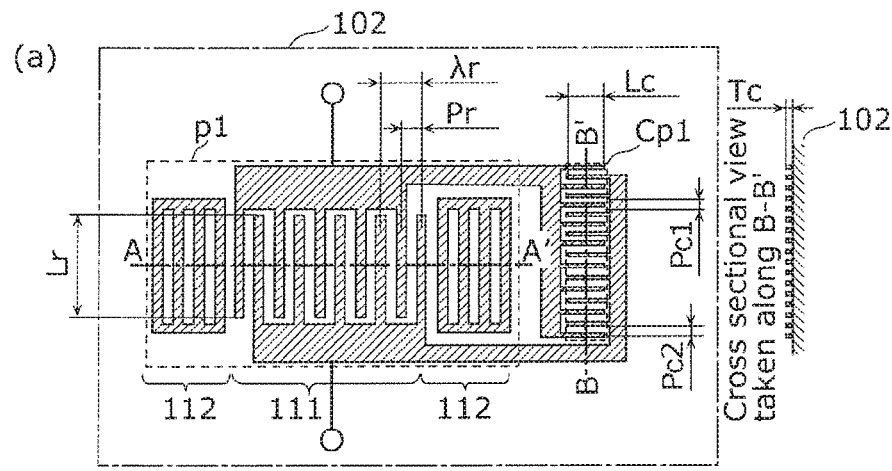
FIG. 5A schematically illustrates an electrode structure of a resonance circuit included in the acoustic wave filter according to Embodiment 1.
Figure 5A:
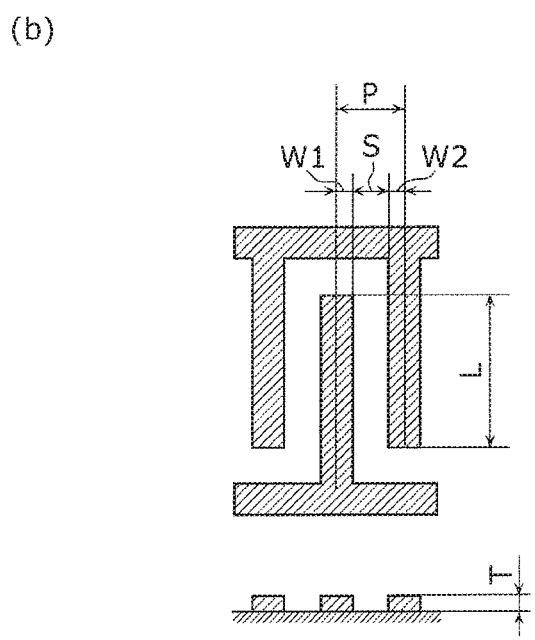

FIG. 5A schematically illustrates the electrode structure of a resonance circuit included in the acoustic wave filter according to Embodiment 1. Specifically, (a) of FIG. 5A illustrates a plan view of electrodes on a substrate, which are included in parallel-arm circuit 11p according to Example 1, a cross-sectional view taken along line A-A' of the plan view, and a cross-sectional view taken along line B-B' of the plan view, and (b) of FIG. 5A illustrates an enlarged view of an electrode. Note that the electrode structure illustrated in FIG. 5A is for describing a typical structure of parallel-arm resonator p included in parallel-arm circuit 11p and the comb-shaped capacity electrode included in capacitor Cp1. Accordingly, the number and length, for instance, of electrode fingers included in the IDT electrode and the comb-shaped capacitor electrode of each resonator are not limited to the number and length of electrode fingers illustrated in FIG. 5A. The electrode structure illustrated in FIG. 5A is applied not only to the resonance circuit according to Example 1, but also to the resonance circuit according to other examples.

As illustrated in (a) of FIG. 5A, parallel-arm resonator p1 includes an IDT electrode that is formed on piezoelectric substrate 102. Parallel-arm resonator p1 includes IDT electrode 111, one set of reflectors 112, and piezoelectric substrate 102. IDT electrode 111 and reflectors 112 include a plurality of electrode fingers, and one set of bus bar electrodes facing each other with the electrode fingers therebetween, and IDT electrode 111 is configured by one pair of pectinate electrodes each including electrode fingers disposed between electrode fingers of the other pectinate electrode. Here, electrode fingers are formed in the direction orthogonal to the direction in which acoustic waves propagate, and are cyclically formed in the propagation direction.

In parallel-arm resonator p1 having such a configuration, the wavelength of acoustic waves excited is determined by the design parameters of IDT electrode 111 and reflectors 112, for instance. The design parameters of IDT electrode 111 are to be described in the following.

Note that in the following description, although electrode parameters of IDT electrode 111 and capacitor Cp1 are denoted by P, W1, W2, S, and L in (b) of FIG. 5A, electrode parameters of IDT electrode 111 are defined as Pr, W1r, W2r, Sr, and Lr and electrode parameters of capacitor Cp1 are defined as Pc1 (or Pc2), W1c1 (or W1c2), W2c1 (or W2c2), Sc1 (or Sc2), and Lc in the following description when referring to (b) of FIG. 5A.

The wavelength of acoustic waves is determined by repeating cycle $\lambda r$ of electrode fingers connected to one bus bar electrode out of the electrode fingers. Electrode finger pitch (pitch of electrode fingers, that is, electrode finger cycle) Pr is ½ repeating cycle $\lambda r$. As illustrated in (b) of FIG. 5A, Pr is defined as Pr=(W1r+W2r+Sr), where W1 denotes half the line width of a left electrode finger out of adjacent electrode fingers, W2 denotes half the line width of a right electrode finger out of the adjacent electrode fingers, and Sr denotes the space width between the adjacent electrode fingers (a gap between electrode fingers). Further, crossing width Lr of IDT electrode 111 is the length of overlapping electrode fingers when an electrode finger connected to one of the bus bar electrodes in the set and an electrode finger connected to the other bus bar electrode in the set are viewed in the direction in which acoustic waves propagate. The electrode finger duty ratio is defined as a width of the electrode finger (W1r+W2r) within electrode finger pitch Pr, that is, (W1r+W2r)/(W1r+W2r+Sr). Thus, the electrode finger duty ratio of IDT electrode 111 is defined by a percentage made up by the line width of each of electrode fingers, that is, (W1r+W2r)/Pr. The pair count is the number of electrode fingers that are paired, and is substantially half the total number of electrode fingers. For example, the relation Mr=2Nr+1 is satisfied, where Nr denotes the pair count, and Mr denotes a total number of electrode fingers. The thickness of electrode fingers in IDT electrode 111 indicates thickness Tr of an electrode film that forms the electrode fingers. Electrostatic capacitance Co of parallel-arm resonator p1 is indicated by Expression 1 below.

[Math 1]

$$\text{Electrostatic capacitance } C_0 = \frac{\varepsilon_0 \cdot \varepsilon_r \cdot Nr \cdot Lr \cdot Pr}{2 \cdot Sr} \quad \text{(Expression 1)}$$

Note that $\varepsilon_0$ denotes permittivity in a vacuum, and $\varepsilon_r$ denotes permittivity of piezoelectric substrate 102.

Next, the structure of capacitor Cp1 is to be described.

Capacitor Cp1 includes piezoelectric substrate 102, and a comb-shaped capacitor electrode formed on piezoelectric substrate 102. The comb-shaped capacitor electrode includes a plurality of electrode fingers. As illustrated in (a) of FIG. 5A, the comb-shaped capacitor electrode is included in an electrode film, as with IDT electrode 111. Specifically, the comb-shaped capacitor electrode included in capacitor Cp1 is formed on piezoelectric substrate 102 on which IDT electrode 111 included in parallel-arm resonator p1 is formed. Note that the comb-shaped capacitor electrode and IDT electrode 111 may be formed on different piezoelectric substrates.

The comb-shaped capacitor electrode includes a plurality of electrode fingers, and one set of bus bar electrodes facing each other with the electrode fingers therebetween, and has a configuration in which the electrode fingers are alternately connected to one bus bar electrode and the other bus bar electrode in the set. Here, the electrode fingers are formed in the direction in which acoustic waves propagate, and are cyclically formed in the direction orthogonal to the propagation direction.

Here, capacitor Cp1 has two different electrode finger pitches Pc1 and Pc2. In Example 1, the relation Pc2>Pc1 is satisfied.

In capacitor Cp1 having such a configuration, characteristics such as capacitance and a Q factor are determined by design parameters of the comb-shaped capacitor electrode, for instance. The following is to describe the design parameters of the comb-shaped capacitor electrode.

Electrode finger pitches Pc1 and Pc2 of the comb-shaped capacitor electrode (the pitches of electrode fingers, that is, electrode finger cycles) are defined as Pc1=(W1c1+W2c1+Sc1) and Pc2=(W1c2+W2c2+Sc2), where as illustrated in (b) of FIG. 5A, W1c1 (or W1c2) denotes half the line width of a left electrode finger out of adjacent electrode fingers, W2c1 (or W2c2) denotes half the line width of a right electrode finger out of the adjacent electrode fingers, and Sc1 (or Sc2) denotes the space width between the adjacent electrode fingers (a gap between electrode fingers). The electrode finger duty ratio is defined as a width of an electrode finger (W1c1+W2c1) within electrode finger pitch Pc1 or a width of an electrode finger (W1c2+W2c2) within electrode finger pitch Pc2, that is, (W1c1+W2c1)/(W1c1+W2c1+Sc1) or (W1c2+W2c2)/(W1c2+W2c2+Sc2). Accordingly, the electrode finger duty ratio is defined by a percentage made up by the line width of each of electrode fingers, that is, (W1c1+W2c1)/Pc1 or (W1c2+W2c2)/Pc2. The pair count is the number of electrode fingers that are paired, and is substantially half the total number of electrode fingers. For example, if the pair count of electrode fingers having electrode finger pitch Pc1 (or Pc2) is Nc1 (or Nc2), and a total number of electrode fingers having electrode finger pitch Pc1 (or Pc2) is Mc1 (or Mc2), the relation Mc1=2Nc1+1 (or Mc2=2Nc2+1) is satisfied. The thickness of electrode fingers in the comb-shaped capacitor electrode indicates thickness Tc of an electrode film that forms the electrode fingers. Electrostatic capacitance $C_x$ of the comb-shaped capacitor electrode is indicated by Expression 2 below if electrostatic capacitance of electrode fingers having electrode finger pitch Pc1 is Cxc1, and electrostatic capacitance of electrode fingers having electrode finger pitch Pc2 is Cxc2, and the electrode finger pitches do not influence electrostatic capacitance.

[Math 2]

$$\text{Electrostatic capacitance } Cx = Cxc1 + Cxc2 = \frac{\varepsilon_0 \cdot \varepsilon_r \cdot Nc1 \cdot Lc1 \cdot Pc1}{2 \cdot Sc1} + \frac{\varepsilon_0 \cdot \varepsilon_r \cdot Nc2 \cdot Lc2 \cdot Pc2}{2 \cdot Sc2} \quad \text{(Expression 2)}$$

Next, the design parameters of the comb-shaped capacitor electrode included in capacitor Cp1 and IDT electrode 111 included in parallel-arm resonator p1 connected in parallel to capacitor Cp1 are to be described in comparison with each other.

In acoustic wave filter 10D according to this example, electrode finger pitches Pc1 and Pc2S of capacitor Cp3 are each shorter than electrode finger pitch Pr of the IDT electrode included in parallel-arm resonator p1. According to this, electrode finger pitches do not influence electrostatic capacitance as stated above, and thus electrostatic capacitance of capacitor Cp3 per unit area is made greater than electrostatic capacitance of parallel-arm resonator p1 per unit area (electrostatic capacity density), and at the same time, the size of capacitor Cp3 can be decreased.

Figure 5B:
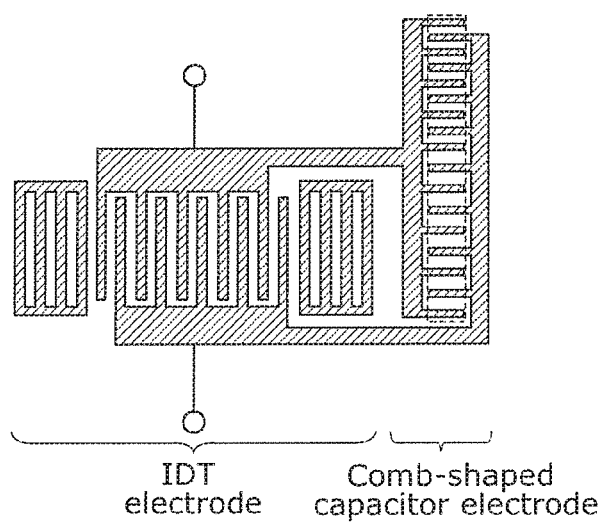
FIG. 5B schematically illustrates an electrode structure of a resonance circuit included in an acoustic wave filter according to a comparative example.
Figure 5B:
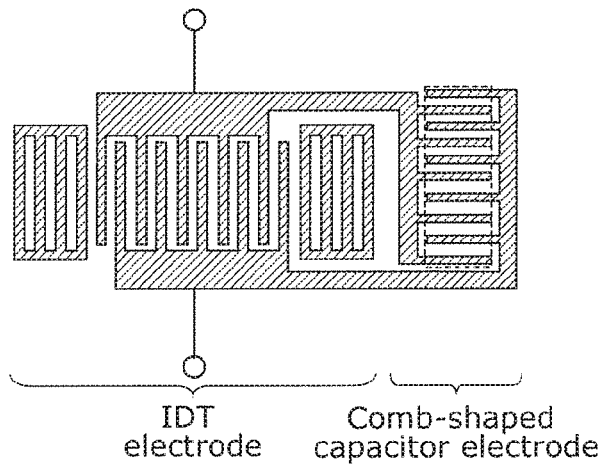

FIG. 5B schematically illustrates the electrode structure of a resonance circuit included in the acoustic wave filter according to a comparative example. Parts (a) and (b) of FIG. 5B each illustrate an electrode configuration according to which electrostatic capacitance of the capacitor is the same as the electrostatic capacitance of the capacitor in the acoustic wave filter according to Embodiment 1 ((a) of FIG. 5A). Part (a) of FIG. 5B illustrates a configuration in which (1) electrostatic capacitance is the same, (2) the electrode finger pitch is greater (and is the same as the electrode finger pitch of the resonator), and (3) the crossing width and the pair count are the same, as compared to the acoustic wave filter according to Embodiment 1 ((a) of FIG. 5A). Part (b) of FIG. 5B illustrates a configuration in which (1) electrostatic capacitance is the same, (2) the electrode finger pitch is the same (and is the same as the electrode finger pitch of the resonator), and (3) the crossing width is greater and the pair count is lower (the configurations in (a) and (b) of FIG. 5B have the same product of the crossing width and the pair count), as compared to the configuration illustrated in (a) of FIG. 5B.

According to (a) and (b) of FIG. 5B, if the electrode finger pitch of the capacitor is the same as or greater than the electrode finger pitch of the resonator, the size of the capacitor cannot be decreased.

Figure 6A:
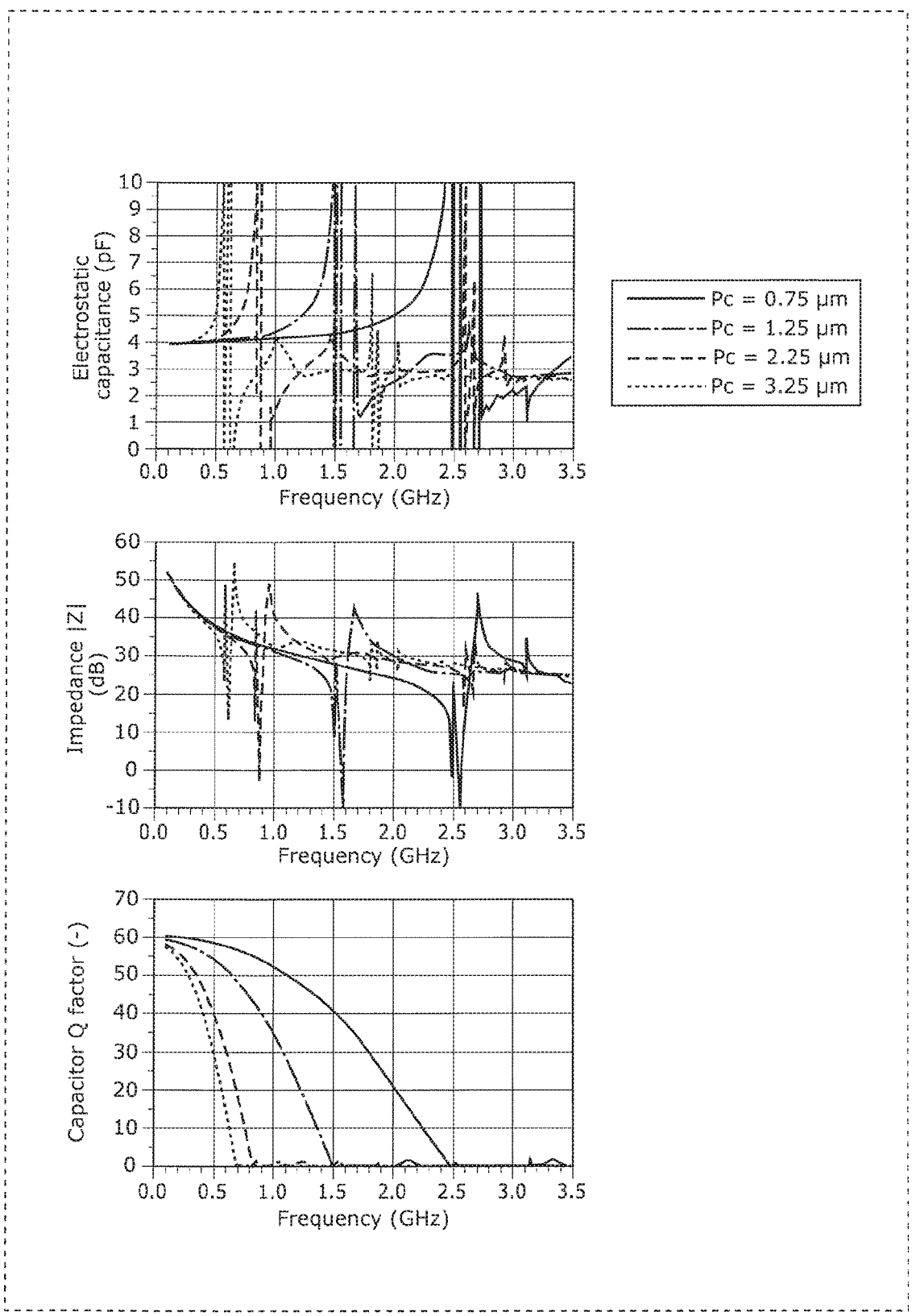
FIG. 6A illustrates graphs showing relations between (i) electrode finger pitches of a comb-shaped capacitor and (ii) electrostatic capacitance, impedance, and a capacitor Q factor of the comb-shaped capacitor, in a typical example.
Figure 6B:
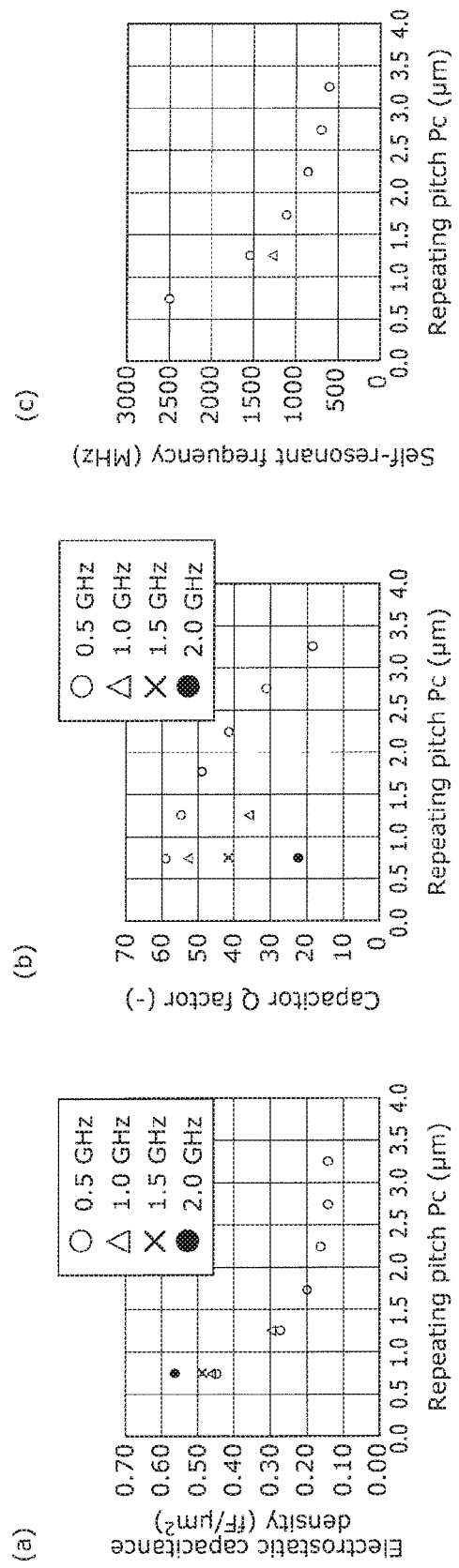
FIG. 6B illustrates graphs showing relations between (i) an electrode finger pitch of the comb-shaped capacitor and (ii) electrostatic capacitance per unit area, a capacitor Q factor, and a self-resonant frequency of the comb-shaped capacitor, in the typical example.

FIG. 6A illustrates graphs showing relations between (i) electrode finger pitches of the comb-shaped capacitor and (ii) electrostatic capacitance, impedance, and a capacitor Q factor of the comb-shaped capacitor, in a typical example. FIG. 6B illustrates graphs showing relations between (i) an electrode finger pitch of the comb-shaped capacitor and (ii) electrostatic capacitance per unit area (electrostatic capacity density), a capacitor Q factor, and a self-resonant frequency of the comb-shaped capacitor, in the typical example. As can be seen from FIGS. 6A and 6B, decreasing the electrode finger pitch yields the following advantageous effects.

(1) The self-resonant frequency shifts to a higher frequency ((c) of FIG. 6B).
(2) The capacitor Q factor improves ((b) of FIG. 6B).
(3) The electrostatic capacitance per unit area increases ((a) of FIG. 6B). Accordingly, the size of the comb-shaped capacitor is decreased.

As in acoustic wave filter 10D according to Example 4, electrode finger pitches Pc1 and Pc2 of capacitor Cp3 are each made shorter than electrode finger pitch Pp1 of the IDT electrode of parallel-arm resonator p1, which makes the capacitor Q factor of capacitor Cp3 greater than that in acoustic wave filter 10A according to Example 1 as indicated by (2) above. This results in lower insertion loss in the passband of acoustic wave filter 10D according to Example 4 than that of acoustic wave filter 10A according to Example 1 (Table 4 shows that insertion loss in the passband is 0.79 dB in Example 4, and Table 1 shows that insertion loss in the passband is 0.92 dB in Example 1).

As indicated by (3) above, capacitor Cp3 according to Example 4 has greater electrostatic capacitance per unit area than that of capacitor Cp1 according to Example 1, and thus the acoustic wave filter can be miniaturized. As an example, the area of the comb-shaped electrode of capacitor Cp1 of acoustic wave filter 10A according to Example 1 is 7293 $\mu m^2$, whereas the area of the comb-shaped electrode of capacitor Cp1 of acoustic wave filter 10D according to Example 4 is 2368 $\mu m^2$, which shows that acoustic wave filter 10A is miniaturized.

Furthermore, electrode finger pitches Pc1 and Pc2 of capacitor Cp3 are each made shorter than electrode finger pitch Pp1 of the IDT electrode of parallel-arm resonator p1, so that the self-resonant frequency shifts to a higher frequency as indicated by (1) above. From this viewpoint, in Example 4, a frequency at which impedance of capacitor Cp3 has a local maximum value is readily located in the attenuation band on the passband high-frequency side of acoustic wave filter 10D.

1.6 Acoustic Wave Filter According to Example 5

Figure 7A:
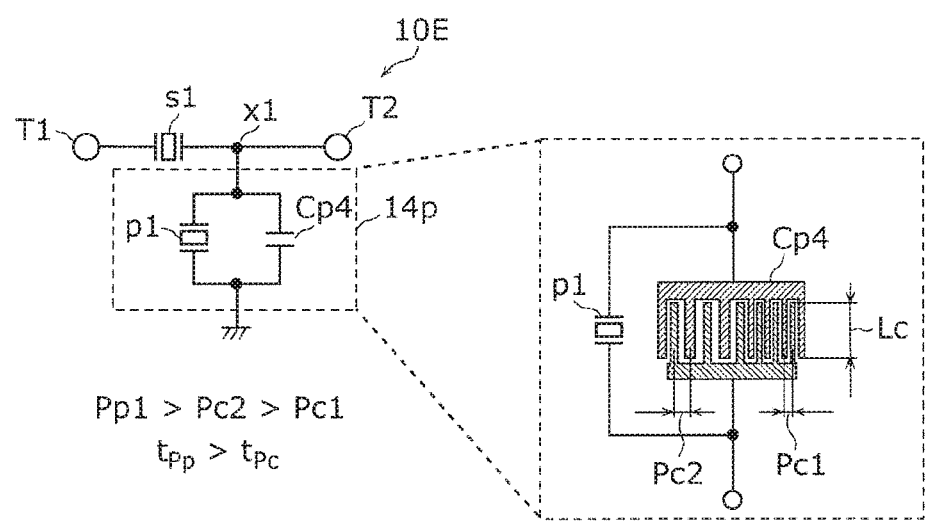
FIG. 7A illustrates a circuit configuration of an acoustic wave filter according to Example 5, and schematically illustrates a comb-shaped capacitor in a parallel-arm circuit.

FIG. 7A illustrates a circuit configuration of acoustic wave filter 10E according to Example 5, and schematically illustrates capacitor Cp4 in parallel-arm circuit 14p. Acoustic wave filter 10E illustrated in FIG. 7A includes series-arm circuit s1, parallel-arm circuit 14p, and input/output terminals T1 and T2.

In this example, series-arm resonator s1 is connected to a path that connects input/output terminals T1 and T2, and is included in a series-arm circuit.

Parallel-arm circuit 14p is connected to node x1 on the path and the ground, and includes parallel-arm resonator p1 and capacitor Cp4. Parallel-arm circuit 14p is a resonance circuit that includes parallel-arm resonator p1 and capacitor Cp4. Parallel-arm resonator p1 is a first acoustic wave resonator connected in parallel to capacitor Cp4. Capacitor Cp4 is a first comb-shaped capacitor connected in parallel to parallel-arm resonator p1, and is included in an impedance circuit.

Capacitor Cp4 includes a comb-shaped electrode that includes a plurality of electrode fingers, as illustrated in the right drawing in FIG. 7A.

Here, when a repeating pitch of the electrode fingers included in capacitor Cp4 is defined as an electrode finger pitch, the comb-shaped electrode of capacitor Cp4 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cp4 has a local maximum value is located outside the passband of acoustic wave filter 10E.

Parallel-arm resonator p1 includes an IDT electrode that is formed on a piezoelectric substrate and includes a plurality of electrode fingers. Capacitor Cp4 is formed on the substrate.

Here, electrode finger pitches Pc1 and Pc2 of capacitor Cp4 are each shorter than electrode finger pitch Pp1 of the IDT electrode of parallel-arm resonator p1.

Furthermore, electrode fingers included in capacitor Cp4 are thinner than the electrode fingers included in the IDT electrode of parallel-arm resonator p1.

Table 5 shows circuit parameters and filter characteristics of acoustic wave filter 10E according to Example 5 and an acoustic wave filter according to Comparative Example 5.

TABLE 5

| | Acoustic wave filter | | Reso. freq. fr (MHz) | A-reso. freq. fa (MHz) | Fract. BW BWR (%) | ES cap. (pF) |
|---|---|---|---|---|---|---|
| Comp. Ex. 5 | S-arm ckt | s1 | 835 | 875 | 4.79 | 3.00 |
| | P-arm ckt | p1 | 800 | 836 | 4.50 | 6.00 |
| | | Cp1 | | | | 1.66 |
| | | | 800 | 830 | 3.75 | 7.66 |
| Ex. 5 | S-arm ckt | s1 | 835 | 875 | 4.79 | 3.00 |
| | P-arm ckt | p1 | 800 | 836 | 4.50 | 6.00 |
| | 14p | Cp1 | | | | 1.66 |
| | | | 800 | 830 | 3.75 | 7.66 |

TABLE 5-continued

| Comb-shaped cap. | EF pitch Pc (μm) | EF duty ratio | Num of EFs | EF THK Tc (nm) | EF THK Tc/Pc | Crossing width Lc (μm) | Size (μm$^2$) | ES cap. @835 MHz (pF) | ES cap. dens. (fF/μm$^2$) | $|Z|$ max (dB) | f$|Z|$ max (MHz) |
|---|---|---|---|---|---|---|---|---|---|---|---|
| Comp. Ex. 5 | 0.750 | 0.60 | 61 | 150.0 | 0.200 | 20.00 | 909 | 1.66 | 1.82 | 57.43 | 2695 |
| Ex. 5 | 0.725 | 0.60 | 21 | 150.0 | 0.207 | 20.00 | 893 | 1.66 | 1.85 | 52.53 | 2601 |
|  | 0.750 | 0.60 | 40 | 150.0 | 0.200 | 20.00 |  |  |  |  |  |

| Filter charcs. | IL @824-849 MHz (dB) | Att @DC-800 MHz (dB) | Att @900-1200 MHz (dB) | Att @1200-3000 MHz (dB) |
|---|---|---|---|---|
| Comp. Ex. 5 | 0.65 | 6.87 | 8.42 | 8.54 |
| Ex. 5 | 0.65 | 6.87 | 8.42 | 8.87 |

Note that in Table 5, |Z|max denotes a local maximum value of impedance of the comb-shaped capacitor, and f|Z|max denotes a frequency at which impedance of the comb-shaped capacitor has a local maximum value.

The acoustic wave filter according to Comparative Example 5 is different from acoustic wave filter 10E according to Example 5 only in the configuration of the capacitor of the parallel-arm circuit.

As shown in Table 5, in acoustic wave filter 10E according to Example 5, electrode finger pitch Pc1 of capacitor Cp4 is 0.725 μm, and electrode finger pitch Pc2 is 0.750 μm. The number of electrode fingers disposed at electrode finger pitch Pc1 is 40, and the number of electrode fingers disposed at electrode finger pitch Pc2 is 21. On the other hand, the pitch of all the electrode fingers of the capacitor is 0.750 μm in the acoustic wave filter according to Comparative Example 4. The electrode finger duty ratio of the capacitor is 0.6, the thickness of the comb-shaped electrode is 150 nm, and crossing width Lc is 20 μm, which are common to both Example 4 and Comparative Example 4.

In Example 5 and Comparative Example 5, the electrode finger pitch of the IDT electrode included in parallel-arm resonator p1 is 2.1 μm, the electrode finger duty ratio of the IDT electrode is 0.5, and the thickness of the IDT electrode is 350 nm.

Acoustic wave filter 10E according to Example 5 is different from acoustic wave filter 10D according to Example 4 only in that capacitor Cp4 in parallel-arm circuit 14p is thinner than capacitor Cp3 in parallel-arm circuit 13p, and has electrode finger pitches Pc1 and Pc2 shorter than electrode finger pitches Pc1 and Pc2 of capacitor Cp3, respectively, in the configuration. In the following, description of the common points of acoustic wave filters 10E according to this example to those of acoustic wave filter 10D according to Example 4 is omitted, and different points are mainly described.

Specific comparisons between Examples 5 and 4 show that in Example 4, both the thickness of capacitor Cp3 and the thickness of the IDT electrode are 350 nm, whereas in Example 5, the thickness of capacitor Cp4 (150 nm) is set to a value smaller than the thickness of an IDT electrode (350 nm). Accordingly, electrode finger pitches Pc1 (0.725 μm) and Pc2 (0.750 μm) in Example 5 are shorter than electrode finger pitches Pc1 (1.950 μm) and Pc2 (2.000 μm) in Example 4.

Figure 7B:
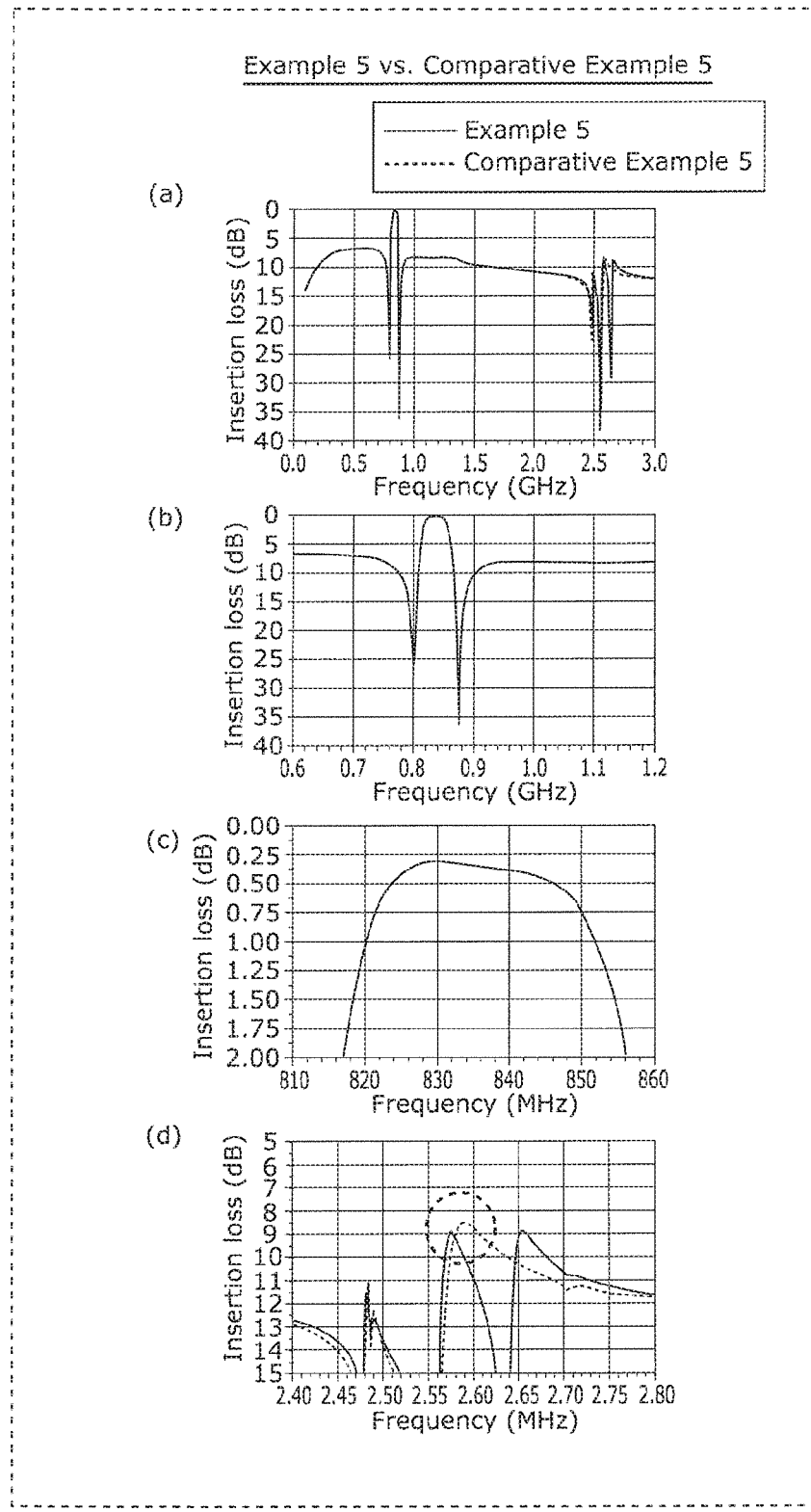
FIG. 7B illustrates graphs showing comparisons of passing characteristics of the acoustic wave filter according to Example 5 and an acoustic wave filter according to Comparative Example 5.

FIG. 7B illustrates graphs showing comparisons of passing characteristics of the acoustic wave filters according to Example 5 and Comparative Example 5. Part (a) of FIG. 7B illustrates a comparison of passing characteristics of the acoustic wave filters according to Example 5 and Comparative Example 5 in a wide range. Part (b) of FIG. 7B illustrates a comparison of passing characteristics of the acoustic wave filters according to Example 5 and Comparative Example 5 in a narrow range (in and near the passbands). Part (c) of FIG. 7B illustrates a comparison of passing characteristics of the acoustic wave filters according to Example 5 and Comparative Example 5 in the passbands. Part (d) of FIG. 7B illustrates a comparison of passing characteristics (attenuation characteristics) of the acoustic wave filters according to Example 5 and Comparative Example 5 in lower-frequency attenuation bands.

As illustrated in (a), (b), and (c) of FIG. 7B, insertion loss in the passband in Example 5 has no difference from that in Comparative Example 5 (Table 5 shows 0.65 dB in Example 5, and 0.65 dB in Comparative Example 5). In contrast, as illustrated in (a) and (d) of FIG. 7B, in the attenuation band on the passband high-frequency side (a frequency band of at least 2 GHz), acoustic wave filter 10E according to Example 5 has a greater attenuation than that of the acoustic wave filter according to Comparative Example 5 (in the frequency band of at least 2 GHz, the smallest value of insertion loss is greater in Example 5 than that in Comparative Example 5) (Table 5 shows 8.87 dB in Example 5, and 8.54 dB in Comparative Example 5). Specifically, acoustic wave filter 10E according to Example 5 has an attenuation that is increased without increasing insertion loss in the passband.

Figure 7C:
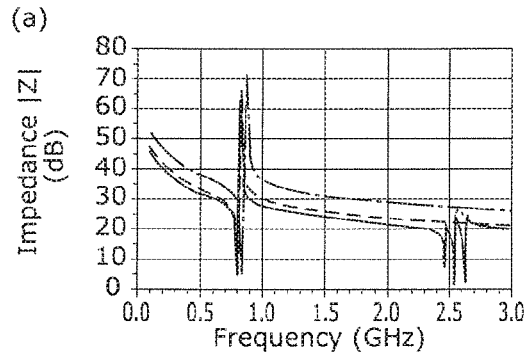
FIG. 7C illustrates graphs showing comparisons of impedance characteristics and comb-shaped capacitor characteristics of the acoustic wave filters according to Example 5 and Comparative Example 5.
Figure 7C:
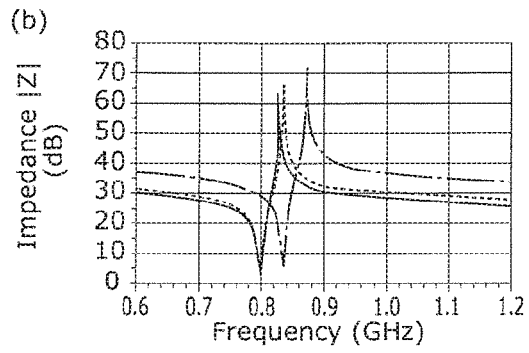
Figure 7C:
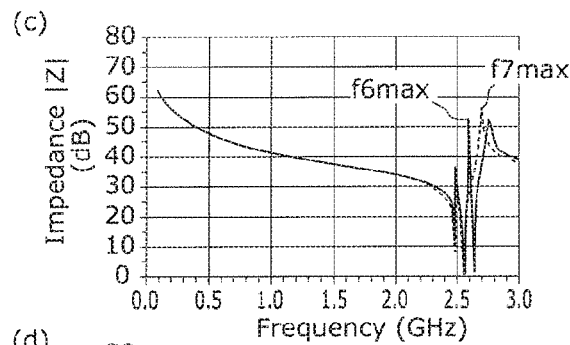
Figure 7C:
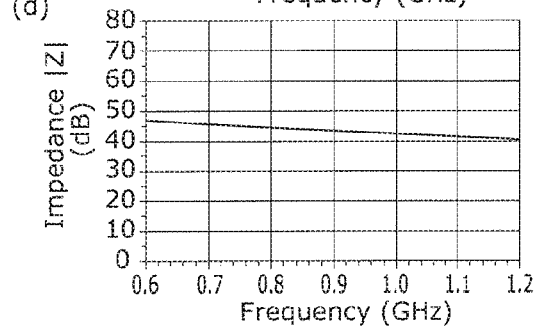
Figure 7C:
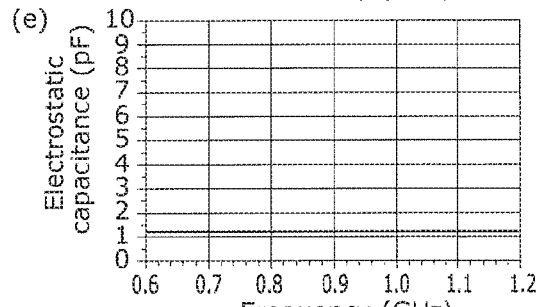
Figure 7C:
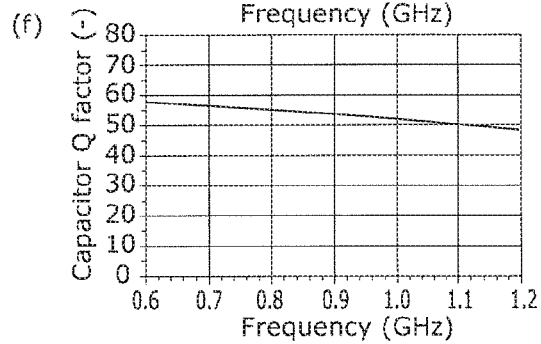

The following describes a factor that contributes to an increase in the attenuation in the attenuation band on the passband high-frequency side in acoustic wave filter 10E according to Example 5, with reference to FIG. 7C.

FIG. 7C illustrates graphs showing comparisons of impedance characteristics and comb-shaped capacitor characteristics of the acoustic wave filters according to Example 5 and Comparative Example 5. Part (a) of FIG. 7C illustrates comparisons of impedance characteristics of the circuits and the resonators according to Example 5 and Comparative Example 5 in a wide range. Part (b) of FIG. 7C illustrates comparisons of impedance characteristics of the circuits and the resonators according to Example 5 and Comparative Example 5 in a narrow range (in and near the passbands). Part (c) of FIG. 7C illustrates a comparison of impedance characteristics of capacitors according to Example 5 and Comparative Example 5 in a wide range. Part (d) of FIG. 7C illustrates a comparison of impedance characteristics of the capacitors according to Example 5 and Comparative Example 5 in a narrow range (In and near the passbands).

Part (e) of FIG. 7C illustrates a comparison of electrostatic capacitance characteristics of the capacitors according to Example 5 and Comparative Example 5 in a narrow range (in and near the passbands). Part (f) of FIG. 7C illustrates a comparison of capacitor Q factors of the capacitors according to Example 5 and Comparative Example 5 in a narrow range (in and near the passbands).

Parallel-arm circuit 14p and series-arm resonator s1 that form the passband of acoustic wave filter 10E have resonance characteristics same as the resonance characteristics of acoustic wave filter 10A according to Example 1, and thus description of the resonance characteristics is omitted.

Next, as illustrated in (c) of FIG. 7C, frequency f6max (2601 MHz) at which impedance of capacitor Cp4 according to Example 5 has a local maximum value is located in the attenuation band on the passband high-frequency side of acoustic wave filter 10E according to Example 5. Similarly, frequency f7max (2695 MHz) at which impedance of the capacitor according to Comparative Example 5 has a local maximum value is located in the attenuation band on the passband high-frequency side of the acoustic wave filter according to Comparative Example 5.

Note that as illustrated in (e) and (f) of FIG. 7C, electrostatic capacitance and a capacitor Q factor of the capacitor in the passband in Example 5 have no great difference from those in Comparative Example 5.

Here, as illustrated in (c) of FIG. 7C, a local maximum value of impedance at frequency f6max of capacitor Cp4 according to Example 5 (52.53 dB from Table 5) is smaller than a local maximum value of impedance at frequency f7max of the capacitor according to Comparative Example 5 (57.43 dB from Table 5). This factor is owing to, for example, capacitor Cp4 in acoustic wave filter 10E according to Example 5 having different electrode finger pitches. Accordingly, a local maximum value of impedance of parallel-arm circuit 14p decreases (frequencies at each of which impedance has a local maximum value are distributed) in the attenuation band on the passband high-frequency side, and thus the amount of a radio frequency signal passing through to parallel-arm circuit 14p at frequency f6max can be increased. As described above, acoustic wave filter 10E can be achieved in which the attenuation in the attenuation band on the passband high-frequency side is increased without increasing insertion loss in the passband.

In Example 5, the electrode finger pitch of capacitor Cp4 is set to a value smaller than that in Example 4, and thus frequency f6max (2601 MHz) at which impedance of capacitor Cp4 has a local maximum value is higher than frequency f4max at which impedance of capacitor Cp3 has a local maximum value (1085 MHz). Accordingly, the attenuation in a higher-frequency attenuation band is greater in Example 5 than that in Example 4.

Figure 7D:
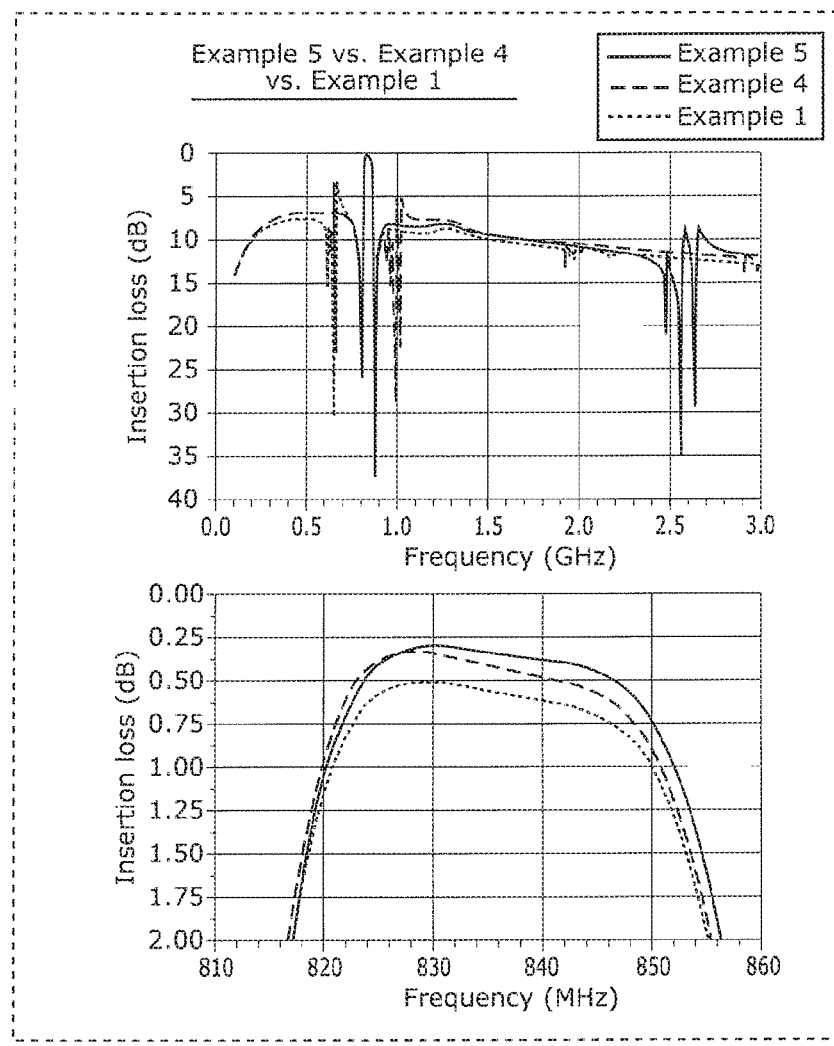
FIG. 7D illustrates graphs showing comparisons of passing characteristics of the acoustic wave filters according to Examples 5, 4, and 1.

FIG. 7D illustrates graphs showing comparisons of passing characteristics of the acoustic wave filters according to Examples 5, 4, and 1. The upper graph in FIG. 7D shows comparisons of passing characteristics of acoustic wave filter 10E according to Example 5, acoustic wave filter 10D according to Example 4, and acoustic wave filter 10A according to Example 1 in a wide range. The lower graph in FIG. 7D shows comparisons of passing characteristics of acoustic wave filter 10E according to Example 5, acoustic wave filter 10D according to Example 4, and acoustic wave filter 10A according to Example 1 in the passbands. As shown in the lower graph in FIG. 7D, insertion loss in the passband of acoustic wave filter 10E according to Example 5 is made lower than that of acoustic wave filter 10D according to Example 4 and acoustic wave filter 10A according to Example 1.

The following describes a decrease in insertion loss in the passband in acoustic wave filter 10E according to Example 5.

Capacitor Cp4 according to Example 5 is thinner than the IDT electrode of parallel-arm resonator p1 and capacitor Cp3 according to Example 4.

Figure 6C:
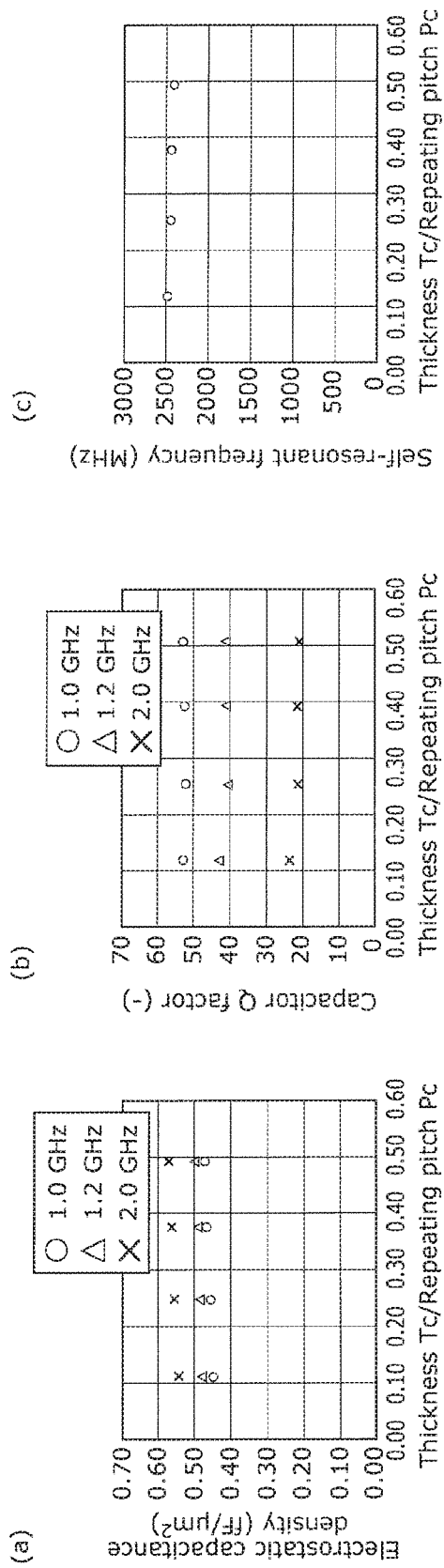
FIG. 6C illustrates graphs showing relations between (i) a proportion of the thickness to an electrode finger pitch of the comb-shaped capacitor and (ii) capacitance per unit area, a capacitor Q factor, and a self-resonant frequency of the comb-shaped capacitor, in the typical example.

FIG. 6C illustrates graphs showing relations between (i) a proportion of the thickness to an electrode finger pitch of the comb-shaped capacitor and (ii) capacitance per unit area (electrostatic capacity density), a capacitor Q factor, and a self-resonant frequency of the comb-shaped capacitor, in the typical example. As illustrated in FIG. 6C, even if the thickness of the electrode fingers of the comb-shaped capacitor is changed, there is no great change in capacitance characteristics such as an electrostatic capacity density, a capacitor Q factor, and a self-resonant frequency. Note that the electrode finger pitch can be shortened by making the electrode fingers thinner. Due to manufacturing restrictions, the upper limit of the thickness of the electrode fingers is about 40% of the electrode finger pitch. Accordingly, the electrode finger pitch can be shortened by making the electrode fingers thinner, and greater advantageous effect of shortening the electrode finger pitch of the comb-shaped capacitor can be achieved.

As in acoustic wave filter 10E according to Example 5, electrode finger pitches Pc1 and Pc2 of capacitor Cp4 are each made shorter than electrode finger pitch Pp1 of the IDT electrode of parallel-arm resonator p1, which makes the capacitor Q factor of capacitor Cp4 greater than that of acoustic wave filter 10A according to Example 1. Accordingly, acoustic wave filter 10E according to Example 5 has less insertion loss in the passband than that of acoustic wave filter 10A according to Example 1.

Furthermore, the electrode fingers of capacitor Cp4 are made thinner than the electrode fingers of the IDT electrode of parallel-arm resonator p1 as in acoustic wave filter 10E according to Example 5, so that the electrode finger pitch of capacitor Cp4 can be made shorter than that of acoustic wave filter 10D according to Example 4, and thus the capacitor Q factor of capacitor Cp4 further increases. Accordingly, acoustic wave filter 10E according to Example 5 has still less insertion loss in the passband than that of acoustic wave filter 10D according to Example 4 (Table 5 shows that insertion loss in the passband is 0.65 dB in Example 5, whereas Table 4 shows that insertion loss in the passband is 0.79 dB in Example 4).

Capacitor Cp4 according to Example 5 has greater electrostatic capacitance per unit area than that of capacitor Cp3 according to Example 4, and thus the acoustic wave filter can be miniaturized. As an example, the area of the comb-shaped electrode of capacitor Cp3 of acoustic wave filter 10D according to Example 4 is 2368 $\mu m^2$, whereas the area of the comb-shaped electrode of capacitor Cp4 of acoustic wave filter 10E according to Example 5 is 893 $\mu m^2$, which shows that acoustic wave filter 10E is further miniaturized.

Furthermore, when electrode finger pitches Pc1 and Pc2 of capacitor Cp4 are each made shorter than electrode finger pitch Pp1 of the IDT electrode of parallel-arm resonator p1, the self-resonant frequency shifts to a higher frequency as indicated by (1) above. From this viewpoint, in Example 5, a frequency at which impedance of capacitor Cp4 has a local maximum value is more readily located in a higher-frequency attenuation band than that of acoustic wave filter 10D according to Example 4.

Note that the electrode finger duty ratio of capacitor Cp4 may be made greater than the electrode finger duty ratio of the IDT electrode, in addition to electrode fingers of capacitor Cp4 being made thinner than electrode fingers of the IDT electrode, as in acoustic wave filter 10E according to Example 5.

Figure 6D:
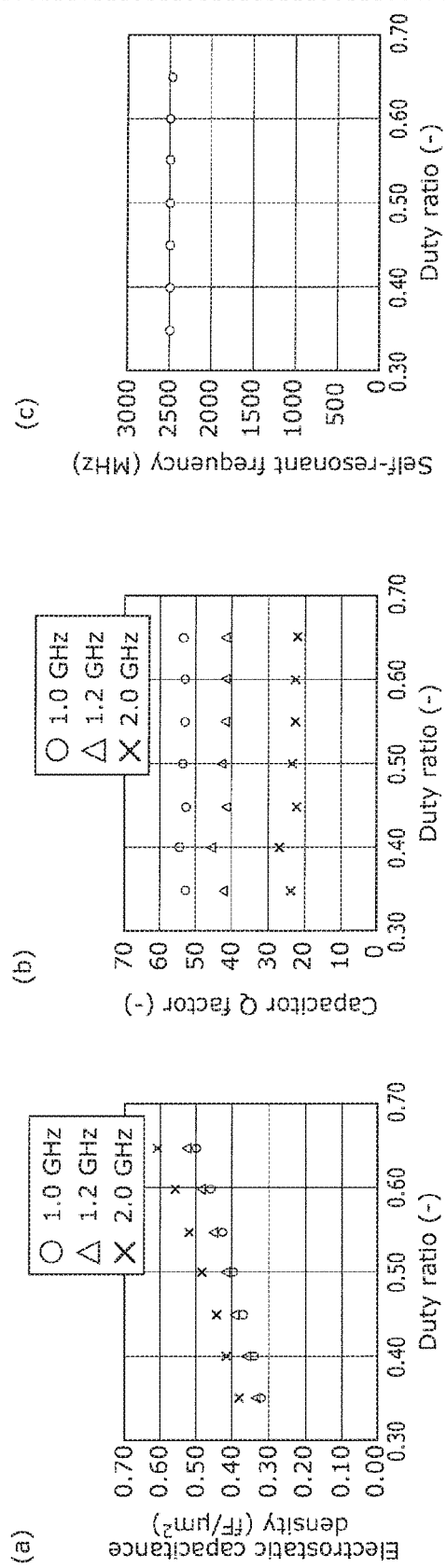
FIG. 6D illustrates graphs showing relations between (i) a duty ratio of the comb-shaped capacitor and (ii) electrostatic capacitance per unit area, a capacitor Q factor, and a self-resonant frequency of the comb-shaped capacitor, in the typical example.

FIG. 6D illustrates graphs showing relations between (i) a duty ratio of the comb-shaped capacitor and (ii) electrostatic capacitance per unit area (electrostatic capacity density), a capacitor Q factor, and a self-resonant frequency of the comb-shaped capacitor, in the typical example. As illustrated in (a) of FIG. 6D, the electrostatic capacitance per unit area of the comb-shaped capacitor can be increased, and thus the size of the acoustic wave filter can be further reduced.

Note that the electrode finger pitch, the thickness, and the duty ratio, for instance, of each of the elements (the series-arm resonators, the parallel-arm resonators, and the capacitors) are not necessarily even, and may be uneven due to variations caused in the manufacturing process, for instance, or due to adjustment of characteristics, for instance. Accordingly, portions of the comb-shaped capacitor electrodes and the IDT electrodes included in the elements may not satisfy the above relations of the electrode finger pitch, the thickness, and the electrode finger duty ratio, for instance. However, the relations of the electrode finger pitch, the thickness, and the electrode finger duty ratio in each of the elements may be substantially satisfied, and may be satisfied based on, for example, an average electrode finger pitch, an average thicknesses, and an average electrode finger duty ratio of a comb-shaped capacitor electrode/an IDT electrode.

1.7 Acoustic Wave Filter According to Example 6

Figure 8A:
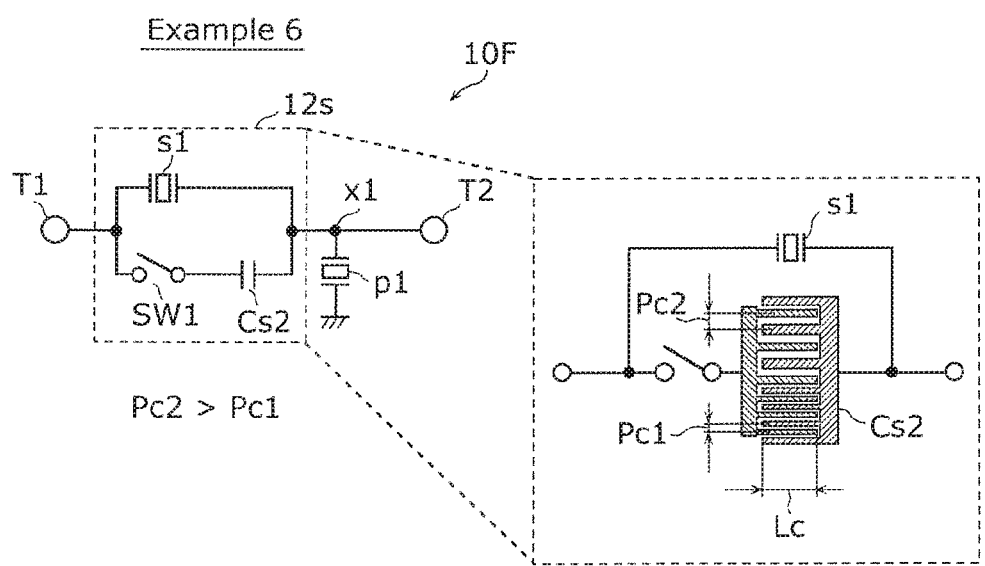
FIG. 8A illustrates a circuit configuration of an acoustic wave filter according to Example 6, and schematically illustrates a comb-shaped capacitor in a series-arm circuit.

FIG. 8A illustrates a circuit configuration of acoustic wave filter 10F according to Example 6, and schematically illustrates capacitor Cs2 in series-arm circuit 12s. Acoustic wave filter 10F illustrated in FIG. 8A includes series-arm circuit 12s, parallel-arm resonator p1, and input/output terminals T1 and T2.

In this example, series-arm circuit 12s is connected to a path that connects input/output terminals T1 and T2, includes series-arm resonator s1, capacitor Cs2, and switch SW1, and is a resonance circuit. Series-arm resonator S1 is a first acoustic wave resonator connected in parallel to a circuit in which capacitor Cs2 and switch SW1 are connected in series to each other. Capacitor Cs2 is a first comb-shaped capacitor, and the circuit in which capacitor Cs2 and switch SW1 are connected in series to each other is included in an impedance circuit.

Capacitor Cs2 includes a comb-shaped electrode that includes a plurality of electrode fingers, as illustrated in the right drawing in FIG. 8A.

Here, when a repeating pitch of the electrode fingers included in capacitor Cs2 is defined as an electrode finger pitch, the comb-shaped electrode of capacitor Cs2 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cs2 has a local minimum value is located outside the passband of acoustic wave filter 10F.

Table 6 shows the circuit parameters and filter characteristics of acoustic wave filter 10F according to Example 6.

TABLE 6

| Acoustic wave filter | | | Reso. freq. fr (MHz) | A-reso. freq. fa (MHz) | Fract. BW BWR (%) | ES cap. (pF) |
|---|---|---|---|---|---|---|
| Ex. 6 | S-arm ckt 12s (SW1: On) | s1 Cs1 SW1 | 835 | 875 | 4.79 | 6.00 1.22 |
| | | | 835 | 864 | 3.47 | 7.22 |
| | S-arm ckt 12s (SW1: Off) | s1 Cs1 SW1 | 835 | 875 | 4.79 | 6.00 1.22 0.20 |
| | | | 835 | 873 | 4.55 | 6.17 |
| | P-arm ckt | p1 | 800 | 836 | 4.50 | 3.00 |

| Comb-shaped cap. | EF pitch Pc (μm) | EF duty ratio | Num of EFs | EF THK Tc (nm) | EF THK Tc/Pc | Crossing width Lc (μm) | Size (μm²) | ES cap. @835 MHz (pF) | ES cap. dens. (fF/μm²) | \|Z\| min (dB) | f\|Z\| min (MHz) |
|---|---|---|---|---|---|---|---|---|---|---|---|
| Ex. 6 | 0.725 | 0.60 | 21 | 150.0 | 0.207 | 20.00 | 893 | 1.22 | 1.36 | 2.39 | 2554 |
| | 0.750 | 0.60 | 40 | 150.0 | 0.200 | 20.00 | | | | | |

Note that in Table 6, |Z|min denotes a local minimum value of impedance of the comb-shaped capacitor, and f|Z|min denotes a frequency at which impedance of the comb-shaped capacitor has a local minimum value.

As shown in Table 6, in acoustic wave filter 10F according to Example 6, capacitor Cs2 has electrode finger pitch Pc1 of 0.725 μm and Pc2 of 0.750 μm. The number of electrode fingers disposed at electrode finger pitch Pc1 is 21, whereas the number of electrode fingers disposed at electrode finger pitch Pc2 is 40. The electrode finger duty ratio of the capacitor is 0.6, the thickness of the comb-shaped electrode is 150 nm, and crossing width Lc is 20 μm.

Electrode finger pitch Pr of the IDT electrode included in series-arm resonator s1 is 2.1 μm, the electrode finger duty ratio of the IDT electrode is 0.5, and the thickness of the IDT electrode is 350 nm. Specifically, the thickness (150 nm) of electrode fingers included in capacitor Cs2 is smaller than the thickness (350 nm) of electrode fingers included in the IDT electrode of series-arm resonator s1.

The circuit configuration illustrated in FIG. 8A can achieve frequency-tunable acoustic wave filter 10F that switches the frequency of an attenuation pole on the passband high-frequency side formed by the antiresonant frequency of series-arm circuit 12s to another frequency by switching between the conducting and non-conducting states of switch SW1.

Figure 8B:
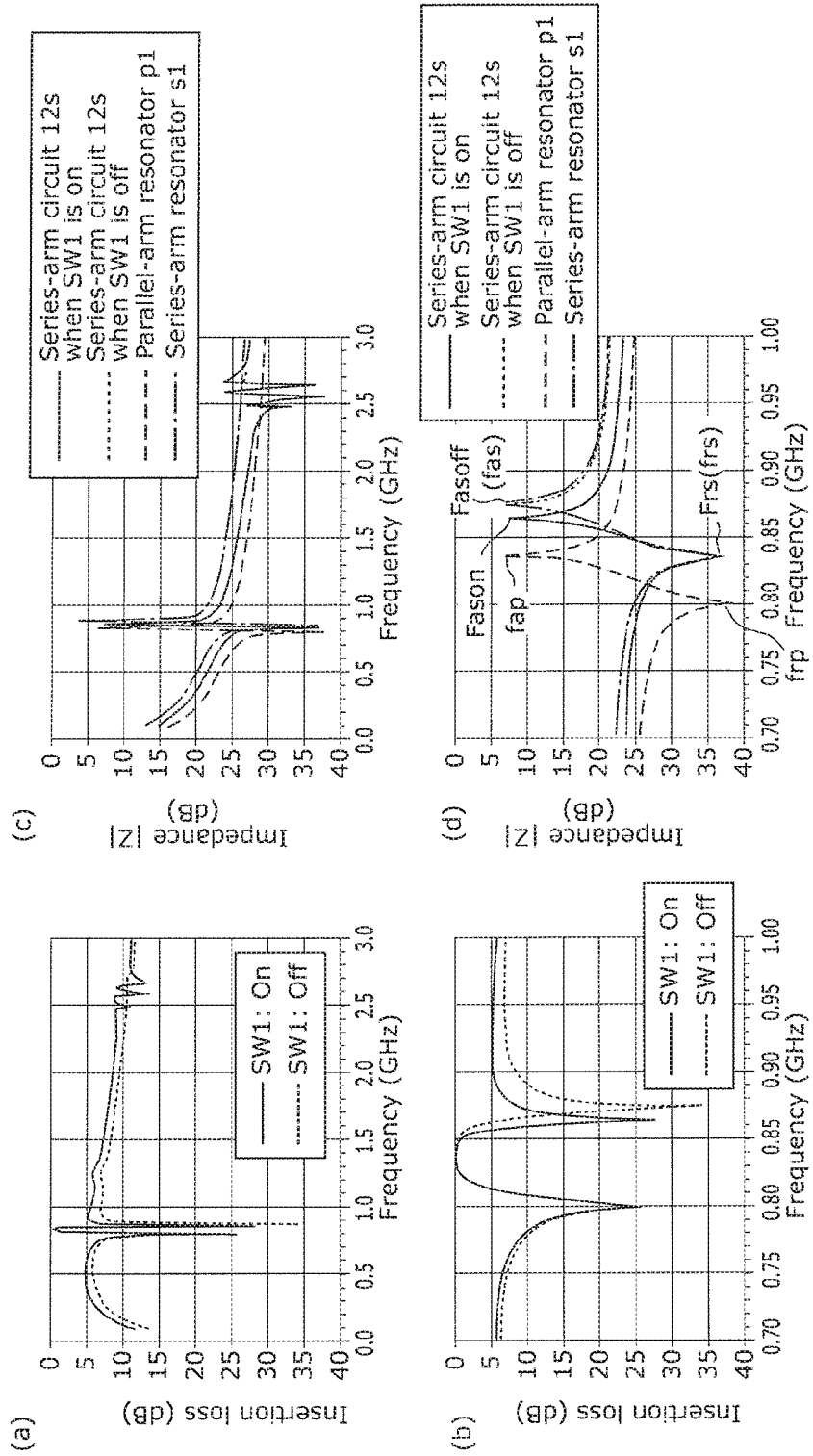
FIG. 8B illustrates graphs showing comparisons of passing characteristics and impedance characteristics of the acoustic wave filter according to Example 6.

FIG. 8B illustrates graphs showing comparisons of passing characteristics of acoustic wave filter 10F according to Example 6. Part (a) of FIG. 8B illustrates passing characteristics of acoustic wave filter 10F according to Example 6 in a wide range, (b) of FIG. 8B illustrates a comparison of passing characteristics of acoustic wave filter 10F according to Example 6 in a narrow range (in and near the passband), (c) of FIG. 8B illustrates impedance characteristics of the circuits and the resonators in a wide range, (d) of FIG. 8B illustrates impedance characteristics of the circuits and the resonators in a narrow range (in and near the passband).

In this example, capacitor Cs2 is added to series-arm resonator s1 when switch SW1 is conducting (on). Accordingly, as illustrated in (d) of FIG. 8B, antiresonant frequency Fason of series-arm circuit 12s when switch SW1 is on shifts to a lower frequency than antiresonant frequency fas of series-arm resonator s1. Accordingly, as illustrated in (b) of FIG. 8B, in acoustic wave filter 10F, the attenuation pole on the passband high-frequency side can be shifted to a higher frequency by switching switch SW1 from the conducting state to the non-conducting state.

Figure 8C:
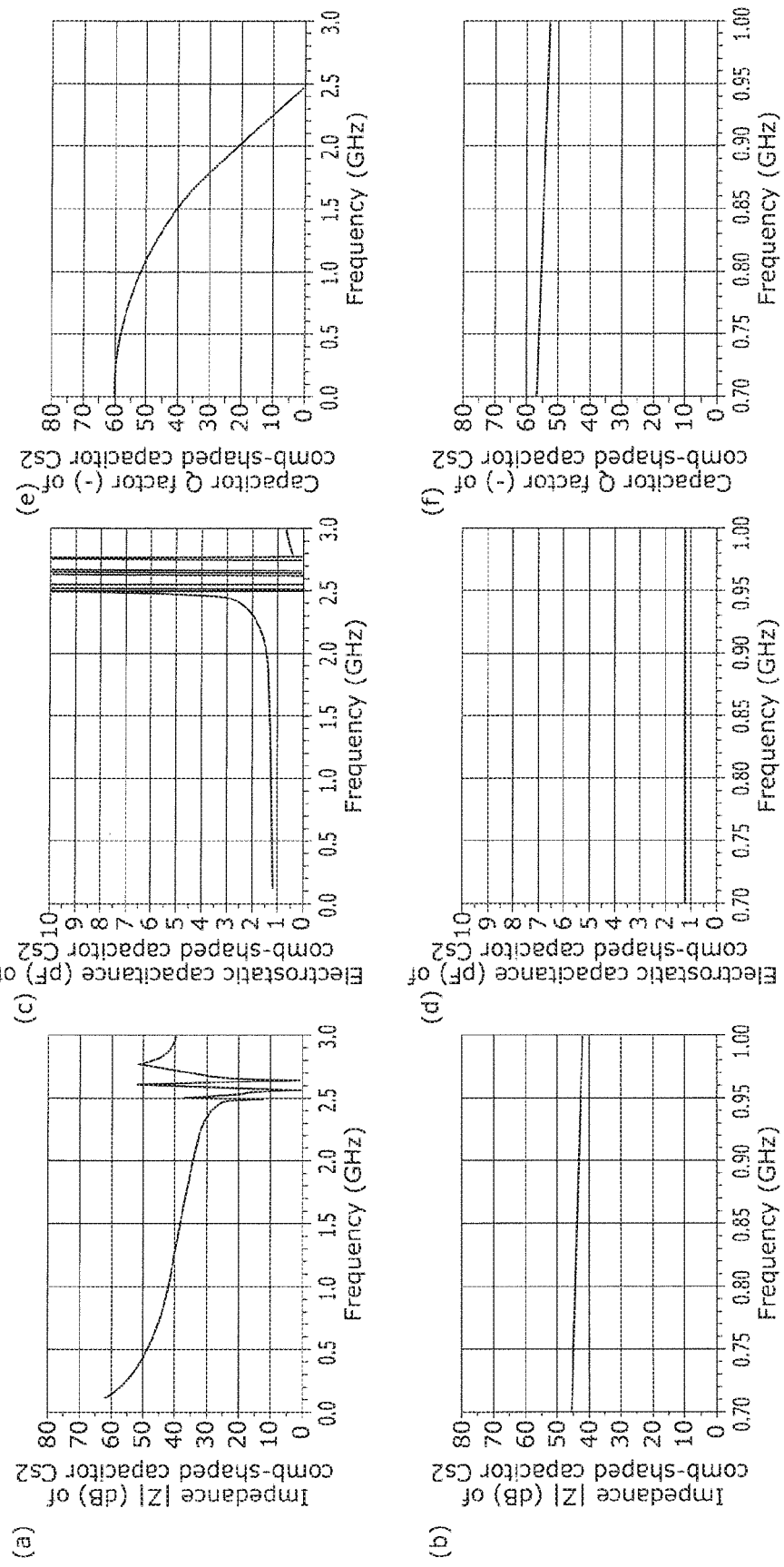
FIG. 8C illustrates graphs showing comb-shaped capacitor characteristics of the acoustic wave filter according to Example 6.

FIG. 8C illustrates graphs showing comb-shaped capacitor characteristics of acoustic wave filter 10F according to Example 6. Part (a) of FIG. 8C illustrates impedance characteristics of capacitor Cs2 in a wide range, (b) of FIG. 8C illustrates impedance characteristics of capacitor Cs2 in a narrow range, (c) of FIG. 8C illustrates electrostatic capacitance characteristics of capacitor Cs2 in a wide range, (d) of FIG. 8C illustrates electrostatic capacitance characteristics of capacitor Cs2 in a narrow range, (e) of FIG. 8C illustrates capacitor Q factor characteristics of capacitor Cs2 in a wide range, and (f) of FIG. 8C illustrates capacitor Q factor characteristics of capacitor Cs2 in a narrow range.

As illustrated in (a) of FIG. 8C and Table 6, a frequency (2554 MHz) at which impedance of capacitor Cs2 has a local minimum value is located in the attenuation band on the passband high-frequency side of acoustic wave filter 10F according to Example 6. Here, the local minimum value of impedance (2.39 dB from Table 6) at a frequency at which impedance of capacitor Cs2 has a local minimum value is greater than that of a frequency-tunable acoustic wave filter that includes a capacitor having a uniform electrode finger pitch. This factor is owing to, for example, capacitor Cs2 in acoustic wave filter 10F according to Example 6 having different electrode finger pitches. Accordingly, when switch SW1 is conducting, a local minimum value of impedance of series-arm circuit 12s decreases (frequencies at each of which impedance has a local minimum value are distributed) in the attenuation band on the passband high-frequency side, and thus frequency-tunable acoustic wave filter 10F can be achieved in which the attenuation in the attenuation band on the passband high-frequency side is increased without increasing insertion loss in the passband.

1.8 Acoustic Wave Filter According to Example 7

Figure 9A:
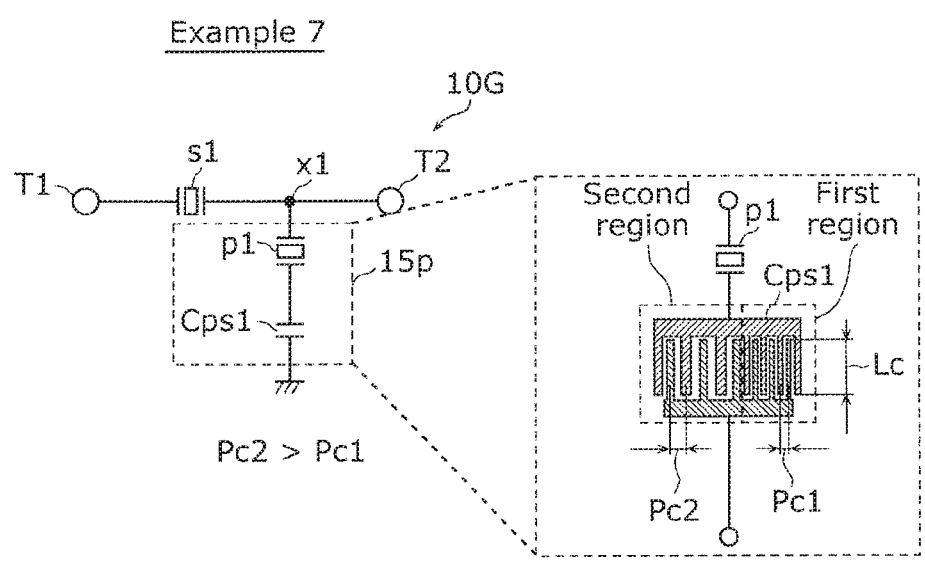
FIG. 9A illustrates a circuit configuration of an acoustic wave filter according to Example 7, and schematically illustrates a comb-shaped capacitor in a parallel-arm circuit.

FIG. 9A illustrates a circuit configuration of acoustic wave filter 10G according to Example 7, and schematically illustrates capacitor Cps1 in parallel-arm circuit 15p. Acoustic wave filter 10G illustrated in FIG. 9A includes series-arm circuit s1, parallel-arm circuit 15p, and input/output terminals T1 and T2.

In this example, series-arm resonator s1 is connected to a path that connects input/output terminals T1 and T2, and is included in a series-arm circuit.

Parallel-arm circuit 15p is connected to node x1 on the path and the ground, and includes parallel-arm resonator p1 and capacitor Cps1. Parallel-arm circuit 15p is a resonance circuit that includes parallel-arm resonator p1 and capacitor Cps1. Parallel-arm resonator p1 is a first acoustic wave resonator connected in series to capacitor Cps1. Capacitor Cps1 is a first comb-shaped capacitor connected in series to parallel-arm resonator p1, and is included in an impedance circuit.

Capacitor Cps1 includes a comb-shaped electrode that includes a plurality of electrode fingers, as illustrated in the right drawing of FIG. 9A.

Here, when a repeating pitch of the electrode fingers included in capacitor Cps1 is defined as an electrode finger pitch, the comb-shaped electrode of capacitor Cps1 includes two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cps1 has a local maximum value is located outside the passband of acoustic wave filter 10G.

Table 7 shows circuit parameters and filter characteristics of acoustic wave filter 10G according to Example 7 and an acoustic wave filter according to Comparative Example 6.

TABLE 7

| | Acoustic wave filter | | Reso. freq. fr (MHz) | A-reso. freq. fa (MHz) | Fract. BW BWR (%) | ES cap. (pF) |
|---|---|---|---|---|---|---|
| Comp. Ex. 6 | S-arm ckt | s1 | 840 | 881 | 4.88 | 3.00 |
| | P-arm ckt | p1 | 800 | 836 | 4.50 | 6.00 |
| | | Cp1 | | | | |
| | | | 816 | 836 | 2.45 | |
| Ex. 7 | S-arm ckt | s1 | 840 | 881 | 4.88 | 3.00 |
| | P-arm ckt 15p | p1 | 800 | 836 | 4.50 | 6.00 |
| | | Cp1 | | | | |
| | | | 816 | 836 | 2.45 | |

| Comb-shaped cap. Cps1 | EF pitch Pc (μm) | EF duty ratio | Num of EFs | EF THK Tc (nm) | EF THK Tc/Pc | Crossing width Lc (μm) | Size (μm²) | ES cap. @816 MHz (pF) | ES cap. dens. (fF/μm²) | \|Z\| max (dB) | f\|Z\| max (MHz) |
|---|---|---|---|---|---|---|---|---|---|---|---|
| Comp. Ex. 6 | 3.00 | 0.60 | 601 | 350.0 | 0.117 | 20.00 | 36036 | 7.33 | 0.20 | 42.33 | 720 |
| Ex. 7 | 3.00 | 0.60 | 321 | 350.0 | 0.117 | 20.00 | 36292 | 7.40 | 0.20 | 41.10 | 702 |
| | 3.05 | 0.60 | 280 | 350.0 | 0.115 | 20.00 | | | | | |

| Filter charcs. | IL @830-850 MHz (dB) | Att @600-800 MHz (dB) |
|---|---|---|
| Comp. Ex. 6 | 0.41 | 2.79 |
| Ex. 7 | 0.41 | 2.90 |

Note that in Table 7, |Z|max denotes a local maximum value of the impedance of the first comb-shaped capacitor, and f|Z|max denotes a frequency at which impedance of the first comb-shaped capacitor has a local maximum value.

The acoustic wave filter according to Comparative Example 6 is different from acoustic wave filter 10G according to Example 7 in only the configuration of the capacitor of the parallel-arm circuit.

As shown in Table 7, in acoustic wave filter 10G according to Example 7, capacitor Cps1 has electrode finger pitch Pc1 of 3.00 μm, and electrode finger pitch Pc2 of 3.05 μm. The number of electrode fingers disposed at electrode finger pitch Pc1 is 321, and the number of electrode fingers disposed at electrode finger pitch Pc2 is 280. In contrast, in the acoustic wave filter according to Comparative Example 6, all the electrode fingers of the capacitor have an electrode finger pitch of 3.00 μm, and the number of electrode fingers disposed at the electrode finger pitch is 601.

The electrode finger duty ratio of the capacitor is 0.6, the thickness of the comb-shaped electrode is 350 nm, and crossing width Lc is 20 μm, which are common to both Example 7 and Comparative Example 6.

In Example 7 and Comparative Example 6, electrode finger pitch Pr of the IDT electrode included in parallel-arm resonator p1 is 2.1 μm, the electrode finger duty ratio of the IDT electrode is 0.5, and the thickness of the IDT electrode is 350 nm.

In this example, as illustrated in FIG. 9A, the comb-shaped electrode is divided into two regions, namely a first region in which electrode fingers are formed at electrode finger pitch Pc1 (the right region of the comb-shaped electrode in FIG. 9A), and a second region in which electrode fingers are formed at electrode finger pitch Pc2 (the left region of the comb-shaped electrode in FIG. 9A).

Note that the number of regions into which the comb-shaped electrode is divided is not limited to two, and the comb-shaped electrode may be more finely divided into three or more regions. For example, the first and second regions may be alternately disposed.

In the above example, the comb-shaped electrode included in capacitor Cps1 has two different electrode finger pitches, but may have three or more different electrode finger pitches.

Note that as shown in Table 7, electrostatic capacitance of parallel-arm circuit 15p of acoustic wave filter 10G according to Example 7 is 7.40 pF, and electrostatic capacitance of the parallel-arm circuit of the acoustic wave filter according to Comparative Example 6 is 7.33 pF, both of which have substantially the same value.

Figure 9B:
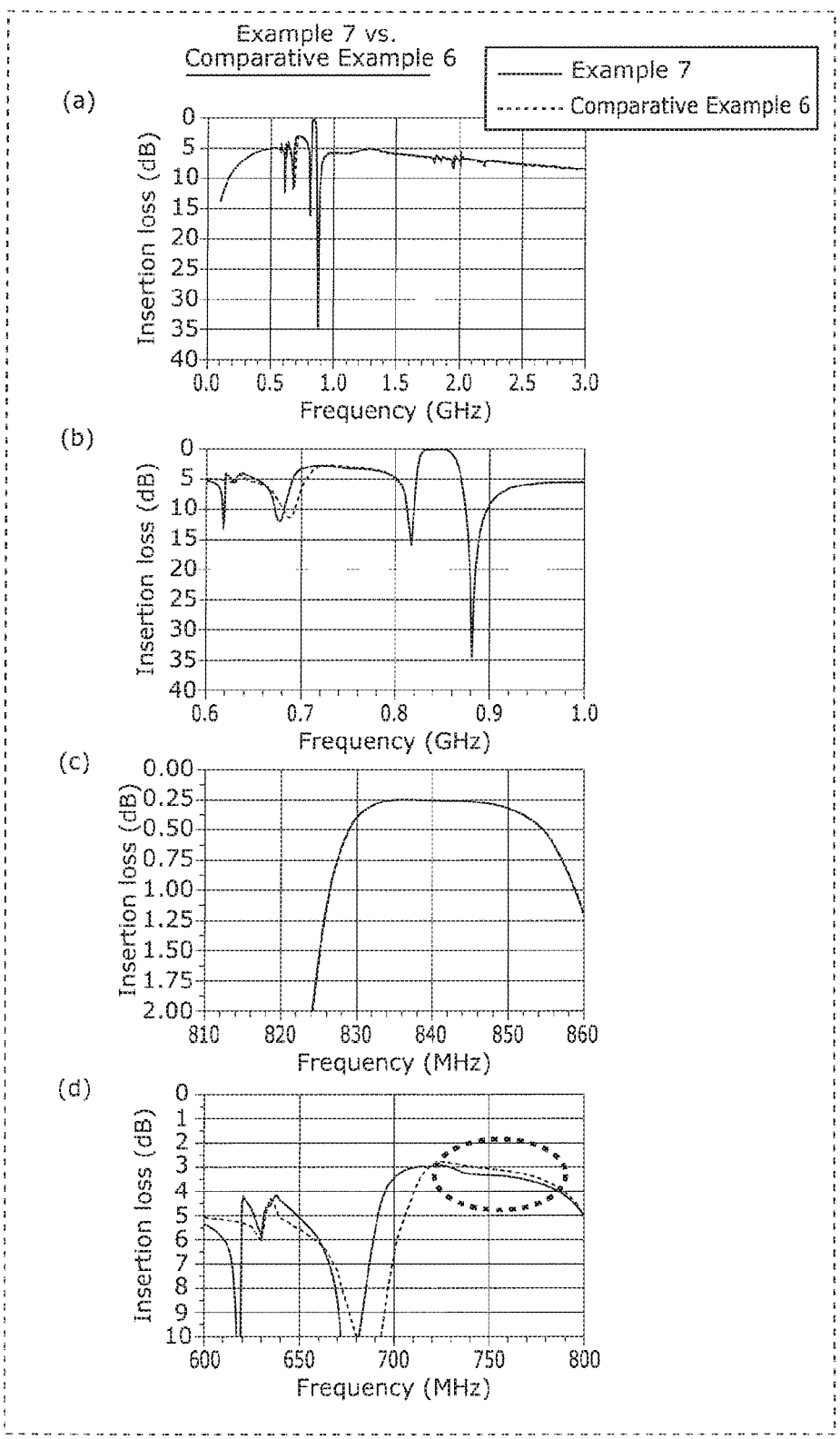
FIG. 9B illustrates graphs showing comparisons of passing characteristics of the acoustic wave filter according to Example 7 and an acoustic wave filter according to Comparative Example 6.

FIG. 9B illustrates graphs showing comparisons of passing characteristics of the acoustic wave filters according to Example 7 and Comparative Example 6. Part (a) of FIG. 9B illustrates a comparison of passing characteristics of the acoustic wave filters according to Example 7 and Comparative Example 6 in a wide range. Part (b) of FIG. 9B illustrates a comparison of passing characteristics of the acoustic wave filters according to Example 7 and Comparative Example 6 in a narrow range (in and near the passbands). Part (c) of FIG. 9B illustrates a comparison of passing characteristics of the acoustic wave filters according to Example 7 and Comparative Example 6 in the passbands. Part (d) of FIG. 9B illustrates a comparison of passing characteristics (attenuation characteristics) of the acoustic wave filters according to Example 7 and Comparative Example 6 in lower-frequency attenuation bands.

As illustrated in (a), (b), and (c) of FIG. 9B, insertion loss in the passband in Example 7 has no great difference from that in Comparative Example 6 (insertion loss in both the examples is 0.41 dB from Table 7). In contrast, as illustrated in (b) and (d) of FIG. 9B, in the attenuation band on the passband low-frequency side (a frequency band from 0.6 to 0.8 GHz), the attenuation of acoustic wave filter 10G according to Example 7 is greater than that of the acoustic wave filter according to Comparative Example 6 (the smallest value of insertion loss is greater in Example 7 than that in Comparative Example 6 in the frequency band from 0.6 to 0.8 GHz) (Table 7 shows 2.90 dB in Example 7 and 2.79 dB in Comparative Example 6). Specifically, acoustic wave filter 10G according to Example 7 has an attenuation that is increased without increasing insertion loss in the passband.

Figure 9C:
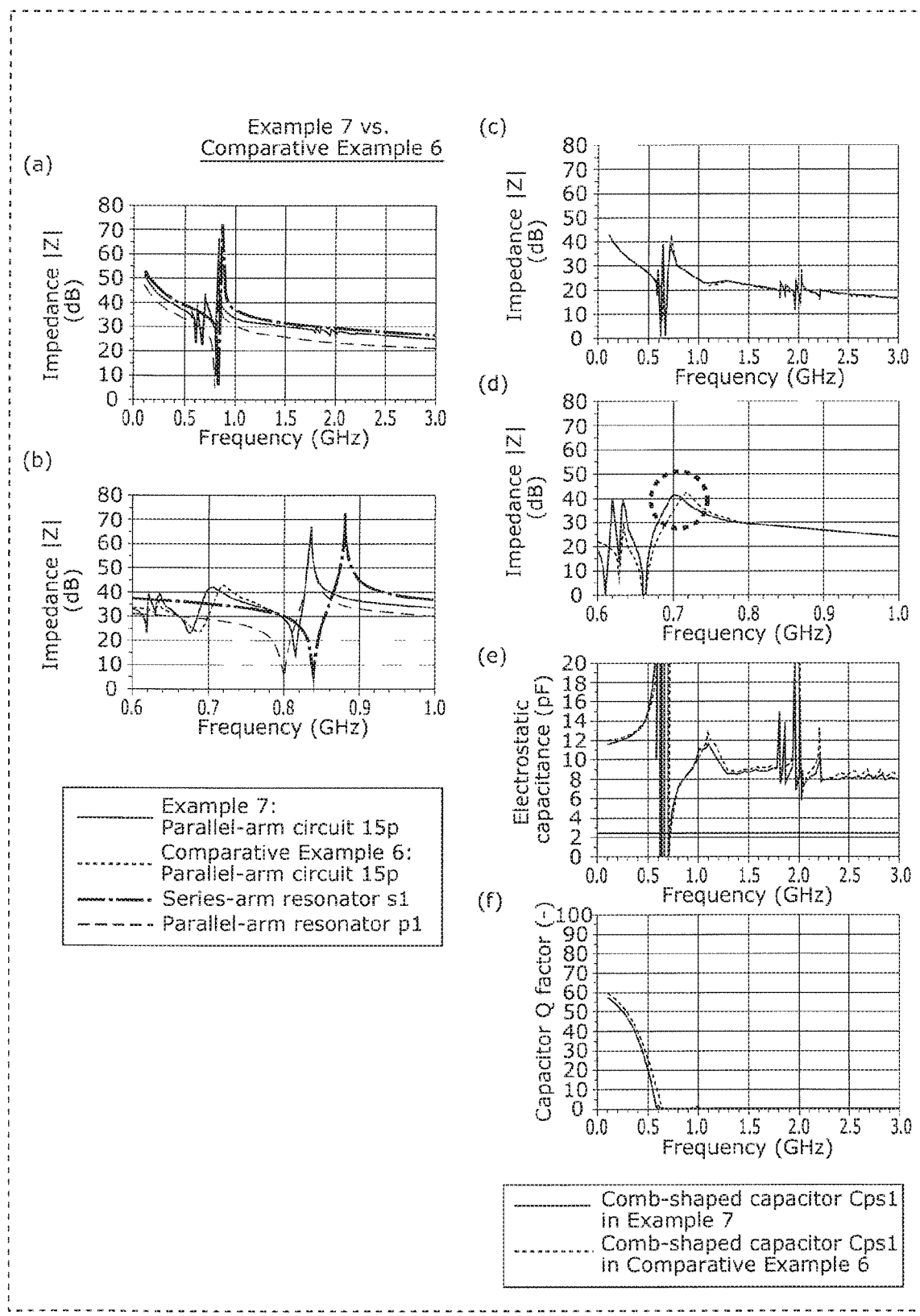
FIG. 9C illustrates comparisons of impedance characteristics and comb-shaped capacitor characteristics of the acoustic wave filters according to Example 7 and Comparative Example 6.

The following describes a factor that contributes to an increase in attenuation in the attenuation band on the passband low-frequency side in acoustic wave filter 10G according to Example 7, with reference to FIG. 9C.

FIG. 9C illustrates comparisons of impedance characteristics and comb-shaped capacitor characteristics of the acoustic wave filters according to Example 7 and Comparative Example 6. Part (a) of FIG. 9C illustrates comparisons of impedance characteristics of the circuits and the resonators according to Example 7 and Comparative Example 6 in a wide range. Part (b) of FIG. 9C illustrates comparisons of impedance characteristics of the circuits and the resonators according to Example 7 and Comparative Example 6 in a narrow range (in and near the passbands). Part (c) of FIG. 9C illustrates a comparison of impedance characteristics of the capacitors according to Example 7 and Comparative Example 6 in a wide range. Part (d) of FIG. 9C illustrates a comparison of impedance characteristics of the capacitors according to Example 7 and Comparative Example 6 in a narrow range (in and near the passbands). Part (e) of FIG. 9C illustrates a comparison of electrostatic capacitance characteristics of the capacitors according to Example 7 and Comparative Example 6 in a wide range. Part (f) of FIG. 9C illustrates a comparison of capacitor Q factors of the capacitors according to Example 7 and Comparative Example 6 in a wide range.

First, as illustrated in (a) and (b) of FIG. 9C, when a capacitor is connected in series to parallel-arm resonator p1, resonant frequency Frp of the parallel-arm circuit shifts to a higher frequency than resonant frequency frp of parallel-arm resonator p1. In the acoustic wave filters according to Example 7 and Comparative Example 6, when the parallel-arm circuit and series-arm resonator s1 form a bandpass filter, antiresonant frequency Fap of the parallel-arm circuit and resonant frequency frs of series-arm resonator s1 are set to values close to each other. Frequencies at and near frequency Frp at which impedance of the parallel-arm resonator is substantially 0 form a lower-frequency stopband. In a frequency range higher than resonant frequency Frp, impedance of the parallel-arm circuit is high at antiresonant frequency Fap, and impedance of series-arm resonator s1 is substantially 0 at and near resonant frequency frs. Accordingly, a signal pass band on a (series-arm) signal path from input/output terminal T1 to input/output terminal T2 is formed at and near antiresonant frequency Fap and resonant frequency frs. Furthermore, if a frequency is increased, and approaches and reaches antiresonant frequency fas of series-arm resonator s1, impedance of series-arm resonator S1 increases, and a high-frequency stopband is formed. Specifically, the acoustic wave filters according to Example 7 and Comparative Example 6 are bandpass filters in each of which a passband is determined by antiresonant frequency Fap and resonant frequency frs, a pole (attenuation pole) on the passband low-frequency side is determined by resonant frequency Frp, and a pole (attenuation pole) on the passband high-frequency side is determined by antiresonant frequency fas.

Next, as illustrated in (c) and (d) of FIG. 9C, frequency f1max (702 MHz) at which impedance of capacitor Cps1 according to Example 7 has a local maximum value is located in the attenuation band on the passband low-frequency side of acoustic wave filter 10G according to Example 7. Similarly, frequency f2max (720 MHz) at which impedance of the capacitor according to Comparative Example 6 has a local maximum value is located in the attenuation band on the passband low-frequency side of the acoustic wave filter according to Comparative Example 6.

Note that as illustrated in (e) and (f) of FIG. 9C, electrostatic capacitance and a capacitor Q factor of the capacitor in the passband in Example 7 have no great difference from those in Comparative Example 6.

Here, as illustrated in (d) of FIG. 9C, a local maximum value of impedance of capacitor Cps1 according to Example 7 at frequency f1max (41.10 dB from Table 7) is smaller than a local maximum value of the impedance of the capacitor according to Comparative Example 6 at frequency f2max (42.33 dB from Table 7). This factor is owing to, for example, capacitor Cps1 in acoustic wave filter 10G according to Example 7 having different electrode finger pitches. Accordingly, a local maximum value of impedance of parallel-arm circuit 15p decreases (frequencies at each of which impedance has a local maximum value are distributed) in the attenuation band on the passband low-frequency side, and thus the amount of a radio frequency signal passing through to parallel-arm circuit 15p at frequency f1max can be increased. Thus, a problem that the attenuation of acoustic wave filter 10G decreases in an attenuation band that is a frequency region in which an impedance peak (a local maximum point of impedance) is located can be solved. As described above, acoustic wave filter 10G can be achieved in which the attenuation in the attenuation band on the passband low-frequency side is increased without increasing insertion loss in the passband.

1.9 Acoustic Wave Filter According to Example 8

Figure 10A:
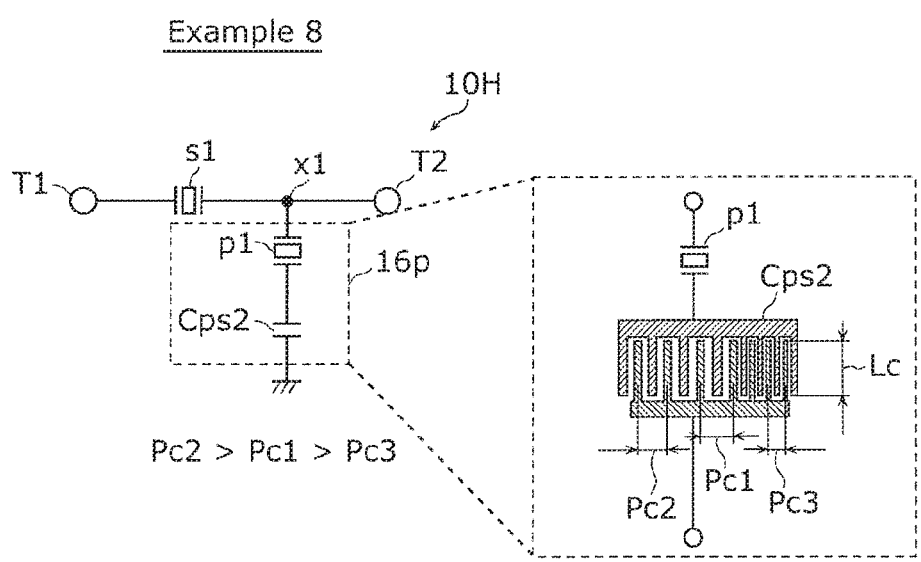
FIG. 10A illustrates a circuit configuration of an acoustic wave filter according to Example 8, and schematically illustrates a comb-shaped capacitor in a parallel-arm circuit.

FIG. 10A illustrates a circuit configuration of acoustic wave filter 10H according to Example 8, and schematically illustrates capacitor Cps2 in parallel-arm circuit 16p. Acoustic wave filter 10H illustrated in FIG. 10A includes series-arm circuit s1, parallel-arm circuit 16p, and input/output terminals T1 and T2.

In this example, series-arm resonator s1 is connected to a path that connects input/output terminals T1 and T2, and is included in a series-arm circuit.

Parallel-arm circuit 16p is connected to node x1 on the path and the ground, and includes parallel-arm resonator p1 and capacitor Cps2. Parallel-arm circuit 16p is a resonance circuit that includes parallel-arm resonator p1 and capacitor Cps2. Parallel-arm resonator p1 is a first acoustic wave resonator connected in series to capacitor Cps2. Capacitor Cps2 is a first comb-shaped capacitor connected in series to parallel-arm resonator p1, and is included in an impedance circuit.

Capacitor Cps2 includes a comb-shaped electrode that includes a plurality of electrode fingers, as illustrated in the right drawing of FIG. 10A.

Here, when a repeating pitch of the electrode fingers included in capacitor Cps2 is defined as an electrode finger pitch, the comb-shaped electrode of capacitor Cps2 has three different electrode finger pitches, namely electrode finger pitch Pc1 (first electrode finger pitch), electrode finger pitch Pc2 (second electrode finger pitch), and electrode finger pitch Pc3. In this example, the relation Pc2>Pc1>Pc3 is satisfied.

Furthermore, a frequency at which impedance of capacitor Cps2 has a local maximum value is located outside the passband of acoustic wave filter 10H.

Table 8 shows circuit parameters and filter characteristics of acoustic wave filter 10H according to Example 8 and an acoustic wave filter according to Comparative Example 7.

TABLE 8

| | Acoustic wave filter | | Reso. freq. fr (MHz) | A-reso. freq. fa (MHz) | Fract. BW BWR (%) | ES cap. (pF) |
|---|---|---|---|---|---|---|
| Comp. Ex. 7 | S-arm ckt | s1 | 840 | 881 | 4.88 | 3.00 |
| | P-arm ckt | p1 Cp1 | 800 | 836 | 4.50 | 6.00 |
| | | | 817 | 836 | 2.33 | |
| Ex. 8 | S-arm ckt | s1 | 840 | 881 | 4.88 | 3.00 |
| | P-arm ckt 11s | p1 Cp1 | 800 | 836 | 4.50 | 6.00 |
| | | | 817 | 836 | 2.33 | |

| Comb-shaped cap. Cps2 | EF pitch Pc (μm) | EF duty ratio | Num of EFs | EF THK Tc (nm) | EF THK Tc/Pc | Crossing width Lc (μm) | Size (μm$^2$) | ES cap. @817 MHz (pF) | ES cap. dens. (fF/μm$^2$) | \|Z\| max (dB) | f\|Z\| max (MHz) |
|---|---|---|---|---|---|---|---|---|---|---|---|
| Comp. Ex. 7 | 1.50 | 0.60 | 401 | 200.0 | 0.133 | 20.00 | 12018 | 6.49 | 0.54 | 42.89 | 2695 |
| Ex. 8 | 1.48 | 0.60 | 100 | 200.0 | 0.135 | 20.00 | 11994 | 6.49 | 0.54 | 37.81 | 2700 |
| | 1.50 | 0.60 | 201 | 200.0 | 0.133 | 20.00 | | | | | |
| | 1.52 | 0.60 | 100 | 200.0 | 0.132 | 20.00 | | | | | |

| Filter charcs. | IL @830-850 MHz (dB) | Att @900-3000 MHz (dB) |
|---|---|---|
| Comp. Ex. 7 | 0.40 | 2.37 |
| Ex. 8 | 0.40 | 3.35 |

Note that in Table 8, |Z|max denotes a local maximum value of the impedance of the first comb-shaped capacitor, and f|Z|max denotes a frequency at which impedance of the first comb-shaped capacitor has a local maximum value.

The acoustic wave filter according to Comparative Example 7 is different from acoustic wave filter 10H according to Example 8 only in the configuration of the capacitor of the parallel-arm circuit.

As shown in Table 8, in acoustic wave filter 10H according to Example 8, capacitor Cps2 has electrode finger pitch Pc3 of 1.48 μm, electrode finger pitch Pc1 of 1.50 μm, and electrode finger pitch Pc2 of 1.52 μm. The number of electrode fingers disposed at electrode finger pitch Pc3 is 100, the number of electrode fingers disposed at electrode finger pitch Pc1 is 201, and the number of electrode fingers disposed at electrode finger pitch Pc2 is 100. In contrast, in the acoustic wave filter according to Comparative Example 7, all the electrode fingers of the capacitor have an electrode finger pitch of 1.50 μm, and the number of electrode fingers disposed at the electrode finger pitch is 401.

The electrode finger duty ratio of the capacitor is 0.6, the thickness of the comb-shaped electrode is 200 nm, and crossing width Lc is 20 μm, which are common to both of Example 8 and Comparative Example 7.

In Example 8 and Comparative Example 7, the IDT electrode included in parallel-arm resonator p1 has electrode finger pitch Pr of 2.1 μm, an electrode finger duty ratio of 0.5, and a thickness of 350 nm.

In this example, as illustrated in FIG. 10A, the comb-shaped electrode is divided into three regions, namely a third region in which electrode fingers are formed at electrode finger pitch Pc3 (the right region of the comb-shaped electrode in FIG. 10A), a first region in which electrode fingers are formed at electrode finger pitch Pc1 (the center region of the comb-shaped electrode in FIG. 10A), and a second region in which electrode fingers are formed at electrode finger pitch Pc2 (the left region of the comb-shaped electrode in FIG. 10A).

Note that the number of regions into which the comb-shaped electrode is divided is not limited to three, and the comb-shaped electrode may be divided into two regions according to electrode finger pitches Pc1 and Pc2, or may be more finely divided into four or more regions according to four or more different electrode finger pitches. For example, the first, second, and third regions may be alternately disposed.

Note that as shown in Table 8, electrostatic capacitance of capacitor Cps2 of acoustic wave filter 10H according to Example 8 is 6.49 pF, and electrostatic capacitance of the capacitor of the acoustic wave filter according to Comparative Example 7 is also 6.49 pF.

Figure 10B:
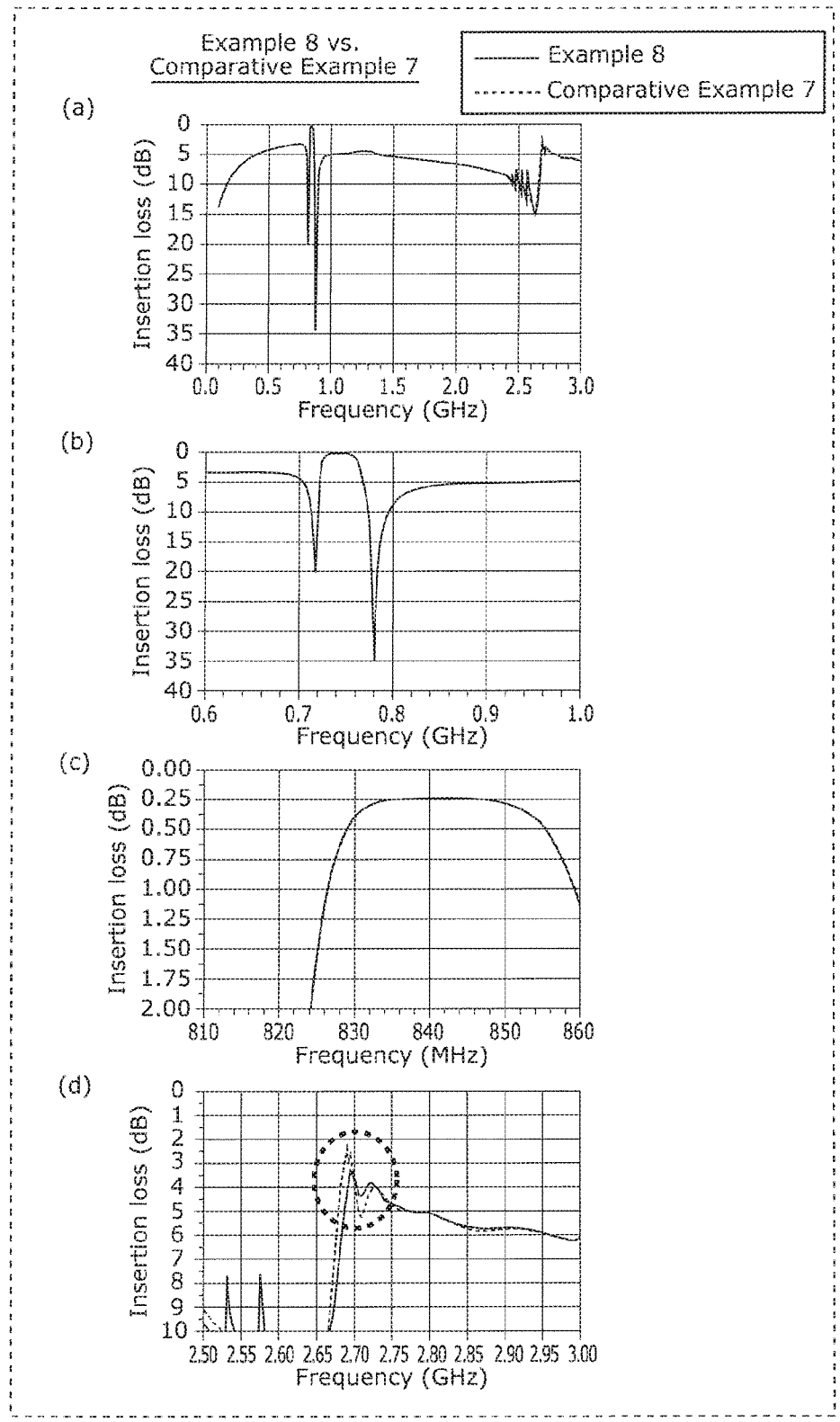
FIG. 10B illustrates graphs showing comparisons of passing characteristics of the acoustic wave filter according to Example 8 and an acoustic wave filter according to Comparative Example 7.

FIG. 10B illustrates graphs showing comparisons of passing characteristics of the acoustic wave filters according to Example 8 and Comparative Example 7. Part (a) of FIG. 10B illustrates a comparison of passing characteristics of the acoustic wave filters according to Example 8 and Comparative Example 7 in a wide range. Part (b) of FIG. 10B illustrates a comparison of passing characteristics of the acoustic wave filters according to Example 8 and Comparative Example 7 in a narrow range (in and near the passbands). Part (c) of FIG. 10B illustrates a comparison of passing characteristics of the acoustic wave filters according to Example 8 and Comparative Example 7 in the passbands. Part (d) of FIG. 10B illustrates a comparison of passing characteristics (attenuation characteristics) of the acoustic wave filters according to Example 8 and Comparative Example 7 in higher-frequency attenuation bands.

As illustrated in (a), (b), and (c) of FIG. 10B, insertion loss in the passband in Example 8 has no great difference from that in Comparative Example 7 (insertion loss in both the examples is 0.40 dB from Table 8). In contrast, as illustrated in (a) and (d) of FIG. 10B, in the attenuation band on the passband high-frequency side (a frequency band from 0.9 to 3.0 GHz), acoustic wave filter 10H according to Example 8 has a greater attenuation than that of the acoustic wave filter according to Comparative Example 7 (the smallest value of insertion loss is greater in Example 8 than that in Comparative Example 7 in the frequency band from 0.9 to 3.0 GHz) (Table 8 shows 3.35 dB in Example 8, and 2.37 dB in Comparative Example 7). Specifically, acoustic wave filter 10H according to Example 8 has an attenuation that is increased without increasing insertion loss in the passband.

Figure 10C:
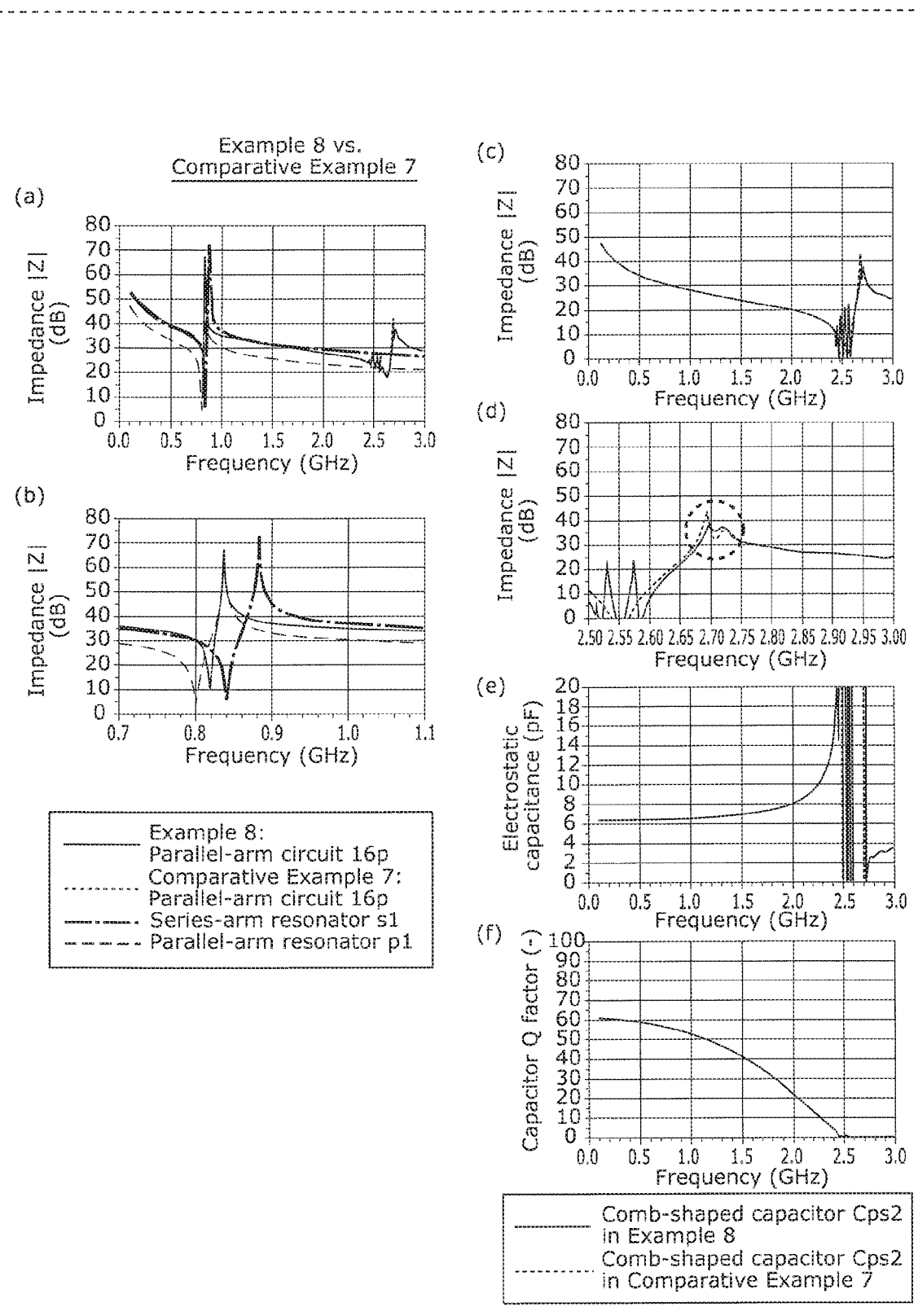
FIG. 10C illustrates comparisons of impedance characteristics and comb-shaped capacitor characteristics of the acoustic wave filters according to Example 8 and Comparative Example 7.

The following describes a factor that contributes to an increase in the attenuation in the attenuation band on the passband high-frequency side in acoustic wave filter 10H according to Example 8, with reference to FIG. 10C.

FIG. 10C illustrates comparisons of impedance characteristics and comb-shaped capacitor characteristics of the acoustic wave filters according to Example 8 and Comparative Example 7. Part (a) of FIG. 10C illustrates comparisons of impedance characteristics of the circuits and the resonators according to Example 8 and Comparative Example 7 in a wide range. Part (b) of FIG. 10C illustrates comparisons of impedance characteristics of the circuits and the resonators according to Example 8 and Comparative Example 7 in a narrow range (in and near the passbands). Part (c) of FIG. 10C illustrates a comparison of impedance characteristics of the capacitors according to Example 8 and Comparative Example 7 in a wide range. Part (d) of FIG. 10C illustrates a comparison of impedance characteristics of the capacitors according to Example 8 and Comparative Example 7 in a narrow range (in and near the passbands). Part (e) of FIG. 10C illustrates a comparison of electrostatic capacitance characteristics of the capacitors according to Example 8 and Comparative Example 7 in a wide range. Part (f) of FIG. 10C illustrates a comparison of capacitor Q factors of the capacitors according to Example 8 and Comparative Example 7 in a wide range.

First, as illustrated in (a) and (b) of FIG. 10C, when a capacitor is connected in series to parallel-arm resonator p1, resonant frequency Frs of the parallel-arm circuit shifts to a higher frequency than resonant frequency frs of parallel-arm resonator p1. In the acoustic wave filters according to Example 8 and Comparative Example 7, when the parallel-arm circuit and series-arm resonator s1 form a bandpass filter, antiresonant frequency Fap of the parallel-arm circuit and resonant frequency frs of series-arm resonator s1 are set to values close to each other. Frequencies at and near frequency Frp at which impedance of the parallel-arm resonator is substantially 0 form a lower-frequency stopband. In a frequency range higher than resonant frequency Frp, impedance of the parallel-arm circuit is high at antiresonant frequency Fap, and impedance of series-arm resonator s1 is substantially 0 at and near resonant frequency frs. Accordingly, a signal pass band on a (series-arm) signal path from input/output terminal T1 to input/output terminal T2 is formed at and near antiresonant frequency Fap and resonant frequency frs. Furthermore, if a frequency is increased, and approaches and reaches antiresonant frequency fas of series-arm resonator s1, impedance of series-arm resonator s1 increases, and a high-frequency stopband is formed. Thus, the acoustic wave filters according to Example 8 and Comparative Example 7 are bandpass filters in each of which a passband is determined by antiresonant frequency Fap and resonant frequency frs, a pole (attenuation pole) on the passband low-frequency side is determined by resonant frequency Frp, and a pole (attenuation pole) on the passband high-frequency side is determined by resonant frequency fas.

Next, as illustrated in (c) and (d) of FIG. 10C, frequency f1max (2700 MHz) at which impedance of capacitor Cps2 according to Example 8 has a local maximum value is located in the attenuation band on the passband high-frequency side of acoustic wave filter 10H according to Example 8. Similarly, frequency f2max (2695 MHz) at which impedance of the capacitor according to Comparative Example 7 has a local maximum value is located in the attenuation band on the passband high-frequency side of the acoustic wave filter according to Comparative Example 7.

Note that as illustrated in (e) and (f) of FIG. 10C, electrostatic capacitance and a capacitor Q factor of the capacitor in the passband in Example 8 have no great difference from those in Comparative Example 7.

Here, as illustrated in (d) of FIG. 10C, a local maximum value of impedance of capacitor Cps2 according to Example 8 at frequency f1max (37.81 dB from Table 8) is smaller than a local maximum value of impedance of the capacitor according to Comparative Example 7 at frequency f2max (42.89 dB from Table 8). This factor is owing to, for example, capacitor Cps2 in acoustic wave filter 10H according to Example 8 having different electrode finger pitches. Accordingly, a local maximum value of impedance of parallel-arm circuit 16p decreases (frequencies at each of which impedance has a local maximum value are distributed) in the attenuation band on the passband high-frequency side, and thus the amount of a radio frequency signal passing through to parallel-arm circuit 16p at frequency f1max can be increased. Thus, a problem that the attenuation of acoustic wave filter 10H decreases in an attenuation band that is a frequency region in which an impedance peak (a local maximum point of impedance) is located can be solved. As described above, acoustic wave filter 10H can be achieved in which the attenuation in the attenuation band on the passband high-frequency side is increased without increasing insertion loss in the passband.

Figure 11:
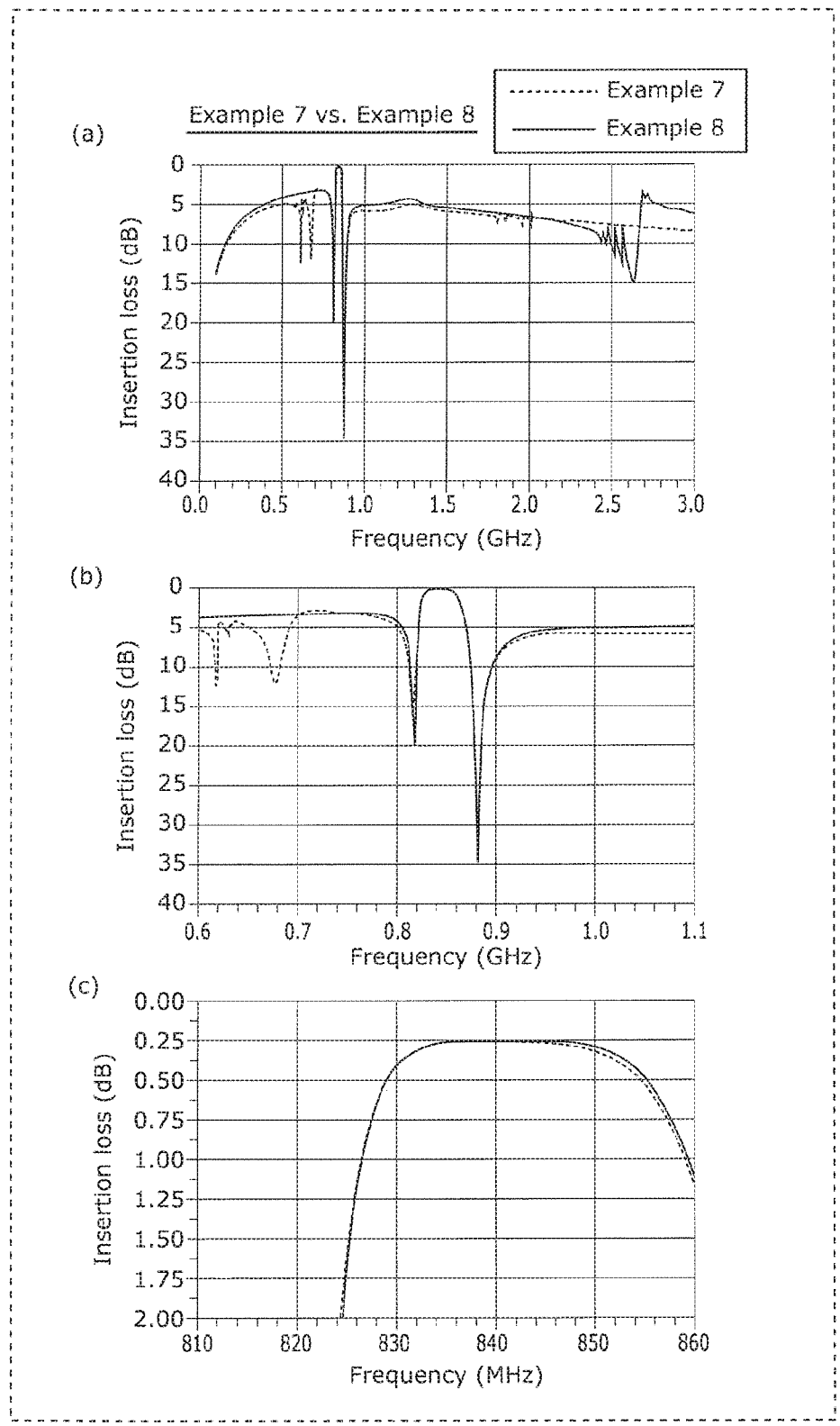
FIG. 11 illustrates graphs showing comparisons of passing characteristics of the acoustic wave filters according to Examples 7 and 8.

FIG. 11 illustrates graphs showing comparisons of passing characteristics of the acoustic wave filters according to Examples 7 and 8. Part (a) of FIG. 11 illustrates a comparison of passing characteristics of the acoustic wave filters according to Examples 7 and 8 in a wide range. Part (b) of FIG. 11 illustrates a comparison of passing characteristics of the acoustic wave filters according to Examples 7 and 8 in a narrow range (in and near the passbands). Part (c) of FIG. 11 illustrates a comparison of passing characteristics of the acoustic wave filters according to Examples 7 and 8 in the passbands.

As illustrated in (c) of FIG. 11, insertion loss in the passband in Example 8 is slightly lower than insertion loss in Example 7. This is due to capacitor Cps2 according to Example 8 having a greater capacitor Q factor than the capacitor Q factor of capacitor Cps1 according to Example 7. In acoustic wave filter 10H according to Example 8, frequency f1max at which impedance of capacitor Cps2 has a local maximum value is located on the passband high-frequency side, and thus the attenuation on the passband high-frequency side (at and around 2.5 GHz) is great. On the other hand, in acoustic wave filter 10G according to Example 7, frequency f1max at which impedance of capacitor Cps1 has a local maximum value is located on the passband low-frequency side, and thus the attenuation in the attenuation band on the passband low-frequency side is great.

1.10 Acoustic Wave Filter According to Examples 9 and 10

Figure 12A:
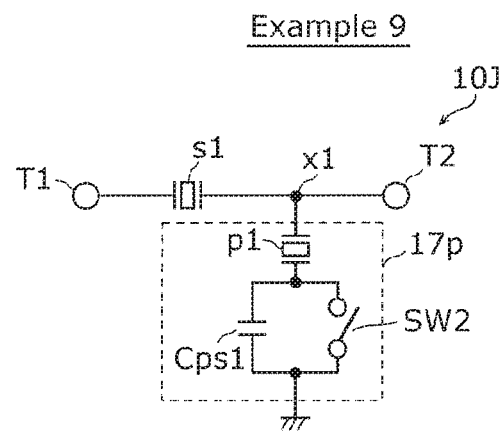
FIG. 12A illustrates a circuit configuration of an acoustic wave filter according to Example 9.

FIG. 12A illustrates a circuit configuration of acoustic wave filter 10J according to Example 9. Acoustic wave filter 10J illustrated in FIG. 12A includes parallel-arm circuit 17p, series-arm resonator s1, and input/output terminals T1 and T2.

In this example, series-arm resonator s1 is connected to a path that connects input/output terminals T1 and T2, and is included in a series-arm circuit.

Parallel-arm circuit 17p is connected to node x1 on the path and the ground, includes parallel-arm resonator p1, capacitor Cps1, and switch SW2, and is a resonance circuit. Parallel-arm resonator p1 is a first acoustic wave resonator connected in series to a circuit in which capacitor Cps1 and switch SW2 are connected in parallel to each other. Capacitor Cps1 is a first comb-shaped capacitor, and a circuit in which capacitor Cps1 and switch SW2 are connected in parallel to each other is included in an impedance circuit.

Capacitor Cps1 includes a comb-shaped electrode that includes a plurality of electrode fingers, as illustrated in the right drawing of FIG. 9A.

Switch SW2 is a first switch connected in parallel to capacitor Cps1.

Here, when a repeating pitch of the electrode fingers included in capacitor Cps1 is defined as an electrode finger pitch, the comb-shaped electrode of capacitor Cps1 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cps1 has a local minimum value is located outside the passband of acoustic wave filter 10J.

Note that acoustic wave filter 10J according to this example is obtained by adding switch SW2 to acoustic wave filter 10G according to Example 7, and the parameters of series-arm resonator s1, parallel-arm resonator p1, and capacitor Cps1 included in acoustic wave filter 10J are the same as those of acoustic wave filter 10G. Note that switch SW2 is an ideal element (that has impedance of 0Ω when conducting and infinite impedance when non-conducting).

Figure 13A:
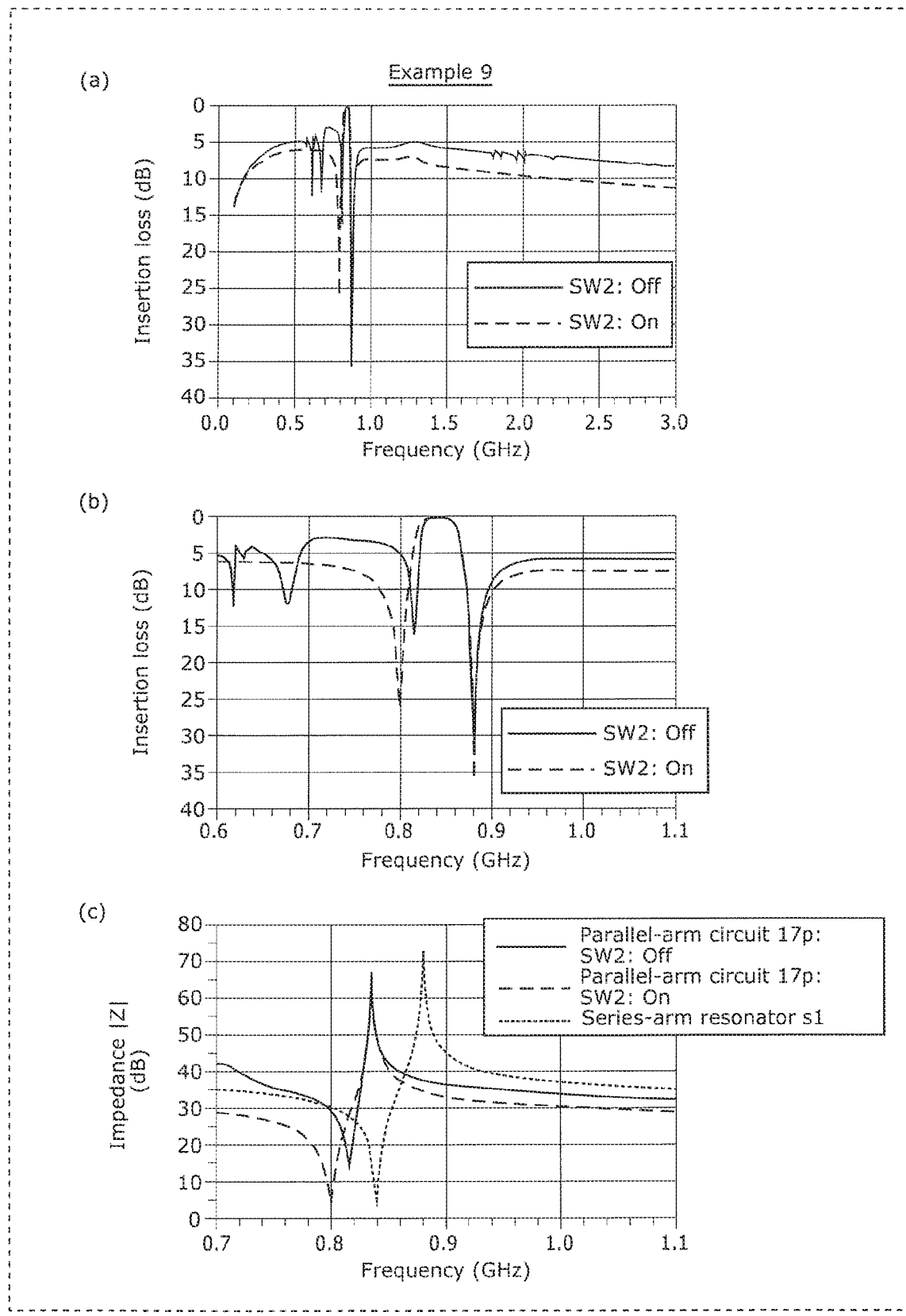
FIG. 13A illustrates graphs showing passing characteristics and impedance characteristic of the acoustic wave filter according to Example 9.

FIG. 13A illustrates graphs showing passing characteristics and impedance characteristic of acoustic wave filter 10J according to Example 9. Part (a) of FIG. 13A illustrates a comparison of passing characteristics of acoustic wave filter 103 according to Example 9 in a wide range when switch SW2 is on and off. Part (b) of FIG. 13A illustrates a comparison of passing characteristics of acoustic wave filter 10J according to Example 9 in a narrow range (in and near the passbands) when switch SW2 is on and off. Part (c) of FIG. 13A illustrates a comparison of impedance characteristics of acoustic wave filter 103 according to Example 9 when switch SW2 is on and off.

As illustrated in FIG. 13A, a lower one of two resonant frequencies of parallel-arm circuit 17p can be switched to another frequency by switching between the conducting and non-conducting states of switch SW2. Accordingly, frequency-tunable acoustic wave filter 103 that can switch (change) the frequency of the attenuation pole on the passband low-frequency side to another frequency, and has improved attenuation characteristics on the passband low-frequency side can be provided.

Figure 12B:
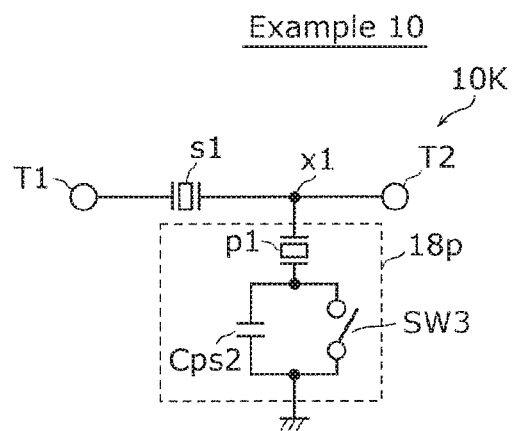
FIG. 12B illustrates a circuit configuration of an acoustic wave filter according to Example 10.

FIG. 12B illustrates a circuit configuration of acoustic wave filter 10K according to Example 10. Acoustic wave filter 10K illustrated in FIG. 12B includes parallel-arm circuit 18p, series-arm resonator s1, and input/output terminals T1 and T2.

In this example, series-arm resonator s1 is connected to a path that connects input/output terminals T1 and T2, and is included in a series-arm circuit.

Parallel-arm circuit 18p is connected to node x1 on the path and the ground, includes parallel-arm resonator p1, capacitor Cps2, and switch SW3, and is a resonance circuit. Parallel-arm resonator p1 is a first acoustic wave resonator connected in series to the circuit in which capacitor Cps3 and switch SW3 are connected in parallel to each other. Capacitor Cps2 is a first comb-shaped capacitor, and the circuit in which capacitor Cps2 and switch SW3 are connected in parallel to each other is included in an impedance circuit.

Capacitor Cps2 includes a comb-shaped electrode that includes a plurality of electrode fingers, as illustrated in the right drawing of FIG. 10A.

Switch SW3 is a first switch connected in parallel to capacitor Cps2.

Here, when a repeating pitch of the electrode fingers included in capacitor Cps2 is defined as an electrode finger pitch, the comb-shaped electrode of capacitor Cps2 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Cps2 has a local minimum value is located outside the passband of acoustic wave filter 10K.

Note that acoustic wave filter 10K according to this example is obtained by adding switch SW3 to acoustic wave filter 10H according to Example 8, and the parameters of series-arm resonator s1, parallel-arm resonator p1, and capacitor Cps2 included in acoustic wave filter 10K are the same as those of acoustic wave filter 10H. Note that switch SW3 is an ideal element (that has impedance of 0Ω when conducting and infinite impedance when non-conducting).

Figure 13B:
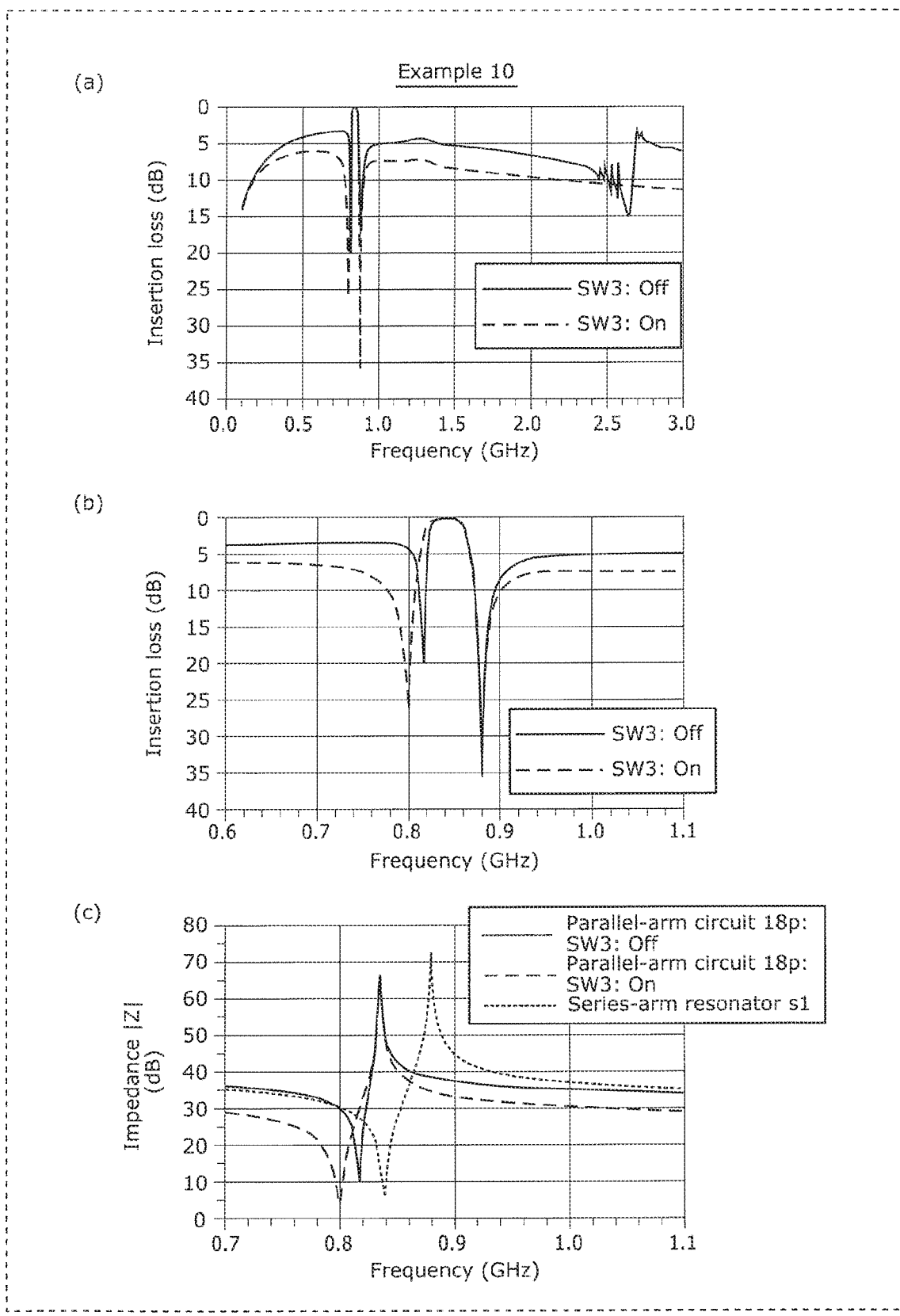
FIG. 13B illustrates graphs showing passing characteristics and impedance characteristics of the acoustic wave filter according to Example 10.

FIG. 13B illustrates graphs showing passing characteristics and impedance characteristics of acoustic wave filter 10K according to Example 10. Part (a) of FIG. 13B illustrates a comparison of passing characteristics of acoustic wave filter 10K according to Example 10 in a wide range when switch SW3 is on and off. Part (b) of FIG. 13B illustrates a comparison of passing characteristics of acoustic wave filter 10K according to Example 10 in a narrow range (in and near the passband) when switch SW3 is on and off. Part (c) of FIG. 13B illustrates a comparison of impedance characteristics of acoustic wave filter 10K according to Example 10 when switch SW3 is on and off.

As illustrated in FIG. 13B, a lower one of two resonant frequencies of parallel-arm circuit 18p can be switched to another frequency by switching between the conducting and non-conducting states of switch SW3. Accordingly, frequency-tunable acoustic wave filter 10K that can switch (change) the frequency of the attenuation pole on the passband low-frequency side to another frequency, and has improved attenuation characteristics on the passband low-frequency side can be provided.

Figure 14A:
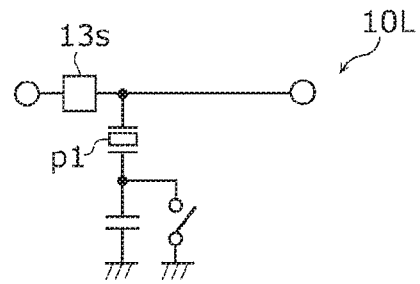
FIG. 14A illustrates a circuit configuration of an acoustic wave filter according to Variation 1 of an embodiment.

FIG. 14A illustrates a circuit configuration of acoustic wave filter 10L according to Variation 1 of the embodiment. Acoustic wave filter 10L illustrated in FIG. 14A includes series-arm circuit 13s and a parallel-arm circuit. The parallel-arm circuit includes parallel-arm resonator p1 and an impedance circuit that are connected in series to each other. The impedance circuit is a first switch circuit that includes a switch and a capacitor that are connected in parallel to each other. The resonant frequency of the parallel-arm circuit is switched to another frequency by switching between on and off of the switch. Acoustic wave filter 10L according to Variation 1 is different from acoustic wave filter 10J according to Example 9 in that series-arm resonator s1 is replaced with series-arm circuit 13s. This configuration also allows the resonant frequency of the parallel-arm circuit to be switched to another frequency by switching between the conducting and non-conducting states of the switch. Accordingly, frequency-tunable acoustic wave filter 10L that can switch (change) the frequency of the attenuation pole on the passband low-frequency side to another frequency, and has improved attenuation characteristics on the passband low-frequency side can be provided.

Figure 14B:
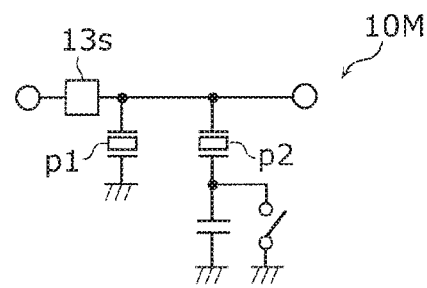
FIG. 14B illustrates a circuit configuration of an acoustic wave filter according to Variation 2 of the embodiment.

FIG. 14B illustrates a circuit configuration of acoustic wave filter 10M according to Variation 2 of the embodiment. Acoustic wave filter 10M illustrated in FIG. 14B includes series-arm circuit 13s and a parallel-arm circuit. The parallel-arm circuit includes parallel-arm resonator p1, and parallel-arm resonator p2 and an impedance circuit that are connected in series to each other. The impedance circuit is a first switch circuit that includes a switch and a capacitor that are connected in parallel to each other. Parallel-arm resonator p1 is a second acoustic wave resonator, and parallel-arm resonator p2 is a first acoustic wave resonator. The capacitor is a first comb-shaped capacitor connected in parallel or series to parallel-arm resonator p2, and includes a comb-shaped electrode that includes a plurality of electrode fingers as illustrated in the right drawing of FIG. 9A.

The resonant frequency of parallel-arm resonator p2 is lower than the resonant frequency of parallel-arm resonator p1, and the antiresonant frequency of parallel-arm resonator p2 is lower than the antiresonant frequency of parallel-arm resonator p1. According to this configuration, the parallel-arm circuit has two resonant frequencies and two antiresonant frequencies, and a lower one of the two resonant frequencies and a lower one of the two antiresonant frequencies are both switched to other frequencies by switching between the conducting and non-conducting states of the switch. Accordingly, frequency-tunable acoustic wave filter 10M that can switch (change) both the frequency at the passband low-frequency edge and the frequency of the attenuation pole on the passband low-frequency side to other frequencies, and has low insertion loss can be provided. Furthermore, the attenuation can be increased when the switch is non-conducting.

Note that in acoustic wave filter 10M according to Variation 2, the resonant frequency of parallel-arm resonator p2 may be higher than the resonant frequency of parallel-arm resonator p1, and the antiresonant frequency of parallel-arm resonator p2 may be higher than the antiresonant frequency of parallel-arm resonator p1. According to this configuration, the parallel-arm circuit has two resonant frequencies and two antiresonant frequencies, and a higher one of the two resonant frequencies and a lower one of the two antiresonant frequencies are both switched to other frequencies by switching between the conducting and non-conducting states of the switch. Accordingly, a frequency-tunable acoustic wave filter that can switch (change) both the frequency at the passband high-frequency edge and the frequency of the attenuation pole on the passband high-frequency side to other frequencies, and has low insertion loss can be provided. Furthermore, the attenuation can be increased when the switch is non-conducting.

Thus, in acoustic wave filter 10M according to Variation 2, the resonant frequency of parallel-arm resonator p2 may be different from the resonant frequency of parallel-arm resonator p1, and the antiresonant frequency of parallel-arm resonator p2 may be different from the antiresonant frequency of parallel-arm resonator p1.

Figure 14C:
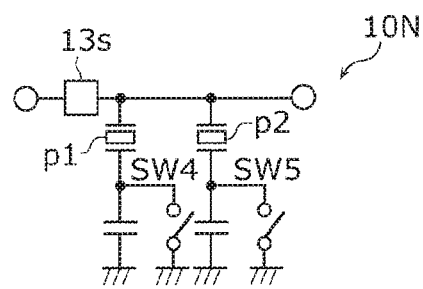
FIG. 14C illustrates a circuit configuration of an acoustic wave filter according to Variation 3 of the embodiment.

FIG. 14C illustrates a circuit configuration of acoustic wave filter 10N according to Variation 3 of the embodiment. Acoustic wave filter 10N illustrated in FIG. 14C includes series-arm circuit 13s and a parallel-arm circuit. The parallel-arm circuit includes parallel-arm resonators p1 and p2, a first switch circuit, and a second switch circuit. The first switch circuit includes switch SW4 (first switch) and a first capacitor connected in parallel to each other. The second switch circuit includes switch SW5 (second switch) and a second capacitor connected in parallel to each other. Parallel-arm resonator p1 is a first acoustic wave resonator, parallel-arm resonator p2 is a second acoustic wave resonator, parallel-arm resonator p1 and the first switch circuit are connected in series to each other, and parallel-arm resonator p2 and the second switch circuit are connected in series to each other. The first capacitor is a first comb-shaped capacitor, the second capacitor is a second comb-shaped capacitor, and the first capacitor and the second capacitor each include a comb-shaped electrode that includes a plurality of electrode fingers, as illustrated in the right drawing of FIG. 9A.

The resonant frequency of parallel-arm resonator p2 is higher than the resonant frequency of parallel-arm resonator p1, and the antiresonant frequency of parallel-arm resonator p2 is higher than the antiresonant frequency of parallel-arm resonator p1.

Furthermore, a frequency at which impedance of the second capacitor has a local maximum value is located outside the passband of acoustic wave filter 10N.

In the above configuration, the comb-shaped electrode has (i) at least two different electrode finger pitches, (ii) at least two different electrode finger duty ratios, or (iii) at least two different electrode finger pitches and at least two different electrode finger duty ratios.

Accordingly, a lower one of the two resonant frequencies of the parallel-arm circuit and a lower one of the two antiresonant frequencies of the parallel-arm circuit can be both switched to other frequencies by switching between the conducting and non-conducting states of switch SW4. A higher one of the two resonant frequencies of the parallel-arm circuit and a lower one of the two antiresonant frequencies of the parallel-arm circuit can be both switched to other frequencies by switching between the conducting and non-conducting states of switch SW5. Accordingly, frequency-tunable acoustic wave filter 10N having a passband width and an attenuation band width that can be changed by independently controlling switching between the conducting and non-conducting states of switch SW4 and switching between the conducting and non-conducting states of switch SW5 can be provided. Furthermore, the attenuation can be increased when at least one of switches SW4 and SW5 is non-conducting.

Figure 14D:
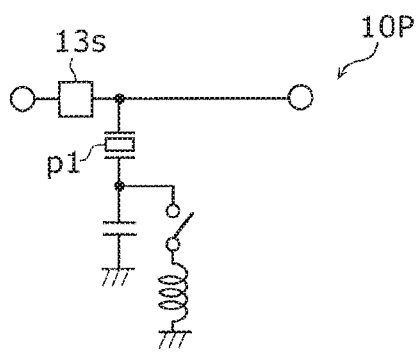
FIG. 14D illustrates a circuit configuration of an acoustic wave filter according to Variation 4 of the embodiment.

FIG. 14D illustrates a circuit configuration of acoustic wave filter 10P according to Variation 4 of the embodiment. Acoustic wave filter 10P illustrated in FIG. 14D includes series-arm circuit 13s and a parallel-arm circuit. The parallel-arm circuit includes parallel-arm resonator p1 and an impedance circuit that are connected in series to each other. The impedance circuit is a first switch circuit that has a circuit configuration in which a capacitor is connected in parallel to a series circuit of a switch and an inductor. The resonant frequency of the parallel-arm circuit is switched to another frequency by switching between on and off of the switch. Accordingly, the configuration of acoustic wave filter 10P according to this variation also provides frequency-tunable acoustic wave filter 10P that can switch (change) the frequency of the attenuation pole on the passband low-frequency side to another frequency, and has improved attenuation characteristics on the passband low-frequency side.

Figure 14E:
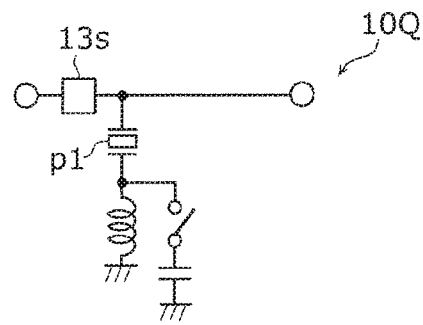
FIG. 14E illustrates a circuit configuration of an acoustic wave filter according to Variation 5 of the embodiment.

FIG. 14E illustrates a circuit configuration of acoustic wave filter 10Q according to Variation 5 of the embodiment. Acoustic wave filter 10Q illustrated in FIG. 14E includes series-arm circuit 13s and a parallel-arm circuit. The parallel-arm circuit includes parallel-arm resonator p1 and an impedance circuit that are connected in series to each other. The impedance circuit is a first switch circuit that has a circuit configuration in which an inductor is connected in parallel to a series circuit of a switch and a capacitor. The resonant frequency of the parallel-arm circuit is switched to another frequency by switching between on and off of the switch. Accordingly, the configuration of acoustic wave filter 10Q according to this variation also provides frequency-tunable acoustic wave filter 10Q that can switch (change) the frequency of the attenuation pole on the passband low-frequency side to another frequency, and has improved attenuation characteristics on the passband low-frequency side.

Figure 14F:
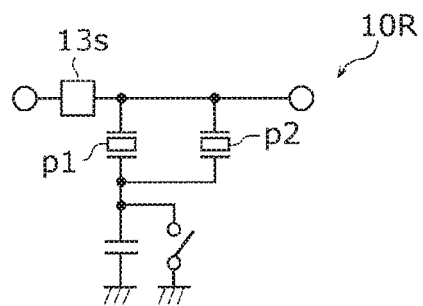
FIG. 14F illustrates a circuit configuration of an acoustic wave filter according to Variation 6 of the embodiment.

FIG. 14F illustrates a circuit configuration of acoustic wave filter 10R according to Variation 6 of the embodiment. Acoustic wave filter 10R illustrated in FIG. 14F includes series-arm circuit 13s and a parallel-arm circuit. The parallel-arm circuit has a configuration in which an impedance circuit is connected in series to a circuit in which parallel-arm resonators p1 and p2 are connected in parallel to each other. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. The impedance circuit includes a switch and a capacitor connected in parallel to each other. The parallel-arm circuit has two resonant frequencies and two antiresonant frequencies, and the two resonant frequencies of the parallel-arm circuit are switched to other frequencies by switching between on and off of the switch. Accordingly, frequency-tunable acoustic wave filter 10R that can switch (change) both the frequency at the passband low-frequency edge and the frequency of the attenuation pole on the passband low-frequency side to other frequencies, and has low insertion loss can be provided. Furthermore, the attenuation can be increased when the switch is non-conducting.

1.11 Acoustic Wave Filter According to Example 11

Figure 15A:
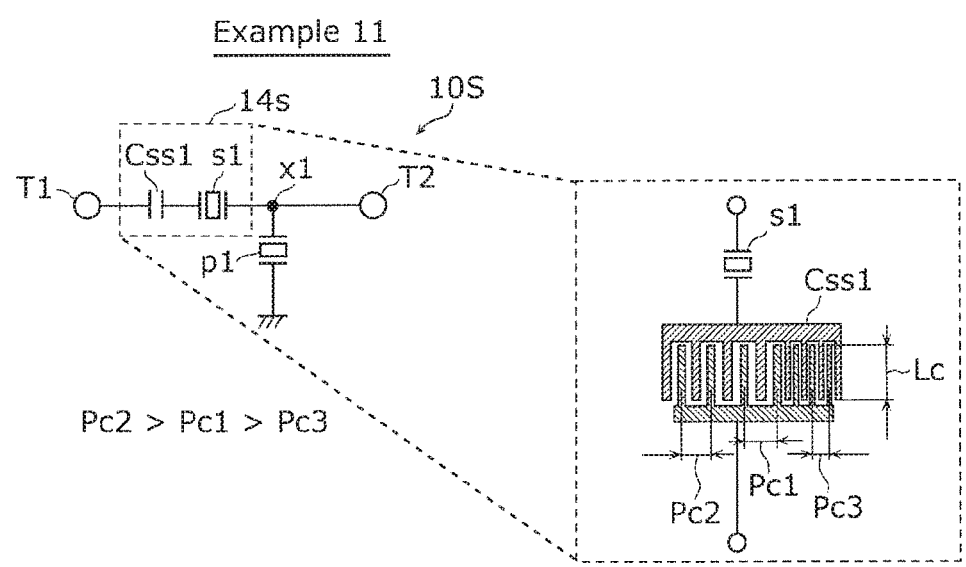
FIG. 15A illustrates a circuit configuration of an acoustic wave filter according to Example 11, and schematically illustrates a comb-shaped capacitor in a series-arm circuit.

FIG. 15A illustrates a circuit configuration of acoustic wave filter 10S according to Example 11, and schematically illustrates capacitor Css1 in series-arm circuit 14s. Acoustic wave filter 10S illustrated in FIG. 15A includes series-arm circuit 14s, parallel-arm resonator p1, and input/output terminals T1 and T2.

In this example, series-arm circuit 14s is connected to a path that connects input/output terminals T1 and T2, and includes series-arm resonator s1 and capacitor Css1. Series-arm circuit 14s is a resonance circuit that includes series-arm resonator s1 and capacitor Cs s1. Series-arm resonator s1 is a first acoustic wave resonator connected in series to capacitor Cs s1. Capacitor Cs s1 is a first comb-shaped capacitor connected in series to series-arm resonator s1, and is included in an impedance circuit.

Capacitor Cs s1 includes a comb-shaped electrode that includes a plurality of electrode fingers, as illustrated in the right drawing of FIG. 15A.

Here, when a repeating pitch of the electrode fingers included in capacitor Cs s1 is defined as an electrode finger pitch, the comb-shaped electrode of capacitor Cs s1 has three different electrode finger pitches, namely electrode finger pitch Pc1 (first electrode finger pitch), electrode finger pitch Pc2 (second electrode finger pitch), and electrode finger pitch Pc3. In this example, the relation Pc2>Pc1>Pc3 is satisfied.

Furthermore, a frequency at which impedance of capacitor Cs s1 has a local minimum value (a frequency at which conductance is at its peak) is located outside the passband of acoustic wave filter 10S.

Table 9 shows circuit parameters and filter characteristics of acoustic wave filter 10S according to Example 11 and an acoustic wave filter according to Comparative Example 8.

finger pitch Pc1 is 201, and the number of electrode fingers disposed at electrode finger pitch Pc2 is 100. In contrast, in the acoustic wave filter according to Comparative Example 8, all the electrode fingers of the capacitor have an electrode finger pitch of 1.50 µm, and the number of electrode fingers disposed at the electrode finger pitch is 401.

The electrode finger duty ratio of the capacitor is 0.6, the thickness of the comb-shaped electrode is 200 nm, and crossing width Lc is 20 µm, which are common to both Example 11 and Comparative Example 8.

In Example 11 and Comparative Example 8, electrode finger pitch Pr of the IDT electrode included in series-arm resonator s1 is 2.1 µm, the electrode finger duty ratio of the IDT electrode is 0.5, and the thickness of the IDT electrode is 350 nm.

In this example, as illustrated in FIG. 15A, the comb-shaped electrode is divided into three regions, namely a third region in which electrode fingers are formed at electrode finger pitch Pc3 (the right region of the comb-shaped electrode in FIG. 15A), a first region in which electrode fingers are formed at electrode finger pitch Pc1 (the center region of the comb-shaped electrode in FIG. 15A), and a second region in which electrode fingers are formed at

TABLE 9

| Acoustic wave filter | | | Reso. freq. fr (MHz) | A-reso. freq. fa (MHz) | Fract. BW BWR (%) | ES cap. (pF) |
|---|---|---|---|---|---|---|
| Comp. Ex. 8 | S-arm ckt | s1 Cs1 | 835 | 875 | 4.79 | 3.00 |
| | | | 848 | 875 | 3.18 | |
| | P-arm ckt | p1 | 800 | 836 | 4.50 | 6.00 |
| Ex. 11 | S-arm ckt 14s | s1 Cs1 | 835 | 875 | 4.79 | 3.00 |
| | | | 848 | 875 | 3.18 | |
| | P-arm ckt | p1 | 800 | 836 | 4.50 | 6.00 |

| Comb-shaped cap. Cs s1 | EF pitch Pc (µm) | EF duty ratio | Num of EFs | EF THK Tc (nm) | EF THK Tc/Pc | Crossing width Lc (µm) | Size (µm²) | ES cap. @848 MHz (pF) | ES cap. dens. (fF/µm²) | \|Z\| min (dB) | f\|Z\| min (MHz) |
|---|---|---|---|---|---|---|---|---|---|---|---|
| Comp. Ex. 8 | 1.50 | 0.60 | 401 | 200.0 | 0.133 | 20.00 | 12018 | 6.50 | 0.54 | −22.28 | 2553 |
| Ex. 11 | 1.48 | 0.60 | 100 | 200.0 | 0.135 | 20.00 | 11994 | 6.50 | 0.54 | −16.28 | 2553 |
| | 1.50 | 0.60 | 201 | 200.0 | 0.133 | 20.00 | | | | | |
| | 1.52 | 0.60 | 100 | 200.0 | 0.132 | 20.00 | | | | | |

| Filter charcs. | IL @830-850 MHz (dB) | Att @2500-3000 MHz (dB) |
|---|---|---|
| Comp. Ex. 8 | 0.59 | 10.49 |
| Ex. 11 | 0.59 | 10.58 |

Note that in Table 9, |Z|min denotes a local minimum value of the impedance of the first comb-shaped capacitor, and f|Z|min denotes a frequency at which impedance of the first comb-shaped capacitor has a local minimum value.

The acoustic wave filter according to Comparative Example 8 is different from acoustic wave filter 10S according to Example 11 only in the configuration of the capacitor of the series-arm circuit.

As shown in Table 9, in acoustic wave filter 10S according to Example 11, capacitor Cs s1 has electrode finger pitch Pc3 of 1.48 µm, electrode finger pitch Pc1 of 1.50 µm, and electrode finger pitch Pc2 of 1.52 µm. The number of electrode fingers disposed at electrode finger pitch Pc3 is 100, the number of electrode fingers disposed at electrode electrode finger pitch Pc2 (the left region of the comb-shaped electrode in FIG. 15A).

Note that the number of regions into which the comb-shaped electrode is divided is not limited to three, and the comb-shaped electrode may be divided into two regions according to electrode finger pitches Pc1 and Pc2, or may be more finely divided into four or more regions according to four or more different electrode finger pitches. For example, the first, second, and third regions may be alternately disposed.

Note that as shown in Table 9, the electrostatic capacitance of capacitor Cs s1 of acoustic wave filter 10S according to Example 11 is 6.50 pF, and the electrostatic capacitance of the capacitor of the acoustic wave filter according to Comparative Example 8 is also 6.50 pF.

Figure 15B:
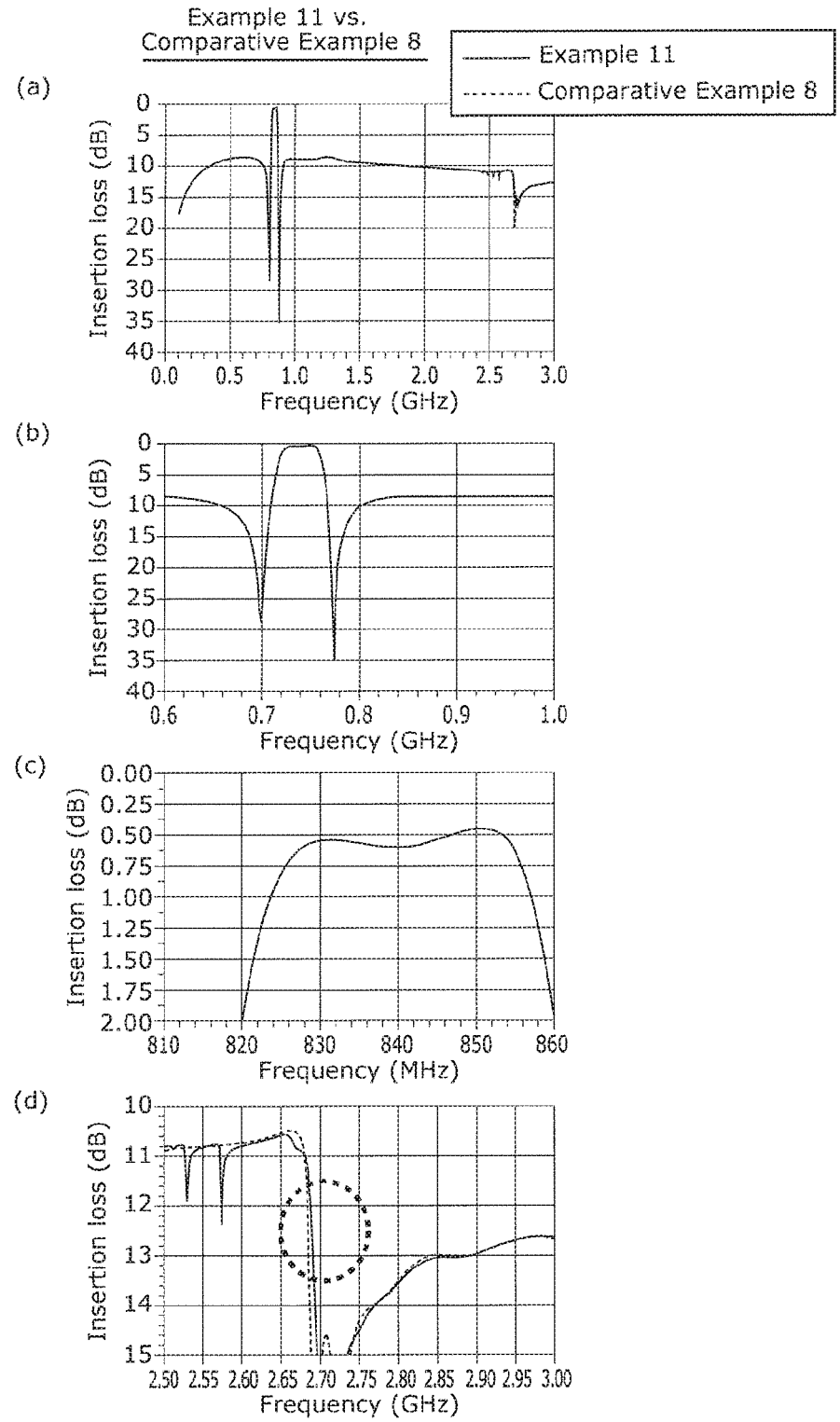
FIG. 15B illustrates graphs showing comparisons of passing characteristics of the acoustic wave filter according to Example 11 and an acoustic wave filter according to Comparative Example 8.

FIG. 15B illustrates graphs showing comparisons of passing characteristics of the acoustic wave filters according to Example 11 and Comparative Example 8. Part (a) of FIG. 15B illustrates a comparison of passing characteristics of the acoustic wave filters according to Example 11 and Comparative Example 8 in a wide range. Part (b) of FIG. 15B illustrates a comparison of passing characteristics of the acoustic wave filters according to Example 11 and Comparative Example 8 in a narrow range (in and near the passbands). Part (c) of FIG. 15B illustrates a comparison of passing characteristics of the acoustic wave filters according to Example 11 and Comparative Example 8 in the passbands. Part (d) of FIG. 15B illustrates a comparison of passing characteristics (attenuation characteristics) of the acoustic wave filters according to Example 11 and Comparative Example 8 in higher-frequency attenuation bands.

As illustrated in (a), (b), and (c) of FIG. 15B, insertion loss in the passband in Example 11 has no great difference from that in Comparative Example 8 (insertion loss in both the examples is 0.59 dB from Table 9). In contrast, as illustrated in (d) of FIG. 15B, in the attenuation band on the passband high-frequency side (a frequency band from 2.5 to 3.0 GHz), acoustic wave filter 10S according to Example 11 has a greater attenuation than that of the acoustic wave filter according to Comparative Example 8 (the smallest value of insertion loss is greater in Example 11 than that in Comparative Example 8 in the frequency band from 2.5 to 3.0 GHz) (Table 9 shows 10.58 dB in Example 11, and 10.49 dB in Comparative Example 8). Specifically, acoustic wave filter 10S according to Example 11 has an attenuation that is increased without increasing insertion loss in the passband.

Figure 15C:
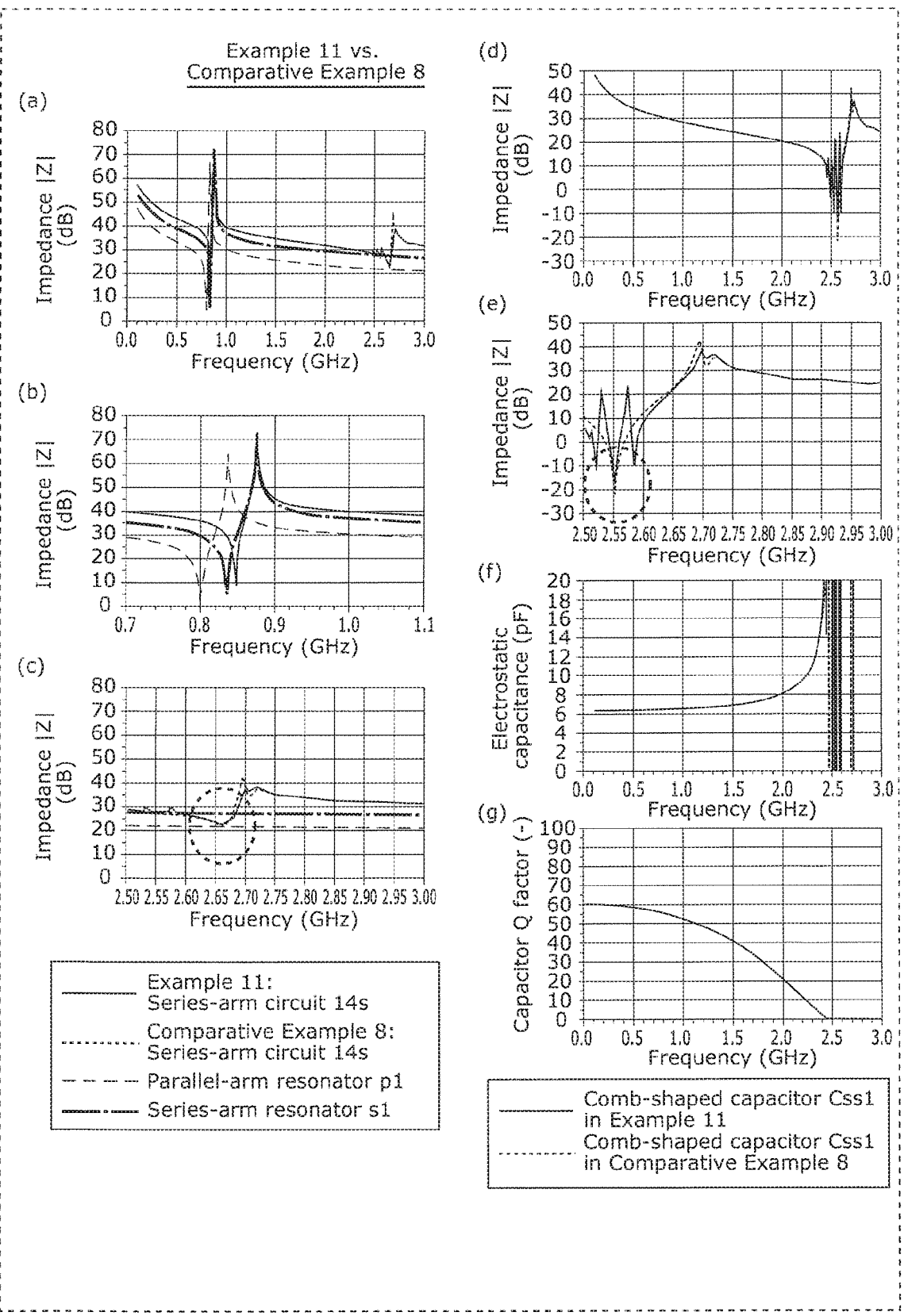
FIG. 15C illustrates graphs showing comparisons of impedance characteristics and comb-shaped capacitor characteristics of the acoustic wave filters according to Example 11 and Comparative Example 8.

The following describes a factor that contributes to an increase in the attenuation in the attenuation band on the passband high-frequency side in acoustic wave filter 10S according to Example 11, with reference to FIG. 15C.

FIG. 15C illustrates graphs showing comparisons of impedance characteristics and comb-shaped capacitor characteristics of the acoustic wave filters according to Example 11 and Comparative Example 8. Part (a) of FIG. 15C illustrates comparisons of impedance characteristics of the circuits and the resonators according to Example 11 and Comparative Example 8 in a wide range. Part (b) of FIG. 15C illustrates comparisons of impedance characteristics of the circuits and the resonators according to Example 11 and Comparative Example 8 in a narrow range (in and near the passbands). Part (c) of FIG. 15C illustrates comparisons of impedance characteristics of the circuits and the resonators according to Example 11 and Comparative Example 8 in a narrow range. Part (d) of FIG. 15C illustrates a comparison of impedance characteristics of capacitors according to Example 11 and Comparative Example 8 in a wide range. Part (e) of FIG. 15C illustrates a comparison of impedance characteristics of capacitors according to Example 11 and Comparative Example 8 in a narrow range. Part (f) of FIG. 15C illustrates a comparison of electrostatic capacitance characteristics of capacitors according to Example 11 and Comparative Example 8 in a wide range. Part (g) of FIG. 15C illustrates a comparison of capacitor Q factors of the capacitors according to Example 11 and Comparative Example 8 in a wide range.

First, as illustrated in (a) and (b) of FIG. 15C, when a capacitor is connected in series to series-arm resonator s1, resonant frequency Frs of the series-arm circuit shifts to a higher frequency than resonant frequency frs of series-arm resonator s1. In the acoustic wave filters according to Example 11 and Comparative Example 8, when the series-arm circuit and parallel-arm resonator p1 form a bandpass filter, antiresonant frequency fap of parallel-arm resonator p1 and resonant frequency Frs of the series-arm circuit are set to values close to each other. Frequencies at and near resonant frequency frp at which impedance of parallel-arm resonator p is substantially 0 form a lower-frequency stopband. In a frequency range higher than resonant frequency frp, impedance of parallel-arm resonator p1 is high at antiresonant frequency fap, and impedance of the series-arm circuit is substantially 0 at and near resonant frequency Frs. Accordingly, a signal pass band on a (series-arm) signal path from input/output terminal T1 to input/output terminal T2 is formed at and near antiresonant frequency fap and resonant frequency Frs. Furthermore, if a frequency is increased, and approaches and reaches antiresonant frequency Fas of the series-arm circuit, impedance of the series-arm circuit increases, and a higher-frequency stopband is formed. Thus, the acoustic wave filters according to Example 11 and Comparative Example 8 are bandpass filters in each of which a passband is determined by antiresonant frequency fap and resonant frequency Frs, a pole (attenuation pole) on the passband low-frequency side is determined by resonant frequency frp, and a pole (attenuation pole) on the passband high-frequency side is determined by resonant frequency Fas.

Next, as illustrated in (c) of FIG. 15C, the local minimum value of the impedance of capacitor Css1 according to Example 11 is greater than the local minimum value of the impedance of the capacitor according to Comparative Example 8.

Further, as illustrated in (d) and (e) of FIG. 15C, frequency f1min (2553 MHz) at which impedance of capacitor Css1 according to Example 11 has a local minimum value is located in the attenuation band on the passband high-frequency side of acoustic wave filter 10S according to Example 11. Similarly, frequency f2min (2553 MHz) at which impedance of the capacitor according to Comparative Example 8 has a local minimum value is located in the attenuation band on the passband high-frequency side of the acoustic wave filter according to Comparative Example 8.

Note that electrostatic capacitance and a capacitor Q factor of the capacitor in the passband in Example 11 have no great difference from those in Comparative Example 8, as illustrated in (f) and (g) of FIG. 15C.

Here, as illustrated in (e) of FIG. 15C, the local minimum value of impedance at frequency f1min of capacitor Css1 according to Example 11 (−16.28 dB from Table 9) is greater than the local minimum value of impedance at frequency f2min of the capacitor according to Comparative Example 8 (−22.28 dB from Table 9). This factor is owing to, for example, capacitor Css1 in acoustic wave filter 10S according to Example 11 having different electrode finger pitches. Accordingly, a local minimum value of impedance of series-arm circuit 14s increases (frequencies at each of which impedance has a local minimum value are distributed) in the attenuation band on the passband high-frequency side, and thus the amount of a radio frequency signal passing through to series-arm circuit 14s at frequency f1min can be decreased. Thus, a problem that the attenuation of acoustic wave filter 10S decreases in an attenuation band that is a frequency region in which a conductance peak (a local minimum point of impedance) is located can be solved.

As described above, acoustic wave filter 10S can be achieved in which the attenuation in the attenuation band on the passband high-frequency side is increased without increasing insertion loss in the passband.

1.12 Acoustic Wave Filter According to Example 12

Figure 16:
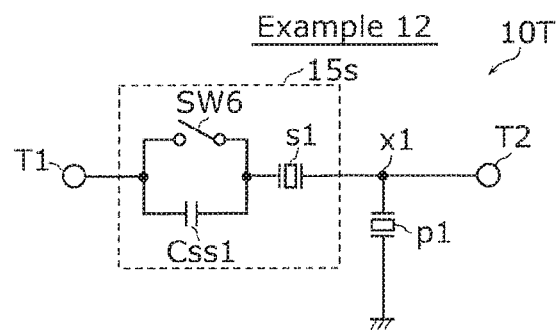
FIG. 16 illustrates a circuit configuration of an acoustic wave filter according to Example 12.

FIG. 16 illustrates a circuit configuration of acoustic wave filter 10T according to Example 12. Acoustic wave filter 10T illustrated in FIG. 16 includes series-arm circuit 15s, parallel-arm resonator p1, and input/output terminals T1 and T2.

In this example, series-arm circuit 15s is connected to a path that connects input/output terminals T1 and T2, includes series-arm resonator s1, capacitor Css1, and switch SW6 (second switch), and is a resonance circuit. Series-arm resonator s1 is a first acoustic wave resonator connected in series to a circuit in which capacitor Css1 and switch SW6 are connected in parallel to each other. Capacitor Css1 is a first comb-shaped capacitor, and a circuit in which capacitor Css1 and switch SW6 are connected in parallel to each other is included in an impedance circuit.

Capacitor Css1 includes a comb-shaped electrode that includes a plurality of electrode fingers, as illustrated in the right drawing of FIG. 15A.

Here, when a repeating pitch of the electrode fingers included in capacitor Css1 is defined as an electrode finger pitch, the comb-shaped electrode of capacitor Cs2 has two different electrode finger pitches, namely electrode finger pitch Pc1 (first electrode finger pitch) and electrode finger pitch Pc2 (second electrode finger pitch). In this example, the relation Pc2>Pc1 is satisfied.

Furthermore, a frequency at which impedance of capacitor Css1 has a local minimum value is located outside the passband of acoustic wave filter 10T.

Note that acoustic wave filter 10T according to this example is obtained by adding switch SW6 to acoustic wave filter 10S according to Example 11, and the parameters of series-arm resonator s1, parallel-arm resonator p1, and capacitor Css1 are the same as those of acoustic wave filter 10S. Note that switch SW6 is an ideal element (having impedance of 0Ω when conducting and infinite impedance when non-conducting).

According to the circuit configuration illustrated in FIG. 16, the resonant frequency of series-arm circuit 15s can be switched to another frequency by switching between the conducting and non-conducting states of switch SW6, and thus frequency-tunable acoustic wave filter 10T that switches the frequency at the passband high-frequency edge to another frequency can be achieved.

Figure 17:
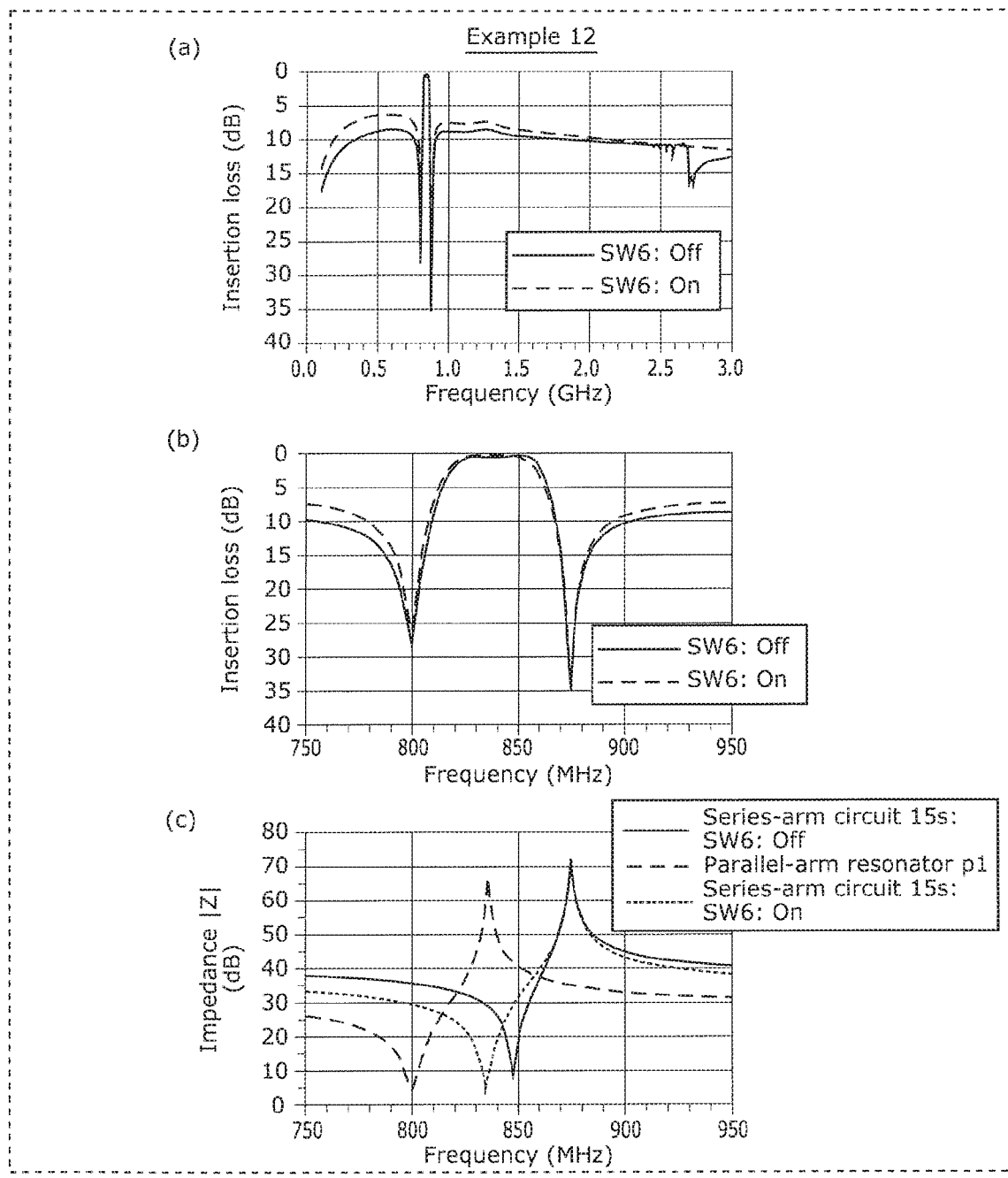
FIG. 17 illustrates graphs showing passing characteristics and impedance characteristics of the acoustic wave filter according to Example 12.

FIG. 17 illustrates graphs showing passing characteristics and impedance characteristics of acoustic wave filter 10T according to Example 12. Part (a) of FIG. 17 illustrates passing characteristics of acoustic wave filter 10T according to Example 12 in a wide range when switch SW6 is on and off, (b) of FIG. 17 illustrates a comparison of passing characteristics in a narrow range (in and near the passband) when switch SW6 is on and off, and (c) of FIG. 17 illustrates comparisons of impedance characteristics of the circuits and the resonator in a narrow range (in and near the passband).

In this example, capacitor Css1 is added to series-arm resonator s1 when switch SW6 is non-conducting (off). Accordingly, as illustrated in (c) of FIG. 17, resonant frequency Frsoff of series-arm circuit 15s when switch SW6 is off shifts to a higher frequency than resonant frequency frs of series-arm resonator s1. Accordingly, as illustrated in (b) of FIG. 17, acoustic wave filter 10T can shift the frequency at the passband high-frequency edge to a higher frequency by switching switch SW6 from the conducting state to the non-conducting state.

A similar circuit configuration and similar passing characteristics to those of acoustic wave filter 10S according to Example 11 are achieved by placing switch SW6 in the non-conducting state, and thus frequency-tunable acoustic wave filter 10T can be achieved in which the attenuation in the attenuation band on the passband high-frequency side is increased without increasing insertion loss in the passband.

1.13 Pitch Difference and Proportion in Number of Electrode Fingers of Comb-Shaped Capacitor Electrode A noticeable difference between electrode finger pitches Pc1 and Pc2 of capacitor Css1 that is a comb-shaped capacitor is to be described.

Figure 18:
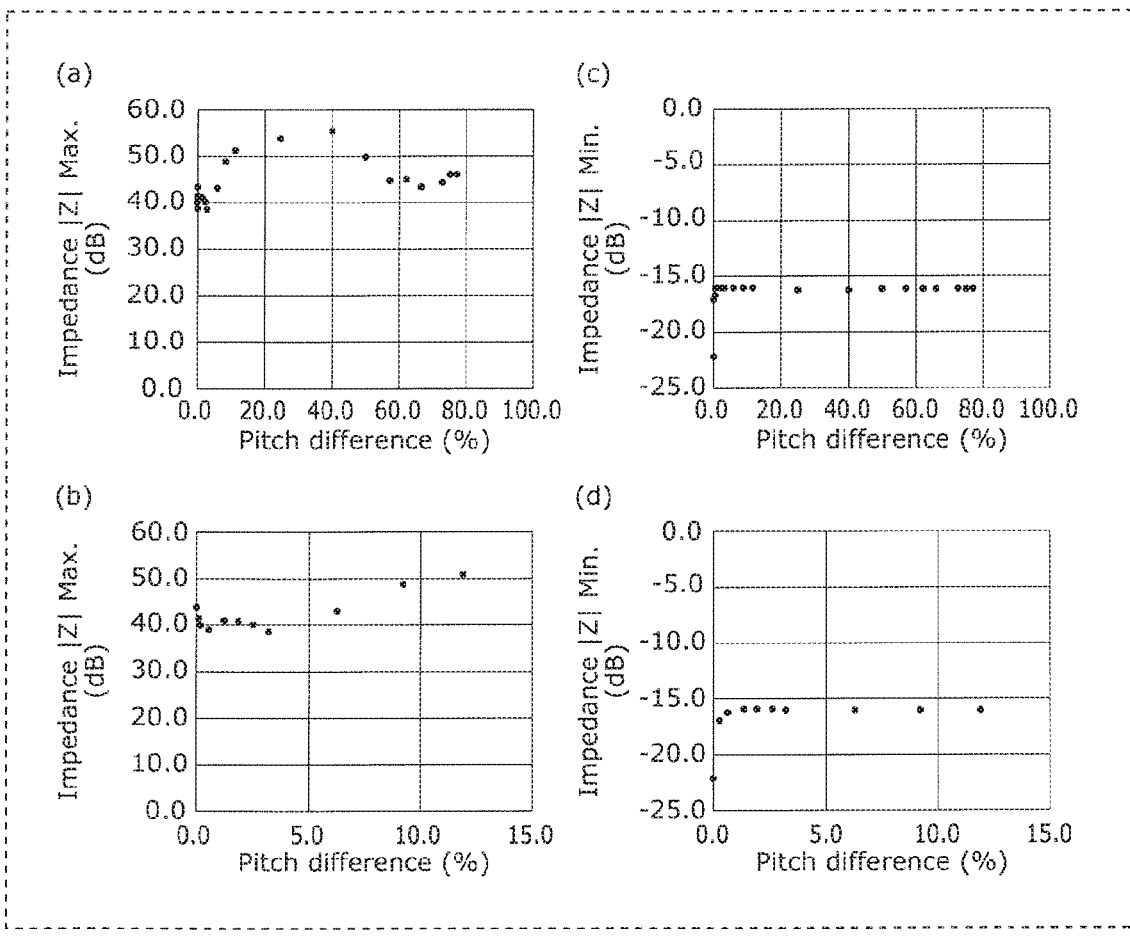
FIG. 18 illustrates graphs showing relations between a pitch difference of a comb-shaped capacitor and impedance thereof in a typical example.

FIG. 18 illustrates graphs showing relations between a pitch difference of a comb-shaped capacitor and impedance thereof in a typical example. More specifically, the vertical axes in (a) and (b) of FIG. 18 indicate a local maximum value of impedance of the comb-shaped capacitor when electrode finger pitch Pc1 is fixed at 3.000 μm, and electrode finger pitch Pc2 is gradually changed in a range from 1.500 to 6.500 μm. The vertical axes in (c) and (d) of FIG. 18 indicate a local minimum value of impedance of the comb-shaped capacitor when electrode finger pitch Pc1 is fixed at 3.000 μm, and electrode finger pitch Pc2 is gradually changed in a range from 1.500 to 6.500 μm. The horizontal axes in (a) to (d) of FIG. 18 indicate a pitch difference (%) that is a value obtained by dividing a difference between electrode finger pitches Pc1 and Pc2 by a greater one of electrode finger pitches Pc1 and Pc2.

Note that the electrode finger duty ratio is 0.60, the number of electrode fingers having electrode finger pitch Pc1 is 201, the number of electrode fingers having electrode finger pitch Pc2 is 200, the electrode finger thickness is 200 nm, and the crossing width is 20 μm.

Part (b) of FIG. 18 illustrates that the local maximum value of impedance is low when a pitch difference is in a range from 0.2% to 6.3%. Accordingly, a comb-shaped capacitor having a pitch difference that is in a range from 0.2% to 6.3% is adopted as a first comb-shaped capacitor connected in series to parallel-arm resonator p1 of a parallel-arm circuit, which yields greater advantageous effect of increasing attenuation.

Part (d) of FIG. 18 illustrates that the local minimum value of impedance is high when a pitch difference is 0.2% or more. According to this, a comb-shaped capacitor having a pitch difference of 0.2% or more is adopted as a first comb-shaped capacitor connected in series to series-arm resonator s1 of a series-arm circuit, which yields greater advantageous effect of increasing attenuation.

Figure 19:
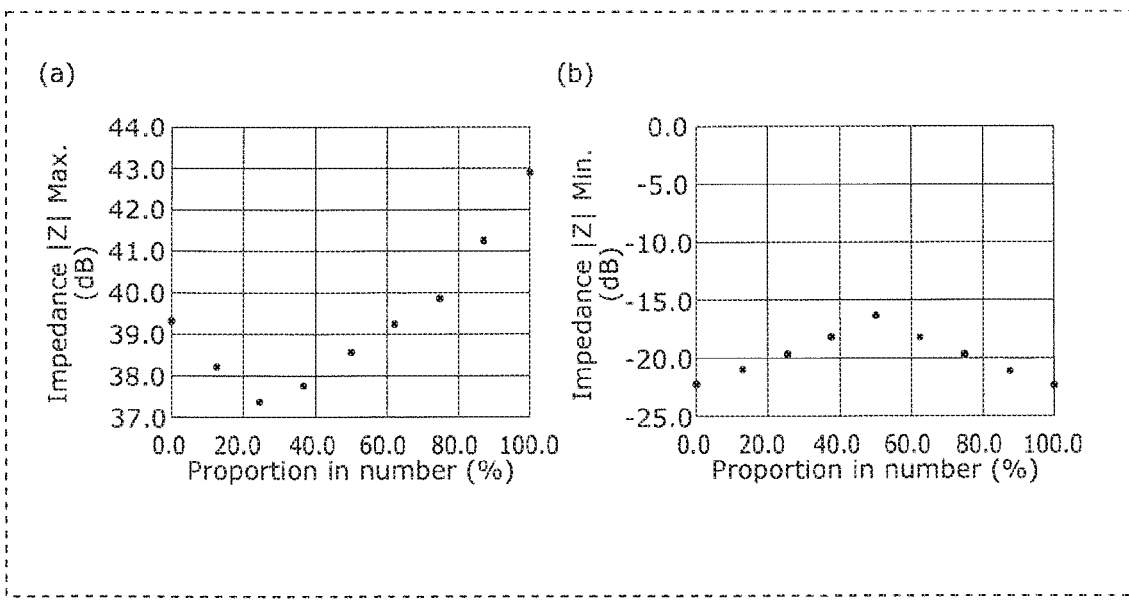
FIG. 19 illustrates graphs showing relations between a proportion in number of electrode fingers of the comb-shaped capacitor and impedance thereof in the typical example.

FIG. 19 illustrates graphs showing relations between a proportion in number of electrode fingers of a comb-shaped capacitor and impedance thereof in a typical example. More specifically, the vertical axis in (a) of FIG. 19 indicates a local maximum value of impedance of the comb-shaped capacitor when the number of electrode fingers having electrode finger pitch Pc1 is gradually changed in a range from 0 to 401. The vertical axis in (b) of FIG. 19 indicates a local minimum value of impedance of the comb-shaped capacitor when the number of electrode fingers having electrode finger pitch Pc1 is gradually changed in a range from 0 to 401. Note that in FIG. 19, the acoustic wave filter having a proportion in number of 0% or 100% is not included in the acoustic wave filter according to the above embodiment.

Note that the electrode finger duty ratio is 0.60, electrode finger pitch Pc1 is 1.500 μm, electrode finger pitch Pc2 is 1.510 μm, the electrode finger thickness is 200 nm, and the crossing width is 20 μm.

Part (a) of FIG. 19 illustrates that the local maximum value of impedance is low when the proportion in number of electrode fingers is in a range from 10% to 65%. According to this, the comb-shaped capacitor whose proportion in number of electrode fingers is in a range from 10% to 65% is adopted as a first comb-shaped capacitor connected in series to parallel-arm resonator p of a parallel-arm circuit, which yields greater advantageous effect of increasing the attenuation.

Part (b) of FIG. 19 illustrates that the local minimum value of impedance is high when the proportion in number of electrode fingers is in a range from 10% to 90%. According to this, a comb-shaped capacitor whose proportion in number of electrode fingers is in a range from 10% to 90% is adopted as a first comb-shaped capacitor connected in series to series-arm resonator s1 of the series-arm circuit, which yields greater advantageous effect of increasing attenuation.

Embodiment 2

The acoustic wave filter described in Embodiment 1 is applicable to a multiplexer, a radio frequency front-end circuit, and a communication device. In view of this, such a radio frequency front-end circuit, and a communication device are to be described in the present embodiment.

Figure 20A:
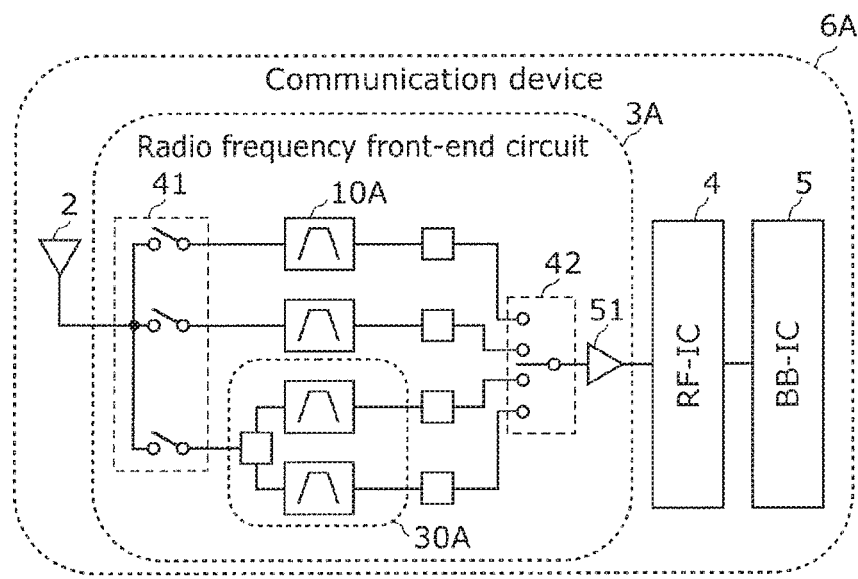
FIG. 20A illustrates a configuration of a communication device according to Embodiment 2.

FIG. 20A illustrates a configuration of communication device 6A according to Embodiment 2. As illustrated in FIG. 20A, communication device 6A includes radio frequency front-end circuit 3A, radio frequency (RF) signal processing circuit (RF integrated circuit (IC)) 4, baseband signal processing circuit (baseband integrated circuit (BBIC)) 5, and antenna element 2.

Radio frequency front-end circuit 3A includes acoustic wave filter 10A according to Example 1, multiplexer 30A, receiving amplifier circuit 51, and switches 41 and 42. Radio frequency front-end circuit 3A is a receiving front-end circuit that demultiplexes a radio frequency signal received by antenna 2.

Switch 41 includes a common connection terminal and a plurality of selection terminals, the common connection terminal is connected to antenna 2, a first selection terminal out of the selection terminals is connected to acoustic wave filter 10A, a second selection terminal out of the selection terminals is connected to another filter, and a third selection terminal out of the selection terminals is connected to multiplexer 30A. The above configuration allows switch 41 to switch between connection and disconnection of antenna 2 to/from acoustic wave filter 10A, the other filter, and multiplexer 30A.

Switch 42 includes a common connection terminal and a plurality of selection terminals, the common connection terminal is connected to receiving amplifier circuit 51, a first selection terminal out of the selection terminals is connected to acoustic wave filter 10A, a second selection terminal out of the selection terminals is connected to another filter, a third selection terminal out of the selection terminals is connected to one of filters included in multiplexer 30A, and a fourth selection terminal out of the selection terminals is connected to the other filter included in multiplexer 30A. The above configuration allows switch 42 to switch between connection and disconnection of receiving amplifier circuit 51 to/from acoustic wave filter 10A, the other filter, one of the filters of multiplexer 30A, and the other filter of multiplexer 30A.

Multiplexer 30A may include a plurality of filters that include one of the acoustic wave filters according to Examples 1 to 12.

Note that an impedance matching circuit, a phase shifter, a circulator, or a switch that can select two or more filters, for instance, may be connected between the common terminal and the two filters of multiplexer 30A.

In addition, an impedance matching circuit may be disposed upstream or downstream of acoustic wave filter 10A and multiplexer 30A.

Radio frequency front-end circuit 3A may not include both acoustic wave filter 10A and multiplexer 30A, and may include only one of them.

Radio frequency front-end circuit 3A may include one of the acoustic wave filters according to Examples 2 to 12, instead of acoustic wave filter 10A according to Example 1.

Receiving amplifier circuit 51 is a low-noise amplifier that amplifies power of received radio frequency signals passing through the passbands of acoustic wave filter 10A, the other filter, and multiplexer 30A.

RF signal processing circuit (RFIC) 4 processes radio frequency signals transmitted and received by antenna 2. Specifically, RF signal processing circuit (RFIC) 4 processes a radio frequency signal (here, a radio frequency signal received) input through a receiver signal path from antenna 2 by down-conversion, for instance, and outputs a received signal generated by being processed to baseband signal processing circuit (BBIC) 5. RF signal processing circuit (RFIC) 4 processes a signal to be transmitted which is input from baseband signal processing circuit (BBIC) 5 by up-conversion, for instance, and outputs a radio frequency signal (here, a radio frequency signal to be transmitted) generated by being processed to a transmitter signal path (not illustrated in FIG. 20A).

According to the above configuration, insertion loss in passbands of acoustic wave filter 10A and multiplexer 30A is decreased, and furthermore acoustic wave filter 10A and multiplexer 30A can be miniaturized. Accordingly, the gain in radio frequency front-end circuit 3A improves, and furthermore radio frequency front-end circuit 3A can be miniaturized. The communication quality of communication device 6A can be improved, and the size thereof can be decreased.

Figure 20B:
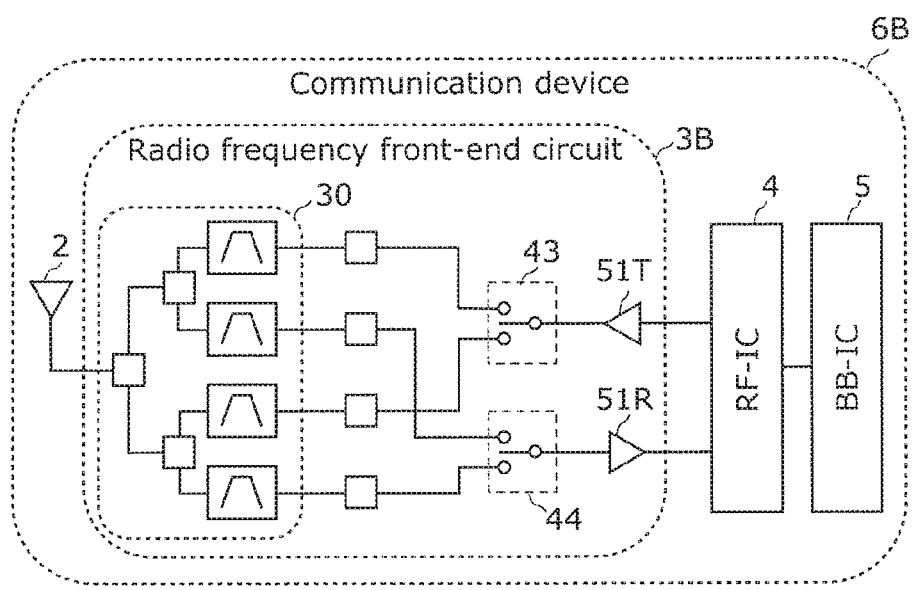
FIG. 20B illustrates a configuration of a communication device according to a variation of Embodiment 2.

FIG. 20B illustrates a configuration of communication device 6B according to a variation of Embodiment 2. As illustrated in FIG. 20B, communication device 6B includes radio frequency front-end circuit 3B, RF signal processing circuit (RFIC) 4, baseband signal processing circuit (BBIC) 5, and antenna 2.

Radio frequency front-end circuit 3B includes multiplexer 30, transmission amplifier circuit 51T, receiving amplifier circuit 51R, and switches 43 and 44. Radio frequency front-end circuit 3B is a transmitting and receiving front-end circuit that demultiplexes radio frequency signals received by antenna 2 and multiplexes radio frequency signals generated by RFIC 4.

In multiplexer 30, a first duplexer and a second duplexer are connected to a common terminal. The first duplexer includes a first transmission filter, and a first receiving filter. The second duplexer includes a second transmission filter, and a second receiving filter. The acoustic wave filter according to any one of Examples 1 to 6 is applied to at least one of the first transmission filter, the first receiving filter, the second transmission filter, and the second receiving filter.

Note that an impedance matching circuit, a phase shifter, a circulator, or a switch that can select two or more filters, for instance, may be connected between the first duplexer and the second duplexer, between the first transmission filter and the first receiving filter, and between the second transmission filter and the second receiving filter.

An impedance matching circuit may be disposed upstream or downstream of multiplexer 30.

Multiplexer 30 may not include a duplexer, and may include a transmission filter alone and a receiving filter alone.

Switch 43 includes a common connection terminal and a plurality of selection terminals, the common connection terminal is connected to transmission amplifier circuit 51T, a first selection terminal out of the selection terminals is connected to the first transmission filter, and a second selection terminal out of the selection terminals is connected to the second transmission filter. According to the above configuration, switch 43 switches between connection and disconnection of transmission amplifier circuit 51T to/from the first transmission filter and the second transmission filter.

Switch 44 includes a common connection terminal and a plurality of selection terminals, the common connection terminal is connected to receiving amplifier circuit 51R, a first selection terminal out of the selection terminals is connected to the first receiving filter, and a second selection terminal out of the selection terminals is connected to the second receiving filter. According to the above configuration, switch 44 switches between connection and disconnection of receiving amplifier circuit 51R to/from the first receiving filter and the second receiving filter.

Transmission amplifier circuit 51T is a power amplifier that amplifies power of radio frequency signals to be transmitted that pass through the passbands of the first transmission filter and the second transmission filter. Receiving amplifier circuit 51R is a low-noise amplifier that amplifies power of received radio frequency signals that pass through the passbands of the first receiving filter and the second receiving filter.

According to the above configuration, insertion loss in the passband of multiplexer 30 is decreased, and at the same time, multiplexer 30 can be miniaturized. Accordingly, the gain in radio frequency front-end circuit 3B improves, and furthermore radio frequency front-end circuit 3B can be miniaturized. The communication quality of communication device 6B is improved, and the size thereof can be decreased.

Other Embodiments

The above has described the acoustic wave filter, the multiplexer, the radio frequency front-end circuit, and the communication device according to the present disclosure, using Embodiments 1 and 2, yet the present disclosure is not limited to the above embodiments. The present disclosure also encompasses another embodiment achieved by combining arbitrary elements in the above embodiments, variations as a result of applying, to the embodiments, various modifications that may be conceived by those skilled in the art without departing from the scope of the present disclosure, and various devices that include the acoustic wave filter, the multiplexer, the radio frequency front-end circuit, and the communication device according to the present disclosure.

Note that the series-arm resonators and the parallel-arm resonators included in the filters are not each limited to a single resonator, and may include a plurality of divided resonators that are obtained by dividing one resonator.

The duplexer in Embodiment 2 indicates not only a multiplexer in which in frequency division duplex (FDD), a transmission signal flows into one filter and a reception signal flows into another filter, but also indicates a multiplexer in which in time division duplex (TDD), a transmission signal flows into one filter and a reception signal flows into another filter.

For example, a controller that switches between on and off of switch SW1 in Example 6, switch SW2 in Example 9, switch SW3 in Example 10, and switches in Variations 1 to 6, switch SW6 in Example 12, switches 41 and 42 of radio frequency front-end circuit 3A, and switches 43 and 44 of radio frequency front-end circuit 3B, for instance, may be disposed in RFIC 4. Alternatively, the controller may be disposed outside RFIC 4 and, for example, may be disposed in any of radio frequency front-end circuits 3A and 3B. Specifically, the configurations of radio frequency front-end circuits 3A and 3B are not limited to the configurations described above, and radio frequency front-end circuits 3A and 3B may each include one of the acoustic wave filters according to the examples of Embodiment 1, and a controller that controls on and off of a switch included in the acoustic wave filter.

For example, an inductor and/or a capacitor may be connected between elements in radio frequency front-end circuits 3A and 3B or communication devices 6A and 6B. Note that the inductor may include a line inductor achieved by a line that connects elements.

Switch SW1 in Example 6, switch SW2 in Example 9, switch SW3 in Example 10, the switches in Variations 1 to 6, and switch SW6 in Example 12 are single pole single throw (SPST) switches, and are, for example, field effect transistor (FET) switches that include GaAs or complementary metal oxide semiconductor (CMOS) or diode switches, which are achieved as switch integrated circuits (ICs). Note that the switch is not limited to a semiconductor switch, and may be a mechanical switch that includes micro-electromechanical systems (MEMS). Such switches are small, and thus the acoustic wave filters according to Embodiment 1 can be miniaturized.

The series-arm resonator and the parallel-arm resonator included in the acoustic wave filter according to Embodiment 1 are acoustic wave resonators that use acoustic waves, and are, for example, resonators that use surface acoustic waves (SAWs), resonators that use bulk acoustic waves (BAWs), film bulk acoustic resonators (FBARs), or solidly mounted resonators (SMRs). Accordingly, this can achieve a small acoustic wave filter having high selectivity. Note that surface acoustic waves indicate acoustic waves that propagate on the surface of a piezoelectric component or the interface between materials, and indicate acoustic waves of various types achieved using an IDT electrode. Examples of surface acoustic waves include surface waves, Love waves, leaky waves, Rayleigh waves, boundary waves, leaky SAWs, pseudo SAWs, and plate waves.

The term "ground" in Embodiments 1 and 2 refers to a reference electrode, and is, for example, an electrode having a potential used as a reference in the acoustic wave filters according to Embodiment 1.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as an acoustic wave filter miniaturized while maintaining filter characteristics, a multiplexer, a front-end circuit, and a communication device.

The invention claimed is:

1. An acoustic wave filter comprising:
a series-arm circuit disposed on a path that connects a first input/output terminal and a second input/output terminal of the acoustic wave filter; and
a parallel-arm circuit connected to a node on the path and a ground,
wherein at least one of the parallel-arm circuit and the series-arm circuit includes:
a first acoustic wave resonator; and
a first comb-shaped capacitor connected in parallel or series to the first acoustic wave resonator,
the first comb-shaped capacitor includes a comb-shaped electrode that includes electrode fingers,
a frequency at which impedance of the first comb-shaped capacitor has a local maximum value is located outside a passband of the acoustic wave filter, and
under a condition that a proportion of a width of each of the electrode fingers to a value is defined as an electrode finger duty ratio, the value being a sum of the width and a space between adjacent electrode fingers,
the comb-shaped electrode has (i) at least two different electrode finger pitches, (ii) at least two different electrode finger duty ratios, or (iii) at least two different electrode finger pitches and at least two different electrode finger duty ratios.

2. The acoustic wave filter according to claim 1,
wherein the parallel-arm circuit further includes a first switch connected in parallel to the first comb-shaped capacitor, and
a first switch circuit in which the first comb-shaped capacitor and the first switch are connected in parallel is connected in series to the first acoustic wave resonator.

3. The acoustic wave filter according to claim 2,
wherein the parallel-arm circuit further includes a second acoustic wave resonator, wherein the second acoustic wave resonator
is connected in parallel to a circuit in which the first acoustic wave resonator and the first switch circuit are connected in series to each other,
has a resonant frequency different from a resonant frequency of the first acoustic wave resonator, and
has an antiresonant frequency different from an antiresonant frequency of the first acoustic wave resonator.

4. The acoustic wave filter according to claim 3,
wherein the parallel-arm circuit further includes a second switch circuit connected in series to the second acoustic wave resonator,
a circuit in which the second acoustic wave resonator and the second switch circuit are connected in series to each other is connected in parallel to a circuit in which the first acoustic wave resonator and the first switch circuit are connected in series to each other,
the second switch circuit includes:
a second comb-shaped capacitor; and
a second switch connected in parallel to the second comb-shaped capacitor, wherein
a frequency at which impedance of the second comb-shaped capacitor has a local maximum value is located outside the passband of the acoustic wave filter,
the second comb-shaped capacitor includes a comb-shaped electrode that includes electrode fingers, and
the comb-shaped electrode included in the second comb-shaped capacitor has (i) at least two different electrode finger pitches, (ii) at least two different electrode finger duty ratios, or (iii) at least two different electrode finger pitches and at least two different electrode finger duty ratios.

5. The acoustic wave filter according to claim 1, wherein
the series-arm circuit further includes a first switch connected in series to the first comb-shaped capacitor, and
a circuit in which the first comb-shaped capacitor and the first switch are connected in series is connected in parallel to the first acoustic wave resonator.

6. The acoustic wave filter according to claim 1,
wherein the parallel-arm circuit further includes a second switch connected in parallel to the first comb-shaped capacitor,
a circuit in which the first comb-shaped capacitor and the second switch are connected in parallel is included in a first switch circuit, and
the first switch circuit is connected in series to the first acoustic wave resonator.

7. The acoustic wave filter according to claim 1,
wherein the first acoustic wave resonator and the first comb-shaped capacitor are connected in parallel,
the comb-shaped electrode includes electrode fingers spaced at a first electrode finger pitch, and other electrode fingers spaced at a second electrode finger pitch greater than the first electrode finger pitch, and
a pitch difference is at least 0.2%, the pitch difference being a difference between the first electrode finger pitch and the second electrode finger pitch, divided by the first electrode finger pitch.

8. The acoustic wave filter according to claim 7,
wherein out of the electrode fingers included in the comb-shaped electrode, a total number of electrode fingers spaced at the first electrode finger pitch is in a range from 10% to 80% of a total number of the electrode fingers included in the comb-shaped electrode.

9. The acoustic wave filter according to claim 7,
wherein out of the electrode fingers included in the comb-shaped electrode, a total number of electrode fingers spaced at the first electrode finger pitch is in a range from 20% to 50% of a total number of the electrode fingers included in the comb-shaped electrode.

10. The acoustic wave filter according to claim 1,
wherein the first acoustic wave resonator and the first comb-shaped capacitor are connected in series,
the comb-shaped electrode includes electrode fingers spaced at a first electrode finger pitch, and other electrode fingers spaced at greater than the first electrode finger pitch, and
a pitch difference is in a range from 0.2% to 6.3%, the pitch difference being a difference between the first electrode finger pitch and the second electrode finger pitch, divided by the second electrode finger pitch.

11. The acoustic wave filter according to claim 1,
wherein the first acoustic wave resonator and the first comb-shaped capacitor are connected in series,
the comb-shaped electrode includes electrode fingers spaced at a first electrode finger pitch, and other electrode fingers spaced at a second electrode finger pitch greater than the first electrode finger pitch, and
out of the electrode fingers included in the comb-shaped electrode, a total number of electrode fingers spaced at the first electrode finger pitch is in a range from 10% to 65% of a total number of the electrode fingers included in the comb-shaped electrode.

12. The acoustic wave filter according to claim 1,
wherein the first acoustic wave resonator and the first comb-shaped capacitor are connected in series,
the comb-shaped electrode includes electrode fingers spaced at a first electrode finger pitch, and other electrode fingers spaced at a second electrode finger pitch greater than the first electrode finger pitch, and
a pitch difference is at least 0.2%, the pitch difference being a difference between the first electrode finger pitch and the second electrode finger pitch, divided by the first electrode finger pitch.

13. The acoustic wave filter according to claim 1,
wherein the first acoustic wave resonator and the first comb-shaped capacitor are connected in series,
the comb-shaped electrode includes electrode fingers spaced at a first electrode finger pitch, and other electrode fingers spaced at a second electrode finger pitch greater than the first electrode finger pitch, and
out of the electrode fingers included in the comb-shaped electrode, a total number of electrode fingers spaced at the first electrode finger pitch is in a range from 10% to 90% of a total number of the electrode fingers included in the comb-shaped electrode.

14. The acoustic wave filter according to claim 1,
wherein the comb-shaped electrode includes electrode fingers spaced at a first electrode finger pitch, and other electrode fingers spaced at a second electrode finger pitch greater than the first electrode finger pitch, and
out of the electrode fingers, electrode fingers spaced at the first electrode finger pitch are thinner than electrode fingers spaced at the second electrode finger pitch.

15. The acoustic wave filter according to claim 1,
wherein the first acoustic wave resonator includes an interdigital transducer (IDT) electrode that is formed on a piezoelectric substrate and includes electrode fingers,
the comb-shaped electrode is formed on the piezoelectric substrate, and
the at least two different finger pitches of the comb-shaped electrode are each shorter than an electrode finger pitch of the IDT electrode.

16. The acoustic wave filter according to claim 15,
wherein the electrode fingers included in the comb-shaped electrode are thinner than electrode fingers included in the first acoustic wave resonator.

17. The acoustic wave filter according to claim 15,
wherein the electrode fingers included in the comb-shaped electrode have a duty ratio higher than a duty ratio of the electrode fingers included in the IDT electrode.

18. A multiplexer, comprising:
a plurality of filters at least one of which has a same structure as a structure of the acoustic wave filter according to claim 1,
wherein one of the first input/output terminal and the second input/output terminal for each of the plurality of filters is directly or indirectly connected to a common terminal.

19. A radio frequency front-end circuit, comprising:
the multiplexer according to claim 18; and
an amplifier circuit directly or indirectly connected to the multiplexer.

20. A communication device, comprising:
a radio frequency (RF) signal processing circuit that processes a radio frequency signal to be transmitted by an antenna and a radio frequency signal received by the antenna; and
the radio frequency front-end circuit according to claim 19 that conveys the radio frequency signals between the antenna and the RF signal processing circuit.

* * * * *